(12) United States Patent
Okhonin et al.

(10) Patent No.: US 8,537,610 B2
(45) Date of Patent: Sep. 17, 2013

(54) TECHNIQUES FOR PROVIDING A SEMICONDUCTOR MEMORY DEVICE

(75) Inventors: Serguei Okhonin, Lausanne (CH); Viktor I Koldiaev, Morgan Hill, CA (US); Mikhail Nagoga, Pully (CH); Yogesh Luthra, Chavannes-pres-Renens (CH)

(73) Assignee: Micron Technology, Inc., Boise, ID (US)

( * ) Notice: Subject to any disclaimer, the term of this patent is extended or adjusted under 35 U.S.C. 154(b) by 232 days.

(21) Appl. No.: 12/834,418

(22) Filed: Jul. 12, 2010

(65) Prior Publication Data

US 2011/0007578 A1    Jan. 13, 2011

Related U.S. Application Data

(60) Provisional application No. 61/224,741, filed on Jul. 10, 2009, provisional application No. 61/314,532, filed on Mar. 16, 2010.

(51) Int. Cl.
*G11C 16/04*    (2006.01)
*G11C 11/24*    (2006.01)
*H01L 29/788*    (2006.01)

(52) U.S. Cl.
USPC ... 365/185.01; 365/149; 365/150; 365/185.1; 257/316; 257/E21.646; 257/E27.084

(58) Field of Classification Search
USPC .................................................. 365/185.01
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

(Continued)

*Primary Examiner* — Son Mai
(74) *Attorney, Agent, or Firm* — Wilmer Cutler Pickering Hale and Dorr LLP

(57) ABSTRACT

Techniques for providing a semiconductor memory device are disclosed. In one particular exemplary embodiment, the techniques may be realized as an apparatus including a first region and a second region. The apparatus may also include a body region disposed between the first region and the second region and capacitively coupled to a plurality of word lines, wherein each of the plurality of word lines is capacitively coupled to different portions of the body region.

35 Claims, 32 Drawing Sheets

(56) References Cited

U.S. PATENT DOCUMENTS

| | | |
|---|---|---|
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B2 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 * | 5/2003 | Fujita et al. ............ 365/189.07 |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,008 B1 * | 4/2005 | Ohsawa ...................... 257/347 |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 * | 4/2006 | Forbes ........................ 257/296 |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,105,390 B2 * | 9/2006 | Brask et al. .................. 438/149 |
| 7,170,807 B2 | 1/2007 | Fazan et al. |

| | | |
|---|---|---|
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,241,653 B2 * | 7/2007 | Hareland et al. ............ 438/199 |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,359,226 B2 * | 4/2008 | Schwerin .................... 365/49.1 |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 * | 4/2009 | Mathew et al. ............. 438/176 |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 7,696,559 B2 * | 4/2010 | Arai et al. ................... 257/316 |
| 7,710,771 B2 * | 5/2010 | Kuo et al. .................... 365/184 |
| 7,851,862 B2 * | 12/2010 | Chang .......................... 257/353 |
| 7,911,000 B2 * | 3/2011 | Shino ........................... 257/368 |
| 8,064,239 B2 * | 11/2011 | Ertosun et al. ............... 365/104 |
| 8,139,418 B2 * | 3/2012 | Carman .................... 365/185.18 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0032313 A1 * | 2/2005 | Forbes .......................... 438/270 |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187761 A1 | 8/2007 | Hu et al. |
| 2007/0187775 A1 | 8/2007 | Okhonin et al. |
| 2007/0200176 A1 | 8/2007 | Kammler et al. |
| 2007/0252201 A1 * | 11/2007 | Kito et al. ..................... 257/331 |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 * | 2/2008 | Gruening-von Schwerin ...................... 365/104 |
| 2008/0061355 A1 * | 3/2008 | Choi ............................. 257/316 |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0180995 A1 * | 7/2008 | Okhonin ....................... 365/182 |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0108351 A1 * | 4/2009 | Yang et al. .................... 257/347 |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2009/0296453 A1 * | 12/2009 | Lee et al. ...................... 365/149 |
| 2010/0085813 A1 | 4/2010 | Shino |
| 2010/0091586 A1 | 4/2010 | Carman |
| 2010/0110816 A1 | 5/2010 | Nautiyal et al. |
| 2010/0142294 A1 * | 6/2010 | Carman ........................ 365/191 |
| 2011/0221001 A1 * | 9/2011 | Song et al. .................... 257/347 |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |

| | | |
|---|---|---|
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 A | 12/1990 |
| JP | 03-17168 | 7/1991 |
| JP | 05-347419 | 12/1993 |
| JP | 08-213624 A | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 | 8/2000 |
| JP | 12-274221 A | 9/2000 |
| JP | 12-389106 A | 12/2000 |
| JP | 13-180633 A | 6/2001 |
| JP | 2002-009081 A | 1/2002 |
| JP | 2002-083945 A | 3/2002 |
| JP | 2002-094027 A | 3/2002 |
| JP | 2002-176154 A | 6/2002 |
| JP | 2002-246571 | 8/2002 |
| JP | 2002-329795 A | 11/2002 |
| JP | 2002-343886 A | 11/2002 |
| JP | 2002-353080 A | 12/2002 |
| JP | 2003-031693 | 1/2003 |
| JP | 2003-68877 A | 3/2003 |
| JP | 2003-086712 A | 3/2003 |
| JP | 2003-100641 A | 4/2003 |
| JP | 2003-100900 A | 4/2003 |
| JP | 2003-132682 A | 5/2003 |
| JP | 2003-203967 A | 7/2003 |
| JP | 2003-243528 A | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto et al., A Configurable Enhanced T2RAM Macro for System-Level Power Management Unified Memory, 2006, VLSI Symposium.

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. on El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

Clarke, Junctionless Transistors Could Simply Chip Making, Say Researchers, EE. Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces Responsible for Junction Leakage on SOI, May 2009, ICSI.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two-Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology (CMOS IV) for 128Mb SOI DRAM, 2005, IEDM.

Mohapatra et al., Effect of Source/Drain Asymmetry on the Performance of Z-RAM Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories—Embedded Tutorial: The New Memory Revolution, New Drives Circuits and Systems, ICCAD 2008, Nov. 2008.
Nemati, Fully Planar 0.562 µm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-TRAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less DRAM Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. On El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. On El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15 μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High- Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

* cited by examiner ial charge carriers in the electrically floating body region of the memory cell which, in turn, may determine the data state of the memory cell. An increase of majority charge carriers in the electrically floating body region may result from impact ionization, band-to-band tunneling (gate-induced drain leakage "GIDL"), or direct injection. A decrease of majority charge carriers in the electrically floating body region may result from charge carriers being removed via drain region charge carrier removal, source region charge carrier removal, or drain and source region charge carrier removal, for example, using back gate pulsing.

TECHNIQUES FOR PROVIDING A SEMICONDUCTOR MEMORY DEVICE

CROSS-REFERENCE TO RELATED APPLICATIONS

This patent application claims priority to U.S. Provisional Patent Application No. 61/224,741, filed Jul. 10, 2009, and U.S. Provisional Patent Application No. 61/314,532, filed by Mar. 16, 2010, which are hereby incorporated by reference herein in their entireties.

FIELD OF THE DISCLOSURE

The present disclosure relates generally to semiconductor memory devices and, more particularly, to techniques for providing a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (for example, double, triple, or surrounding gate), and Fin-FET devices.

A semiconductor memory device may include a memory cell having a memory transistor with an electrically floating body region wherein electrical charges may be stored. When excess majority electrical charge carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., multiple gate devices, Fin-FETs, recessed gates and pillars) on a silicon-on-insulator (SOI) or bulk substrate.

In one conventional technique, the memory cell of the semiconductor memory device may be read by applying bias signals to a source/drain region(s) and/or a gate of the memory transistor. As such, a conventional reading technique may involve sensing an amount of current provided/generated by/in the electrically floating body region of the memory cell in response to the application of the source/drain region and/or gate bias signals to determine a data state stored in the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying bias signals to the source/drain region(s) and/or the gate of the memory transistor. As such, a conventional writing technique may result in an increase/decrease of majority charge carriers in the electrically floating body region of the memory cell which, in turn, may determine the data state of the memory cell. An increase of majority charge carriers in the electrically floating body region may result from impact ionization, band-to-band tunneling (gate-induced drain leakage "GIDL"), or direct injection. A decrease of majority charge carriers in the electrically floating body region may result from charge carriers being removed via drain region charge carrier removal, source region charge carrier removal, or drain and source region charge carrier removal, for example, using back gate pulsing.

Often, conventional reading and/or writing operations may lead to relatively large power consumption and large voltage potential swings which may cause disturbance to unselected memory cells in the semiconductor memory device. Also, pulsing between positive and negative gate biases during read and write operations may reduce a net quantity of majority charge carriers in the electrically floating body region of the memory cell in the semiconductor memory device, which, in turn, may result in an inaccurate determination of the state of the memory cell. Furthermore, in the event that a bias is applied to the gate of the memory transistor that is below a threshold voltage potential of the memory transistor, a channel of minority charge carriers beneath the gate may be eliminated. However, some of the minority charge carriers may remain "trapped" in interface defects. Some of the trapped minority charge carriers may recombine with majority charge carriers, which may be attracted to the gate as a result of the applied bias. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the state of the memory cell.

In view of the foregoing, it may be understood that there may be significant problems and shortcomings associated with conventional techniques for fabricating and/or operating semiconductor memory devices.

SUMMARY OF THE DISCLOSURE

Techniques for providing a semiconductor memory device are disclosed. In one particular exemplary embodiment, the techniques may be realized as a semiconductor memory device comprising a first region and a second region. The semiconductor memory device may also comprise a body region disposed between the first region and the second region and capacitively coupled to a plurality of word lines, wherein each of the plurality of word lines is capacitively coupled to different portions of the body region.

In accordance with other aspects of the particular exemplary embodiment, the body region may be electrically floating.

In accordance with further aspects of this particular exemplary embodiment, the first region may be a P-doped region.

In accordance with additional aspects of this particular exemplary embodiment, the second region may be an N-doped region.

In accordance with yet another aspect of this particular exemplary embodiment, the body region may be an undoped region.

In accordance with other aspects of the particular exemplary embodiment, the first region, the second region, and the body region may be formed on a substrate.

In accordance with further aspects of this particular exemplary embodiment, the first region, the second region, and the body region may be arranged in a vertical implementation.

In accordance with additional aspects of this particular exemplary embodiment, the first region, the second region, and the body region may be arranged in a planar implementation.

In accordance with yet another aspect of this particular exemplary embodiment, the plurality of word lines may be capacitively coupled to a plurality of side portions of the body region.

In accordance with other aspects of the particular exemplary embodiment, each of the plurality of word lines may be capacitively coupled to different side portions on a common side of the body region.

In accordance with further aspects of this particular exemplary embodiment, the each of the plurality of word lines may be capacitively coupled to opposite side portions of the body region.

In accordance with additional aspects of this particular exemplary embodiment, the plurality of word lines may comprise a first word line and a second word line.

In accordance with yet another aspect of this particular exemplary embodiment, the plurality of word lines may further comprise a control word line.

In accordance with other aspects of the particular exemplary embodiment, the first word line may be capacitively coupled to a first portion of the body region and the second word line may be capacitively coupled to a second portion of the body region.

In accordance with further aspects of this particular exemplary embodiment, the first portion of the body region and the second portion of the body region may be the different portions of the body region.

In accordance with additional aspects of this particular exemplary embodiment, at least a portion of the first word line may overlap at least a portion of the second word line.

In accordance with yet another aspect of this particular exemplary embodiment, the first region may be coupled to a bit line extending in a first orientation.

In accordance with other aspects of the particular exemplary embodiment, the first region may be coupled to a voltage source.

In accordance with further aspects of this particular exemplary embodiment, the second region may be coupled to a source line extending in the first orientation.

In accordance with additional aspects of this particular exemplary embodiment, the second region may be coupled to a bit line extending in a first orientation.

In accordance with yet another aspect of this particular exemplary embodiment, the plurality of word lines may be extending in a second orientation.

In another exemplary embodiment, the technique may be realized as a method for biasing a semiconductor memory device comprising the steps of applying a first voltage potential to a first region via a bit line and applying a second voltage potential to a second region via a source line. The method may also comprise the step of applying a plurality of voltage potentials to a plurality of word lines, wherein the plurality of word lines may be spaced apart from and capacitively coupled to different portions of a body region that may be electrically floating and disposed between the first region and the second region.

In accordance with other aspects of the particular exemplary embodiment, the second voltage potential applied to the second region may be a constant voltage potential.

In accordance with further aspects of this particular exemplary embodiment, the source line may be coupled to a ground.

In accordance with additional aspects of this particular exemplary embodiment, the second voltage potential applied to the second region may be a zero voltage potential.

In accordance with yet another aspect of this particular exemplary embodiment, the plurality of voltage potentials applied to the plurality of word lines may allow a hold operation to be performed on the semiconductor memory device, and the method may further comprise maintaining the plurality of voltage potentials applied to the plurality of word lines to perform a read operation on the semiconductor memory device.

In accordance with other aspects of the particular exemplary embodiment, the first voltage potential applied to bit line may allow a hold operation to be performed on the semiconductor memory device, and the method may further comprise increasing the first voltage potential applied to the bit line to perform a read operation on the semiconductor memory device.

In accordance with further aspects of this particular exemplary embodiment, the first voltage potential applied to bit line may allow a hold operation to be performed on the semiconductor memory device, and the method may further comprise increasing the first voltage potential applied to the bit line to perform a first stage of a write logic high operation on the semiconductor memory device.

In accordance with additional aspects of this particular exemplary embodiment, the first voltage potential applied to the bit line may allow a hold operation to be performed on the semiconductor memory device, and the method may further comprise maintaining the first voltage potential applied to the bit line to perform a second stage of the write logic high operation on the semiconductor memory device.

In accordance with yet another aspect of this particular exemplary embodiment, the plurality of voltage potentials applied to the plurality of word lines may comprise a third voltage potential applied to a first word line of the plurality of word lines to perform a hold operation on the semiconductor memory device, and the method further comprise maintaining the third voltage potential applied to the first word line of the plurality of word lines to perform at least one of a first stage of a write logic high operation and a second stage of the write logic high operation on the semiconductor memory device.

In accordance with other aspects of the particular exemplary embodiment, the plurality of voltage potentials applied to the plurality of word lines may comprise a fourth voltage potential applied to a second word line of the plurality of word lines to perform a hold operation on the semiconductor memory device, and the method may further comprise decreasing the fourth voltage potential applied to the second word line of the plurality of word lines to perform a first stage of a write logic high operation on the semiconductor memory device.

In accordance with further aspects of this particular exemplary embodiment, the method may further comprise increasing the fourth voltage potential applied to the second word line of the plurality of word lines from the fourth voltage potential applied to the second word line of the plurality of word lines during the first stage of the write logic high operation to perform a second stage of the write logic high operation on the semiconductor memory device.

In accordance with additional aspects of this particular exemplary embodiment, the plurality of voltage potentials applied to the plurality of word lines may comprise a third voltage potential applied to a first word line of the plurality of word lines to perform a hold operation on the semiconductor memory device, and the method may further comprise increasing the third voltage potential applied to the first word line of the plurality of word lines to perform a write logic low operation on the semiconductor memory device.

In accordance with yet another aspect of this particular exemplary embodiment, the plurality of voltage potentials applied to the plurality of word lines may comprise a fourth voltage potential applied to a second word line of the plurality of word lines to perform a hold operation on the semiconductor memory device, and the method may further comprise decreasing the fourth voltage potential applied to the second word line of the plurality of word lines to perform a write logic low operation on the semiconductor memory device.

In accordance with other aspects of the particular exemplary embodiment, the first voltage potential applied to the bit line may allow a hold operation to be performed on the semiconductor memory device, and the method may further comprise maintaining the first voltage potential applied to the bit line to perform a write logic low operation on the semiconductor memory device.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
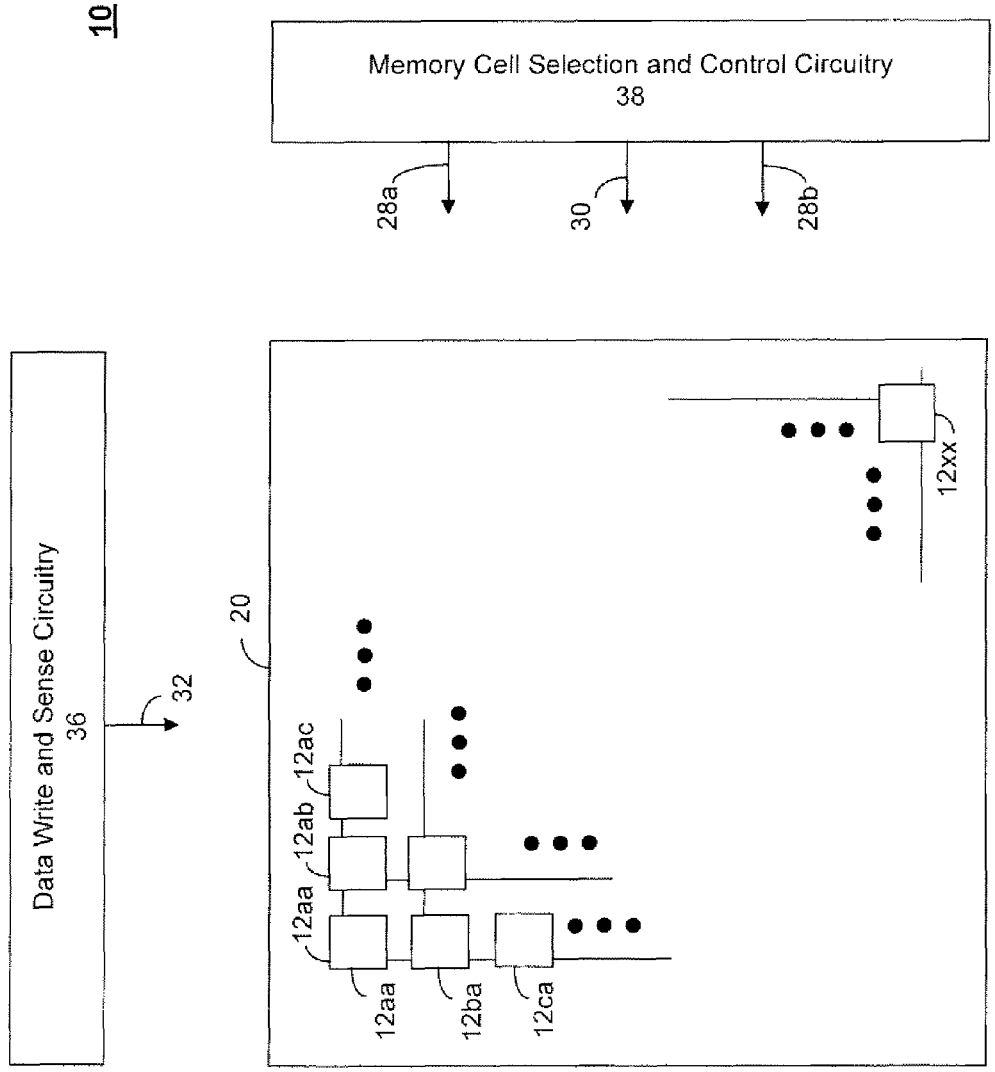
FIG. 1 shows a schematic block diagram of a semiconductor memory device including a memory cell array, data write and sense circuitry, and memory cell selection and control circuitry in accordance with an embodiment of the present disclosure.

Referring to FIG. 1, there is shown a schematic block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a plurality of word lines (WL) 28 and a source line (CN) 30, and the data write and sense circuitry 36 via a bit line (EN) 32. In an exemplary embodiment, the plurality word lines (WL) 28 may include a first word line (WL1) 28a and a second word line (WL2) 28b. It may be appreciated that the source line (CN) 30 and the bit line (EN) 32 are designations used to distinguish between two signal lines and they may be used interchangeably.

The data write and sense circuitry 36 may read data from and may write data to selected memory cells 12. In an exemplary embodiment, the data write and sense circuitry 36 may include a plurality of data sense amplifiers. Each data sense amplifier may receive at least one bit line (EN) 32 and a current or voltage reference signal. For example, each data sense amplifier may be a cross-coupled type sense amplifier to sense a data state stored in a memory cell 12. Also, each data sense amplifier may employ voltage and/or current sensing circuitry and/or techniques. In an exemplary embodiment, each data sense amplifier may employ current sensing circuitry and/or techniques. For example, a current sense amplifier may compare current from a selected memory cell 12 to a reference current (e.g., the current of one or more reference cells). From that comparison, it may be determined whether the selected memory cell 12 contains a logic high (e.g., binary "1" data state) or a logic low (e.g., binary "0" data state). It may be appreciated by one having ordinary skill in the art that various types or forms of data write and sense circuitry 36 (including one or more sense amplifiers, using voltage or current sensing techniques, using or not reference cells, to sense a data state stored in a memory cell 12) may be employed to read data stored in memory cells 12 and/or write data to memory cells 12.

The memory cell selection and control circuitry 38 may select and/or enable one or more predetermined memory cells 12 to facilitate reading data therefrom and/or writing data thereto by applying control signals on one or more of the plurality of word lines (WL) 28 and/or the source lines (CN) 30. The memory cell selection and control circuitry 38 may generate such control signals from address signals, for example, row address signals. Moreover, the memory cell selection and control circuitry 38 may include a plurality of word line decoders and/or drivers. For example, the memory cell selection and control circuitry 38 may include one or more different control/selection techniques (and circuitry therefore) to select and/or enable one or more predetermined memory cells 12. Notably, all such control/selection techniques, and circuitry therefore, whether now known or later developed, are intended to fall within the scope of the present disclosure.

In an exemplary embodiment, the semiconductor memory device may implement a two step write operation whereby all the memory cells 12 in a row of memory cells 12 may be first written to a first predetermined data state. For example, the memory cells 12 in a row of memory cell array 20 may be first written to a logic high (e.g., binary "1" data state) by executing a logic high (e.g., binary "1" data state) write operation.

Thereafter, selected memory cells 12 in the active row of memory cell array 20 may be selectively written to a second predetermined data state. For example, one or more selected memory cells 12 in the active row of the memory cell array 20 may be selectively written to a logic low (e.g., binary "0" data state) by executing a logic low (e.g., binary "0" data state) write operation. The semiconductor memory device 10 may also implement a one step write operation whereby selected memory cells 12 in an active row of memory cell array 20 may be selectively written to a predetermined state. For example, the semiconductor memory device 10 may implement a one step write operation whereby one or more selected memory cells in an active row of memory array 20 may be selectively written to either a logic high (e.g., binary "1" data state) or a logic low (e.g., binary "0" data state). The semiconductor memory device 10 may employ any of the exemplary writing, refreshing, holding, and/or reading techniques described herein.

The memory cells 12 may comprise N-type channel, P-type channel, and/or both types of transistors. Circuitry that is peripheral to the memory array 20 (for example, sense amplifiers or comparators, row and column address decoders, as well as line drivers (not illustrated herein)) may also include P-type channel and/or N-type channel transistors. Regardless of whether P-type channel or N-type channel transistors are employed in memory cells 12 in the memory array 20, suitable voltage potentials (for example, positive or negative voltage potentials) for reading from and/or writing to the memory cells 12 may be applied.

Figure 2:
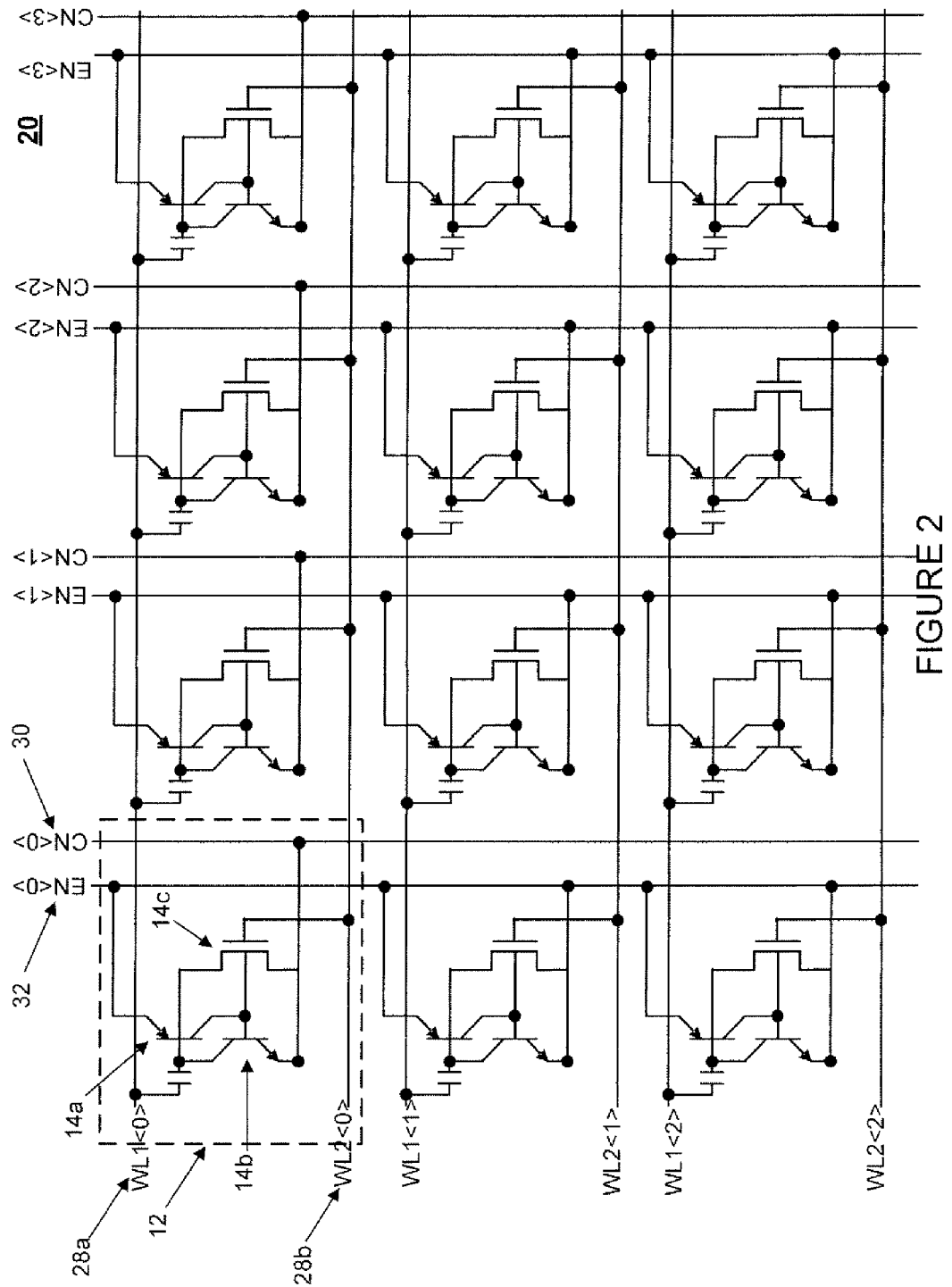
FIG. 2 shows a schematic diagram of at least a portion of a memory cell array having a plurality of memory cells in accordance with an embodiment of the present disclosure.

Referring to FIG. 2, there is shown a schematic diagram of at least a portion of the memory cell array 20 having the plurality of memory cells 12 in accordance with an embodiment of the present disclosure. Each of the memory cells 12 may comprise a first bipolar transistor 14a, a second bipolar transistor 14b, and a field effect transistor (FET) 14c coupled to each other. For example, the first bipolar transistor 14a and/or the second bipolar transistor 14b may be an NPN bipolar transistor or a PNP bipolar transistor. The field effect transistor (FET) 14c may be an N-channel field effect transistor (FET), or a P-channel field effect transistor (FET). As illustrated in FIG. 2, the first bipolar transistor 14a may be a PNP bipolar transistor and the second bipolar transistor 14b may be an NPN bipolar transistor. In another exemplary embodiment, the first memory transistor 14a may be an NPN bipolar transistor and the second memory transistor 14b may be a PNP bipolar transistor.

Each memory cell 12 may be coupled to a respective of a plurality of word lines (WL) 28, a respective source line (CN) 30, and a respective bit line (EN) 32. Data may be written to or read from a selected memory cell 12 by applying suitable control signals to selected of the plurality of word lines (WL) 28, a selected source line (CN) 30, and/or a selected bit line (EN) 32. In an exemplary embodiment, each of the plurality of word lines (WL) 28 may extend horizontally parallel to each other in a row direction. Each source line (CN) 30 and bit line (EN) 32 may extend vertically in a column direction perpendicular to each of the plurality of word lines (WL) 28.

In an exemplary embodiment, one or more respective bit lines (EN) 32 may be coupled to one or more data sense amplifiers (not shown) of the data write and sense circuitry 36 to read data states of one or more memory cells 12 in the column direction. A data state may be read from one or more selected memory cells 12 by applying one or more control signals to the one or more selected memory cells 12 via selected plurality of word lines (WL) 28, and/or a selected source line (CN) 30 in order to generate a voltage potential and/or a current in the one or more selected memory cells 12. The generated voltage potential and/or current may then be output to the data write and sense circuitry 36 via a corresponding bit line (EN) 32 in order to read a data state stored in each selected memory cell 12.

In an exemplary embodiment, a data state may be read from a selected memory cell 12 via a selected bit line (EN) 32 coupled to the data sense amplifier of the data write and sense circuitry 36. The source line (CN) 30 may be separately controlled via a voltage potential/current source (e.g., a voltage potential/current driver) of the memory cell selection and control circuitry 38. In an exemplary embodiment, the data sense amplifier of the data write and sense circuitry 36 and the voltage potential/current source of the memory cell selection and control circuitry 38 may be configured on opposite sides of the memory cell array 20.

In an exemplary embodiment, a data state may be written to one or more selected memory cells 12 by applying one or more control signals to the one or more selected memory cells 12 via selected plurality of word lines (WL) 28, a selected source line (CN) 30, and/or a selected bit line (EN) 32. The one or more control signals applied to the one or more selected memory cells via selected plurality of word lines (WL) 28, a selected source line (CN) 30, and/or a selected bit line (EN) 32 may control the first bipolar transistor 14a, the second bipolar transistor 14b, and the third field effect transistor (FET) 14c of each selected memory cell 12 in order to write a desired data state to each selected memory cell 12.

Figure 3:
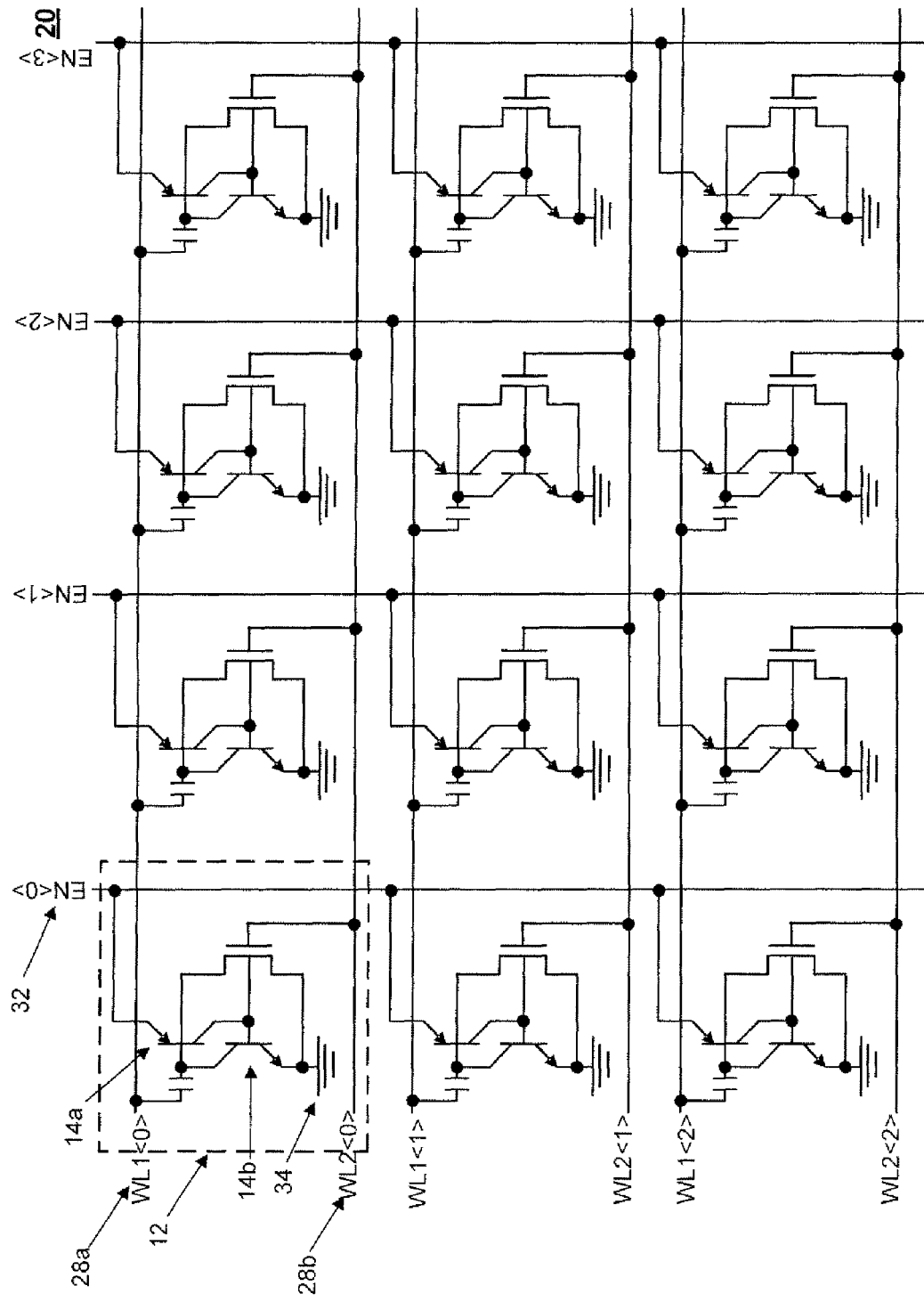
FIG. 3 shows a schematic diagram of at least a portion of a memory cell array having a plurality of memory cells in accordance with an alternative embodiment of the present disclosure.

Referring to FIG. 3, there is shown a schematic diagram of at least a portion of the memory cell array 20 having the plurality of memory cells 12 in accordance with an alternative embodiment of the present disclosure. The memory cell array 20 having a plurality of memory cells 12 may be implemented with the structure and techniques similar to that of the memory cell array 20 having a plurality of memory cells 12 shown in FIG. 2, except that the source line (CN) 30 may be replaced with an electrical ground 34. As illustrated in FIG. 3, the second bipolar transistor 14b may be coupled to the electrical ground 34, while the first bipolar transistor 14a may be coupled to a corresponding bit line (EN) 32. In another exemplary embodiment, the first bipolar transistor 14a may be coupled to the electrical ground 34, while the second bipolar transistor 14b may be coupled to a corresponding bit line (EN) 32.

Figure 4:
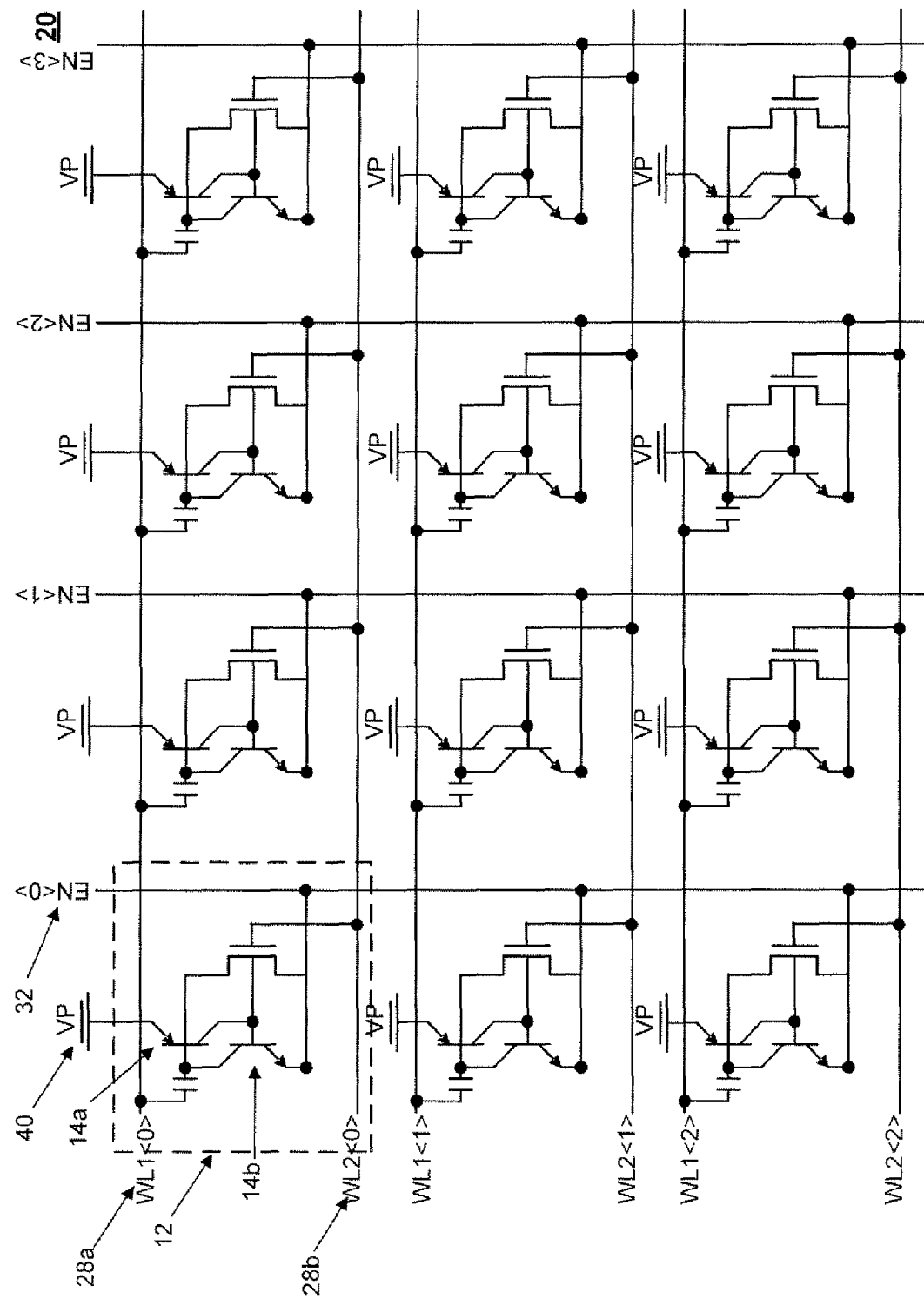
FIG. 4 shows a schematic diagram of at least a portion of a memory cell array having a plurality of memory cells in accordance with another alternative embodiment of the present disclosure.

Referring to FIG. 4, there is shown a schematic diagram of at least a portion of the memory cell array 20 having the plurality of memory cells 12 in accordance with another alternative embodiment of the present disclosure. The memory cell array 20 having a plurality of memory cells 12 may be implemented with the structure and techniques similar to that of the memory cell array 20 having a plurality of memory cells 12 shown in FIG. 2, except that the source line (CN) 30 may be replaced with a power source 40. For example, the power source may be a voltage potential source, current source, and/or other types of power source. As illustrated in FIG. 4, the first bipolar transistor 14a may be coupled to the power source 40, while the second bipolar transistor 14b may be coupled to a corresponding bit line (EN) 32. In another exemplary embodiment, the first bipolar transistor 14a may be coupled to a corresponding bit line (EN) 32, while the second bipolar transistor 14b may be coupled to the power source 40.

Figure 5:
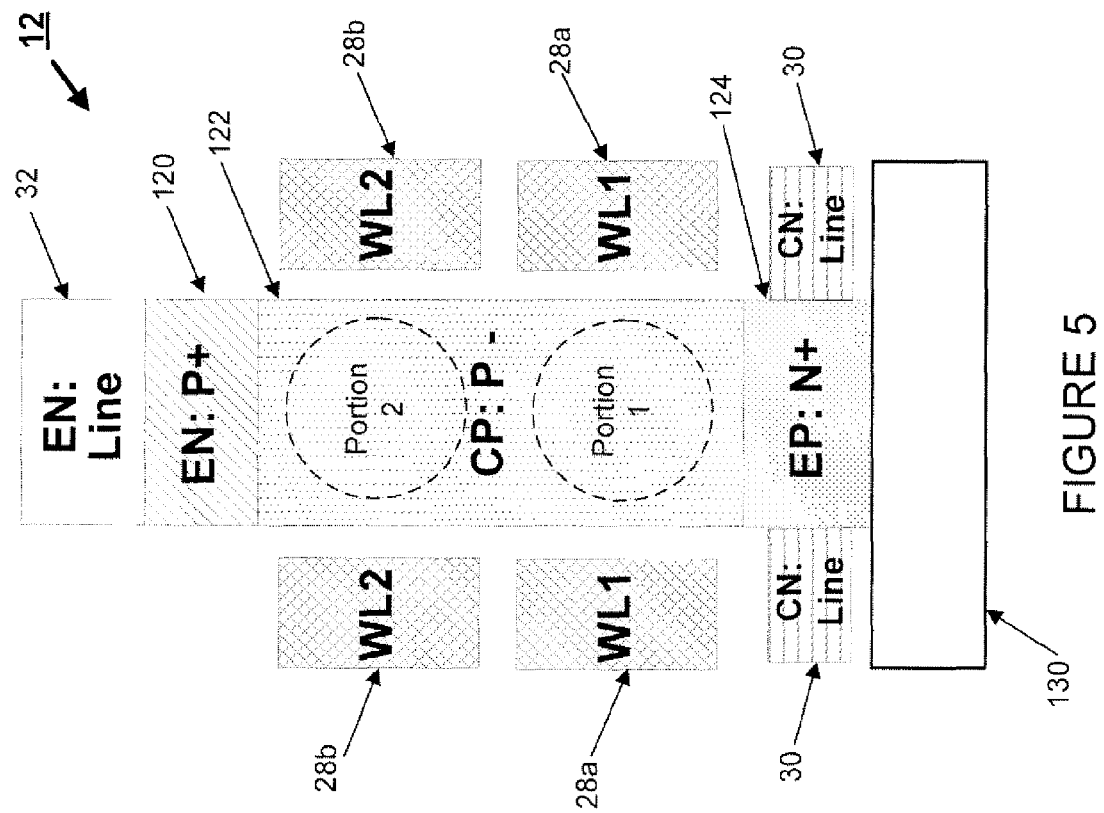
FIG. 5 shows a cross-sectional view of a vertical implementation of a memory cell of a memory cell array in accordance with an embodiment of the present disclosure.

Referring to FIG. 5, there is shown a cross-sectional view of a vertical implementation of a memory cell 12 of the memory cell array 20 shown in FIG. 1 in accordance with an embodiment of the present disclosure. The memory cell 12 may be implemented in a vertical configuration having various regions. For example, the memory cell 12 may comprise a P+ source region 120, a P− body region 122, and an N+ drain region 124. The P+ source region 120, the P− body region 122, and/or the N+ drain region 124 may be disposed in a sequential contiguous relationship, and may extend vertically from a plane defined by a P− substrate 130. In an exemplary embodiment, the P− body region 122 may be an electrically floating body region of the memory cell 12 configured to accumulate/store charges, and may be spaced apart from and capacitively coupled to the plurality of word lines (WL) 28.

As shown in FIG. 5, the P+ source region 120 of the memory cell 12 may be coupled to a corresponding bit line (EN) 32. In an exemplary embodiment, the P+ source region 120 of the memory cell 12 may be formed of a semiconductor material (e.g., silicon) comprising acceptor impurities. For example, the P+ source region 120 may be formed of a silicon material doped with boron impurities. In an exemplary embodiment, the P+ source region 120 may be doped with acceptor impurities having a concentration of $10^{20}$ atom/cm$^3$.

In an exemplary embodiment, the bit line (EN) 32 may be formed of a metal material. In another exemplary embodiment, the bit line (EN) 32 may be formed of a polycide material (e.g., a combination of a metal material and a silicon material). In other exemplary embodiments, the bit line (EN) 32 may be formed of an N+ doped silicon layer. The bit line (EN) 32 may provide a means for accessing one or more selected memory cells 12 on a selected row. For example, the bit line (EN) 32 may be coupled to a plurality of memory cells 12 (e.g., a column of memory cells 12). As shown in FIG. 5, the bit line (EN) 32 may be formed above the P+ source region 120.

As also shown in FIG. 5, the P− body region 122 of the memory cell 12 may be capacitively coupled to a plurality of corresponding word lines (WL) 28. In an exemplary embodiment, the P− body region 122 may be formed of an undoped semiconductor material (e.g., intrinsic silicon). In an exemplary embodiment, the P− body region 122 may be formed of a semiconductor material (e.g., silicon) comprising acceptor impurities. For example, the P− body region 122 may be formed of a silicon material doped with boron impurities. In an exemplary embodiment, the P− body region 122 may be formed of a silicon material with acceptor impurities having a concentration of $10^{15}$ atoms/cm$^3$.

In an exemplary embodiment, the plurality of word lines (WL) 28 may be capacitively coupled the P− body region 122 in a fin configuration. The plurality of word lines (WL) 28 may be oriented in a row direction of the memory cell array 20 and connected to a plurality of memory cells 12. The plurality of word lines (WL) 28 may be arranged on the sides of the memory cells 12 (e.g., memory cells 12 located on a row direction of the memory cell array 20). The plurality of word lines (WL) 28 may include a first word line (WL1) 28a capacitively coupled to a first portion of the P− body region 122 and a second word line (WL2) 28b capacitively coupled to a second portion of the P− body region 122. The first portion and the second portion of the P− body region 122 may be different portions of the P− body region 122. For example, the plurality of word lines (WL) 28 may be arranged on at least two side portions of the memory cells 12.

For example, the plurality of word lines (WL) 28 may be formed of a polycide material (e.g., a combination of a metal material and a silicon material), a metal material, and/or a combination of a polycide material and a metal material. In another exemplary embodiment, the plurality of word lines (WL) 28 may be formed of a P+ doped silicon material. For example, the first word line (WL1) 28a and the second word line (WL2) 28b of the plurality of word lines (WL) 28 may be formed of different material. In an exemplary embodiment, the first word line (WL1) 28a may be formed of a polycide material and the second word line (WL2) 28b may be formed of a metal layer. Each of the plurality of word lines (WL) 28 may include a plurality of layers formed of different materials. For example, each of the plurality of word lines (WL) 28 may include a layer formed above the polycide layer to couple the polycide layer to a voltage/current source of the memory cell selection and control circuitry 38.

As further shown in FIG. 5, the N+ drain region 124 of the memory cell 12 may be coupled to a source line (CN) 30. In an exemplary embodiment, the N+ drain region 124 may be formed of a semiconductor material (e.g., silicon) comprising donor impurities. For example, the N+ drain region 124 may be formed of a silicon material doped with phosphorous or arsenic impurities. In an exemplary embodiment, the N+ drain region 124 may be formed of a silicon material doped with phosphorous or arsenic having a concentration of $10^{20}$ atoms/cm$^3$.

In an exemplary embodiment, the source line (CN) 30 may be formed of a polycide material. In another exemplary embodiment, the source line (CN) 30 may be formed of a metal material. The source line (CN) 30 may extend vertically in a column direction parallel to the bit line (EN) 32 and may be coupled to a plurality of memory cells 12 (e.g., a column of memory cells 12). For example, the source line (CN) 30 and the bit line (EN) may be arranged in different planes and configured to be parallel to each other. In an exemplary embodiment, the source line (CN) 30 may be arranged below a plane containing the bit line (EN) 32.

In an exemplary embodiment, the P− substrate 130 may be made of a semiconductor material (e.g., silicon) comprising acceptor impurities and may form a base of the memory cell array 20. For example, the P− substrate 130 may be made of a semiconductor material comprising boron impurities. In an exemplary embodiment, the P− substrate 130 may be made of silicon comprising boron impurities having a concentration of $10^{15}$ atoms/cm$^3$. In alternative exemplary embodiments, a plurality of P− substrates 130 may form the base of the memory cell array 20 or a single P− substrate 130 may form the base of the memory cell array 20. Also, the P− substrate 130 may be made in the form of a P-well substrate.

Figure 6:
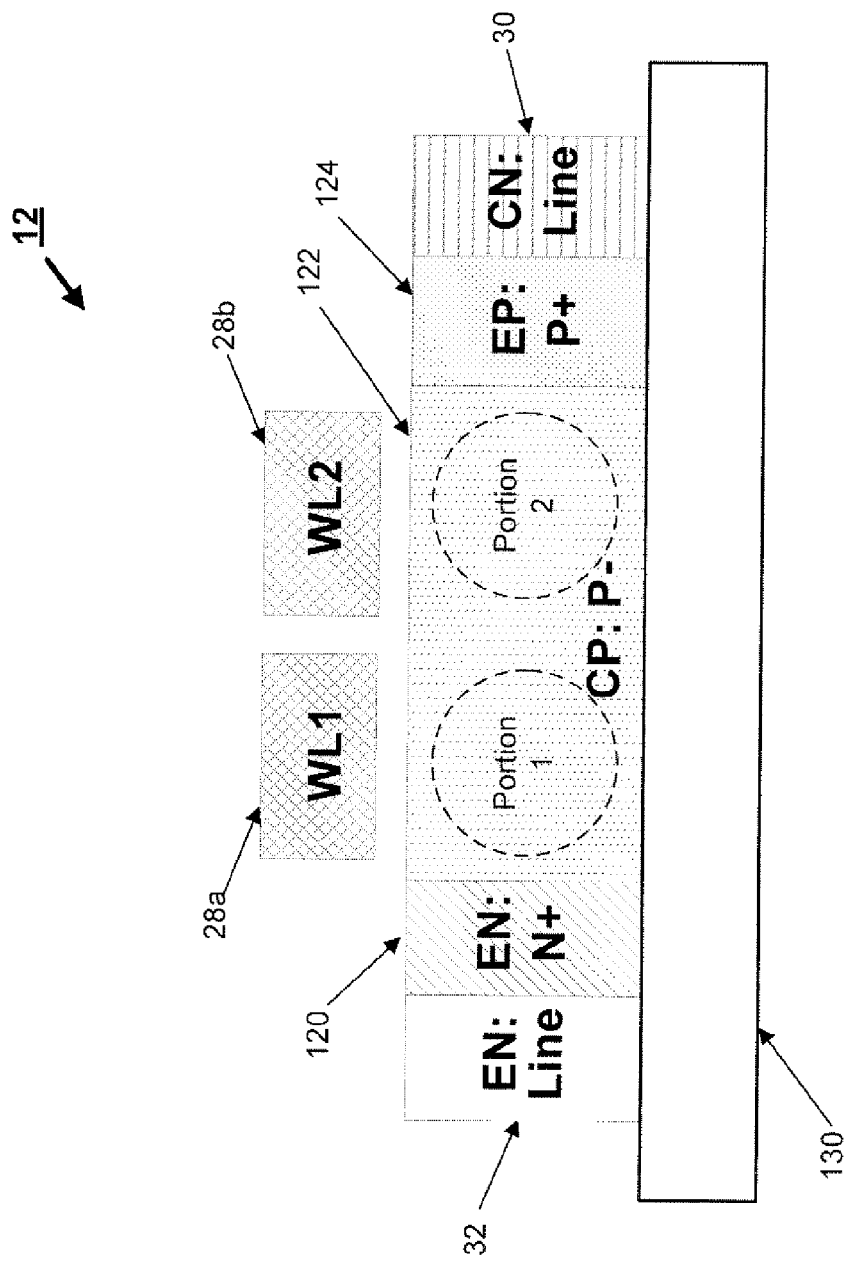
FIG. 6 shows a side cross-sectional view of a planar implementation of a memory cell of a memory cell array in accordance with an embodiment of the present disclosure.

Referring to FIG. 6, there is shown a side cross-sectional view of a planar implementation of a memory cell 12 of the memory cell array 20 shown in FIG. 1 in accordance with an embodiment of the present disclosure. In an exemplary embodiment, the memory cell 12 may be implemented in a planar configuration. As discussed above, the memory cell 12 may comprise a P+ source region 120 coupled to a corresponding bit line (EN) 32, a P− body region 122 capacitively coupled to a plurality of word lines (WL) 28, and an N+ drain region 124 coupled to a corresponding source line (CN) 30. The P+ source region 120, the P− body region 122, and/or the N+ drain region 124 may be disposed in a sequential contiguous relationship, and may extend horizontally from a plane defined by a P− substrate 130. In an exemplary embodiment, the P− body region 122 may be an electrically floating body region of the memory cell 12 configured to accumulate/store charges, and may be spaced apart from and capacitively coupled to the plurality of word lines (WL) 28.

As shown in FIG. 6, the plurality of word lines (WL) 28 may be capacitively coupled the P− body region 122 in a fin configuration. The plurality of word lines (WL) 28 may be oriented in a row direction of the memory cell array 20 and coupled to a plurality of memory cells 12. The plurality of word lines (WL) 28 may include a first word line (WL1) 28*a* capacitively coupled to a first portion of the P− body region 122 and a second word line (WL2) 28*b* capacitively coupled to a second portion of the P− body region 122. The first portion and the second portion of the P− body region 122 may be different portions of the P− body region 122. The plurality of word lines (WL) 28 may be arranged on a side portion of the memory cells 12 (e.g., memory cells 12 located on a row direction of the memory cell array 20). For example, the plurality of word lines (WL) 28 may be arranged on a top side portion of the memory cells 12.

Figure 6A:
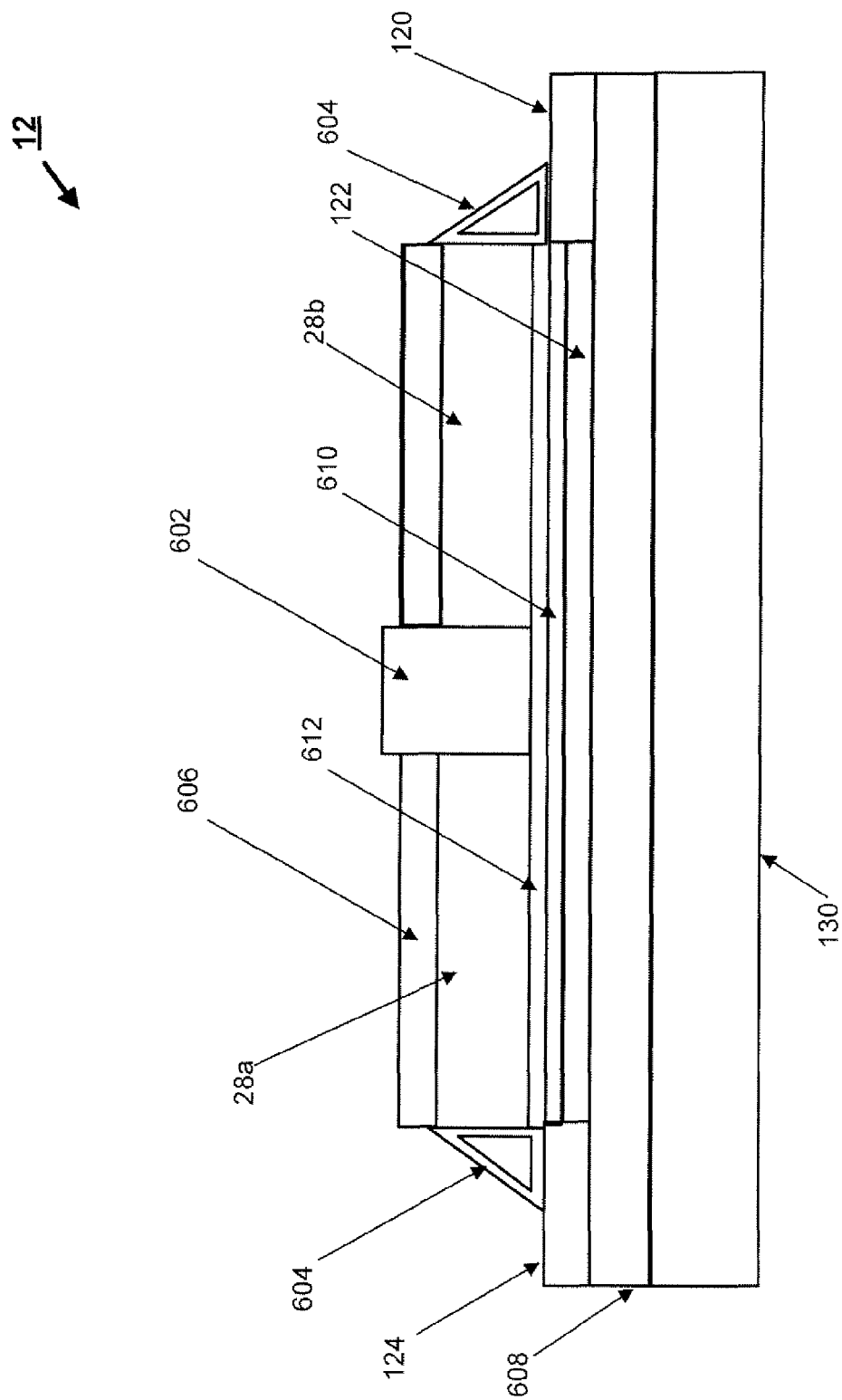
FIG. 6A shows a side cross-sectional view of a planar implementation of a memory cell of a memory cell array in accordance with an alternative embodiment of the present disclosure.

Referring to FIG. 6A, there is shown a side cross-sectional view of a planar implementation of a memory cell 12 of the memory cell array 20 shown in FIG. 1 in accordance with an alternative embodiment of the present disclosure. In an exemplary embodiment, the memory cell 12 may be implemented in a planar configuration. As discussed above, the memory cell 12 may comprise a P+ source region 120 coupled to a corresponding bit line (EN) 32, a P− body region 122 capacitively coupled to a plurality of word lines (WL) 28, and an N+ drain region 124 coupled to a corresponding source line (CN) 30. The P+ source region 120, the P− body region 122, and/or the N+ drain region 124 may be disposed in a sequential contiguous relationship, and may extend horizontally from a plane defined by a P− substrate 130. In an exemplary embodiment, the P− body region 122 may be an electrically floating body region of the memory cell 12 configured to accumulate/store charges, and may be spaced apart from and capacitively coupled to the plurality of word lines (WL) 28.

As shown in FIG. 6A, the plurality of word lines (WL) 28 may be capacitively coupled the P− body region 122 in a fin configuration. The plurality of word lines (WL) 28 may be oriented in a row direction of the memory cell array 20 and coupled to a plurality of memory cells 12. The plurality of word lines (WL) 28 may include a first word line (WL1) 28*a* capacitively coupled to a first portion of the P− body region 122 and a second word line (WL2) 28*b* capacitively coupled to a second portion of the P− body region 122. The first portion and the second portion of the P− body region 122 may be different portions of the P− body region 122. The plurality of word lines (WL) 28 may be arranged on a side portion of the memory cells 12 (e.g., memory cells 12 located on a row direction of the memory cell array 20). For example, the plurality of word lines (WL) 28 may be arranged on a top side portion of the memory cells 12.

The plurality of word lines (WL) 28 may be spaced from each other via a barrier wall 602. For example, the barrier wall 602 may be located between a first word line (WL1) 28*a* and a second word line (WL2) 28*b*. The barrier wall 602 may be made from silicon oxide (e.g., silicon dioxide (SiO$_2$)) material via an ion implementation process and/or rapid thermal anneal (RTA) process. In another exemplary embodiment, an insulating spacer 604 may be configured at an end portion of the plurality of word lines (WL) 28. For example, the insulating spacer 604 may be configured at an end portion adjacent to the first word line (WL1) 28*a* and at an end portion adjacent to the second word line (WL2) 28*b*. The insulating spacer 604 may be made from a plurality of materials. In an exemplary embodiment, the insulating spacer 604 may be formed of a triangular silicon nitride material covered by a silicon oxide material. For example, a dielectric spacer 606 may be disposed on top of the plurality of word lines (WL) 28. For example, the dielectric spacer 606 may be disposed on the first word line (WL1)28*a* and the second word line (WL2) 28*b*. For example, the dielectric spacer 606 may be formed of a silicon oxide material.

For example, a buried oxide layer 608 may be made of dielectric or insulating material disposed on top of the P− substrate 130. For example, the buried oxide layer 608 may have a thickness in a range of 5 nm to 200 nm. In an exemplary embodiment, the buried oxide layer 608 may have a thickness range from 10 nm to 100 nm. One or more layers may be disposed above the P− body region 122 to capacitively couple the plurality of word lines (WL) 28 to the P− body region 122. For example, an interfacial layer 610 may be disposed above the P− body region 122. In an exemplary embodiment, the interfacial layer 610 may be made from silicon oxide material (e.g., silicon dioxide (SiO$_2$) material). In other exemplary embodiments, a dielectric barrier layer 612 may be disposed above the interfacial layer 610. The dielectric barrier layer 612 may be formed of a silicon oxide material or a silicon nitride material. For example, the dielectric barrier layer 612 may be made by oxygen or N diffusion through atomic layer deposition (ALD).

Figure 6B:
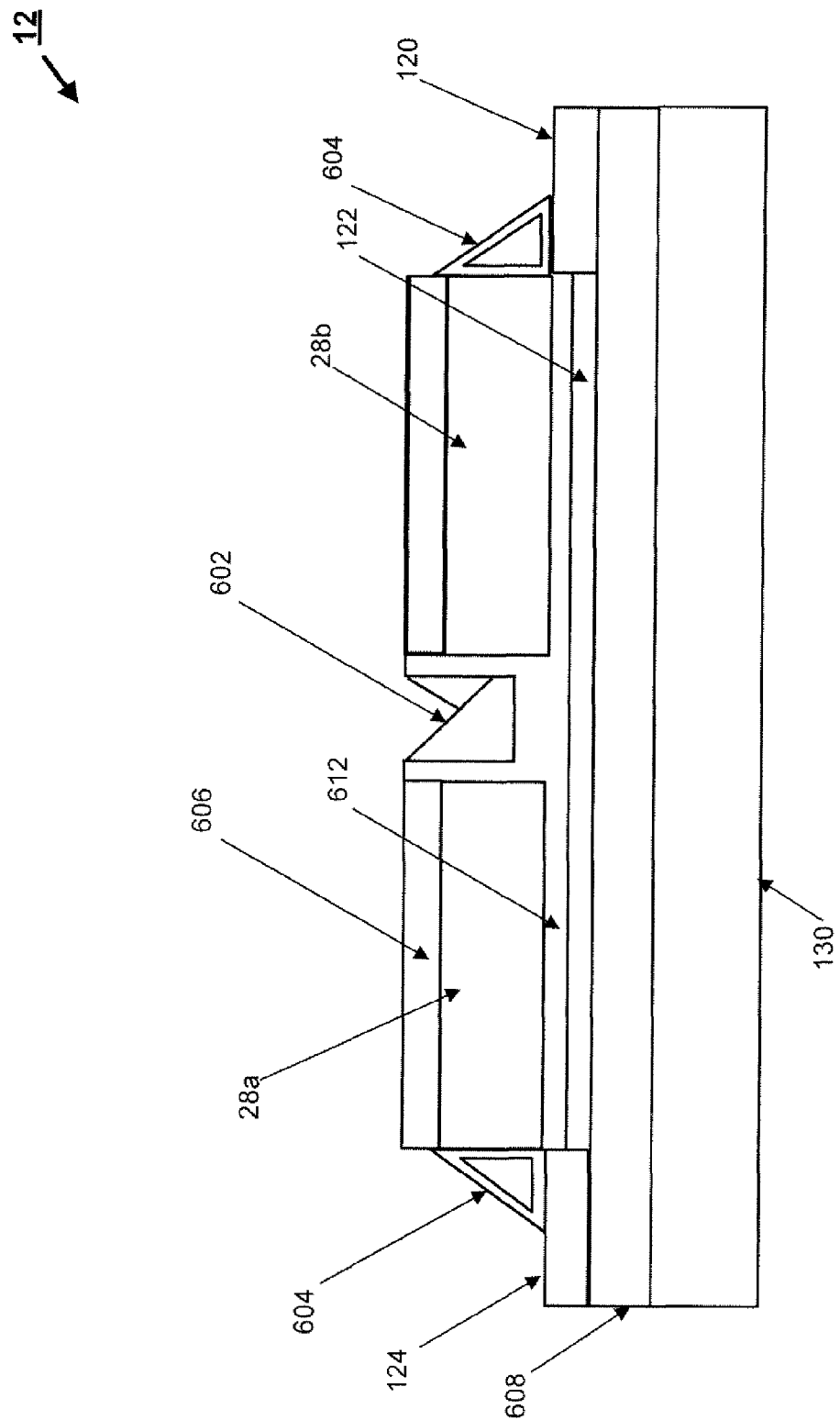
FIG. 6B shows a side cross-sectional view of a planar implementation of a memory cell of a memory cell array in accordance with an alternative embodiment of the present disclosure.

Referring to FIG. 6B, there is shown a side cross-sectional view of a planar implementation of a memory cell 12 of the memory cell array 20 shown in FIG. 1 in accordance with an alternative embodiment of the present disclosure. In an exemplary embodiment, the memory cell 12 may be implemented in a planar configuration. As discussed above, the memory cell 12 may comprise a P+ source region 120 coupled to a corresponding bit line (EN) 32, a P− body region 122 capacitively coupled to a plurality of word lines (WL) 28, and an N+ drain region 124 coupled to a corresponding source line (CN) 30. The P+ source region 120, the P− body region 122, and/or the N+ drain region 124 may be disposed in a sequential contiguous relationship, and may extend horizontally from a plane defined by a P− substrate 130. In an exemplary embodiment, the P− body region 122 may be an electrically floating body region of the memory cell 12 configured to accumulate/store charges, and may be spaced apart from and capacitively coupled to the plurality of word lines (WL) 28.

As shown in FIG. 6B, the plurality of word lines (WL) 28 may be capacitively coupled the P− body region 122 in a fin configuration. The plurality of word lines (WL) 28 may be oriented in a row direction of the memory cell array 20 and coupled to a plurality of memory cells 12. The plurality of word lines (WL) 28 may include a first word line (WL1) 28a capacitively coupled to a first portion of the P− body region 122 and a second word line (WL2) 28b capacitively coupled to a second portion of the P− body region 122. The first portion and the second portion of the P− body region 122 may be different portions of the P− body region 122. The plurality of word lines (WL) 28 may be arranged on a side portion of the memory cells 12 (e.g., memory cells 12 located on a row direction of the memory cell array 20). For example, the plurality of word lines (WL) 28 may be arranged on a top side portion of the memory cells 12.

The plurality of word lines (WL) 28 may be spaced from each other via a barrier wall 602. For example, the barrier wall 602 may be located between a first word line (WL1) 28a and a second word line (WL2) 28b. The barrier wall 602 may be made from silicon oxide (e.g., silicon dioxide ($SiO_2$)) material via an ion implementation process and/or rapid thermal anneal (RTA) process. The barrier wall 602 may be formed in a trench region formed by a dielectric barrier layer 612. For example, the dielectric barrier layer 612 may form a trench region between the first word line (WL1) 28a and the second word line (WL2) 28b. The barrier wall 602 may be deposited in the trench region formed by the dielectric barrier layer 612. The dielectric barrier layer 612 may be disposed above the P− body region 122 to capacitively couple the plurality of word lines (WL) 28 to the P− body region 122. The dielectric barrier layer 612 may be formed of a silicon oxide material or a silicon nitride material. For example, the dielectric barrier layer 612 may be made by oxygen or N diffusion through atomic layer deposition (ALD).

An insulating spacer 604 may be configured at an end portion of the plurality of word lines (WL) 28. For example, the insulating spacer 604 may be configured at an end portion adjacent to the first word line (WL1) 28a and at an end portion adjacent to the second word line (WL2) 28b. The insulating spacer 604 may be made from a plurality of materials. In an exemplary embodiment, the insulating spacer 604 may be formed of a triangular silicon nitride material covered by a silicon oxide material. Also, a dielectric spacer 606 may be disposed on top of the plurality of word lines (WL) 28. For example, the dielectric spacer 606 may be disposed on the first word line (WL1) 28a and the second word line (WL2) 28b. For example, the dielectric spacer 606 may be formed of a silicon oxide material. A buried oxide layer 608 may be made of dielectric or insulating material disposed on top of the P− substrate 130. For example, the buried oxide layer 608 may have a thickness in a range of 5 nm to 200 nm. In an exemplary embodiment, the buried oxide layer 608 may have a thickness range from 10 nm to 100 nm.

Figure 6C:
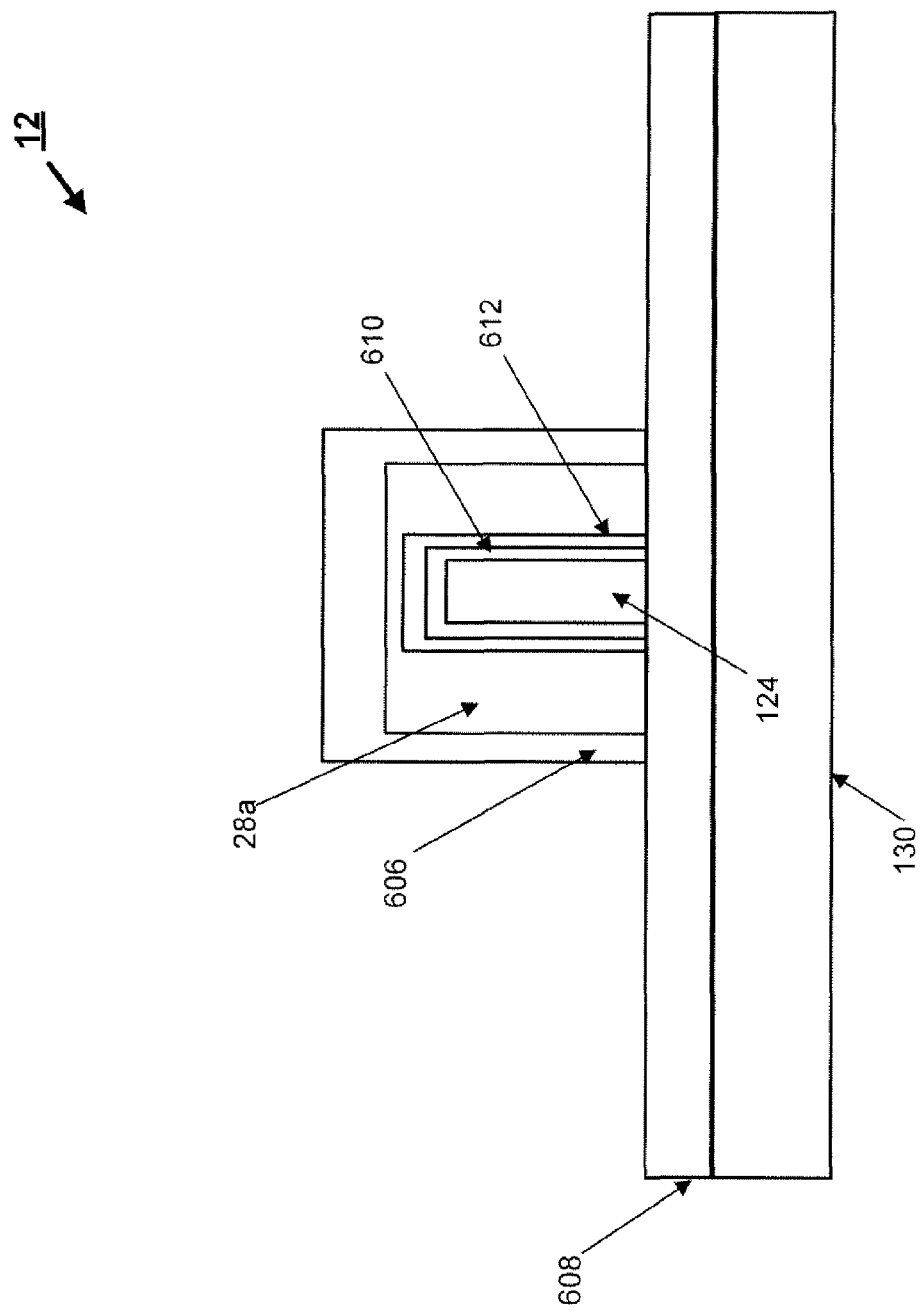
FIG. 6C shows an end cross-sectional view of a planar implementation of a memory cell of a memory cell array in accordance with an alternative embodiment of the present disclosure.

Referring to FIG. 6C, there is shown an end cross-sectional view of a planar implementation of a memory cell 12 of the memory cell array 20 shown in FIG. 1 in accordance with an alternative embodiment of the present disclosure. In an exemplary embodiment, the memory cell 12 may be implemented in a planar configuration. As discussed above, the memory cell 12 may comprise a P+ source region 120 coupled to a corresponding bit line (EN) 32, a P− body region 122 capacitively coupled to a plurality of word lines (WL) 28, and an N+ drain region 124 coupled to a corresponding source line (CN) 30. The P+ source region 120, the P− body region 122, and/or the N+ drain region 124 may be disposed in a sequential contiguous relationship, and may extend horizontally from a plane defined by a buried oxide layer 608 and a P− substrate 130. The buried oxide layer 608 may be made of dielectric or insulating material disposed on top of the P− substrate 130. For example, the buried oxide layer 608 may have a thickness in a range of 5 nm to 200 nm. In an exemplary embodiment, the buried oxide layer 608 may have a thickness range from 10 nm to 100 nm. In an exemplary embodiment, the P− body region 122 may be an electrically floating body region of the memory cell 12 configured to accumulate/store charges, and may be spaced apart from and capacitively coupled to the plurality of word lines (WL) 28.

As shown in FIG. 6C, the plurality of word lines (WL) 28 may be capacitively coupled the P− body region 122 in a fin configuration. The plurality of word lines (WL) 28 may be oriented in a row direction of the memory cell array 20 and coupled to a plurality of memory cells 12. A dielectric spacer 606 may be disposed on top of the plurality of word lines (WL) 28. For example, the dielectric spacer 606 may be disposed on the first word line (WL1) 28a and the second word line (WL2) 28b. For example, the dielectric spacer 606 may be formed of a silicon oxide material.

The plurality of word lines (WL) 28 may be capacitively coupled to the P− body region 122 via one or more layers. For example, the plurality of word lines (WL) 28 may be capacitively coupled to the P− body region 122 via an interfacial layer 610. For example, the interfacial layer 610 may be made from silicon oxide material (e.g., silicon dioxide ($SiO_2$) material). In other exemplary embodiments, the plurality of word lines (WL) 28 may be capacitively coupled to the P− body region 122 via a dielectric barrier layer 612. For example, the dielectric barrier layer 612 may be disposed above the interfacial layer 610. The dielectric barrier layer 612 may be formed of a silicon oxide material or a silicon nitride material. For example, the dielectric barrier layer 612 may be made by oxygen or N diffusion through atomic layer deposition (ALD).

Figure 7:
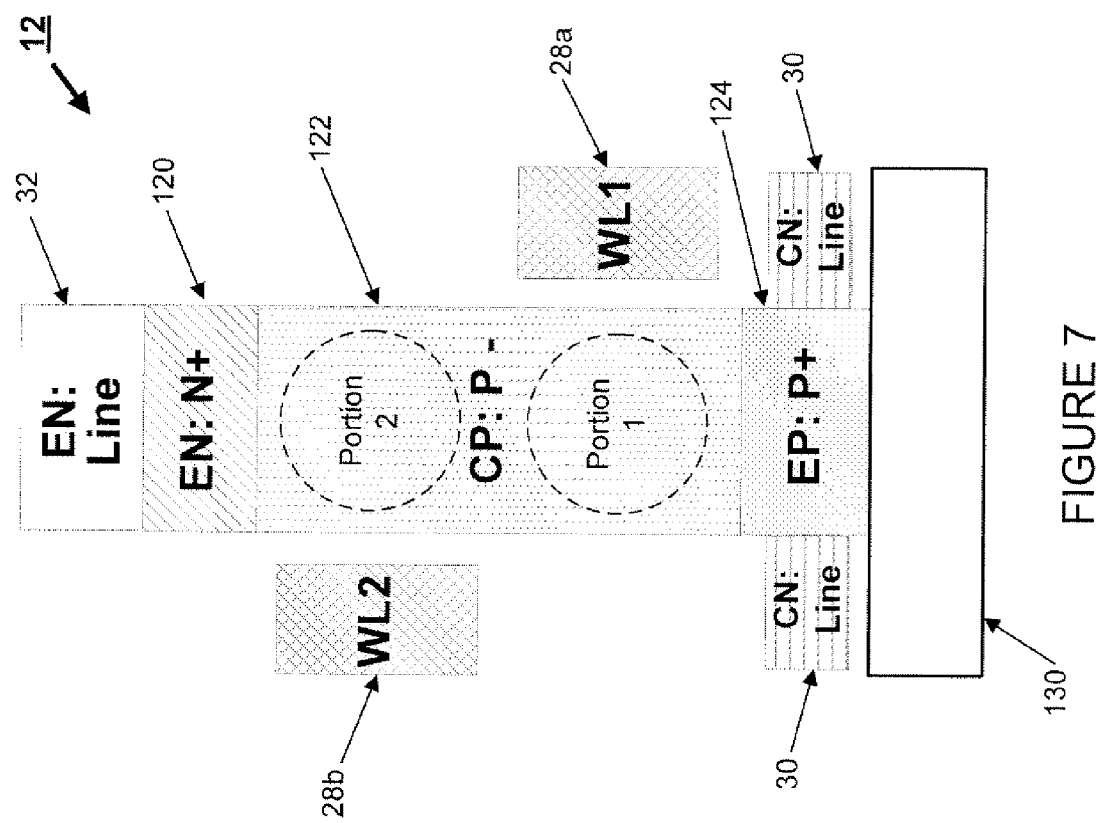
FIG. 7 shows a cross-sectional view of a vertical implementation of a memory cell of a memory cell array in accordance with an alternative embodiment of the present disclosure.

Referring to FIG. 7, there is shown a cross-sectional view of a vertical implementation of a memory cell 12 of the memory cell array 20 shown in FIG. 1 in accordance with an alternative embodiment of the present disclosure. In an exemplary embodiment, the memory cell 12 may be implemented in a vertical configuration. As discussed above, the memory cell 12 may comprise a P+ source region 120 coupled to a corresponding bit line (EN) 32, a P− body region 122 capacitively coupled to a plurality of corresponding word lines (WL) 28, and an N+ drain region 124 coupled to a corresponding source line (CN) 30. The P+ source region 120, the P− body region 122, and/or the N+ drain region 124 may be disposed in a sequential contiguous relationship, and may extend horizontally from a plane defined by a P− substrate 130. In an exemplary embodiment, the P− body region 122 may be an electrically floating body region of the memory cell 12 configured to accumulate/store charges, and may be spaced apart from and capacitively coupled to the plurality of word lines (WL) 28.

As shown in FIG. 7, the plurality of word lines (WL) 28 may be capacitively coupled the P− body region 122 in a fin configuration. The plurality of word lines (WL) 28 may be oriented in a row direction of the memory cell array 20 and coupled to a plurality of memory cells 12. The plurality of word lines (WL) 28 may include a first word line (WL1) 28a capacitively coupled to a first portion of the P– body region 122 and a second word line (WL2) 28b capacitively coupled to a second portion of the P– body region 122. The first portion and the second portion of the P– body region 122 may be different portions of the P– body region 122. The plurality of word lines (WL) 28 may be arranged on a plurality side portions of the memory cells 12 (e.g., memory cells 12 located on a row direction of the memory cell array 20). For example, a first word line (WL1) 28a of the plurality of word lines (WL) 28 may be arranged on a first side portion of the memory cell 12 and a second word line (WL2) 28b of the plurality of word lines (WL) 28 may be arranged on a second side portion of the memory cell 12. In an exemplary embodiment, the first side and the second side of the memory cells 12 may be different side portions of the memory cells 12 and opposite of each other.

Figure 8:
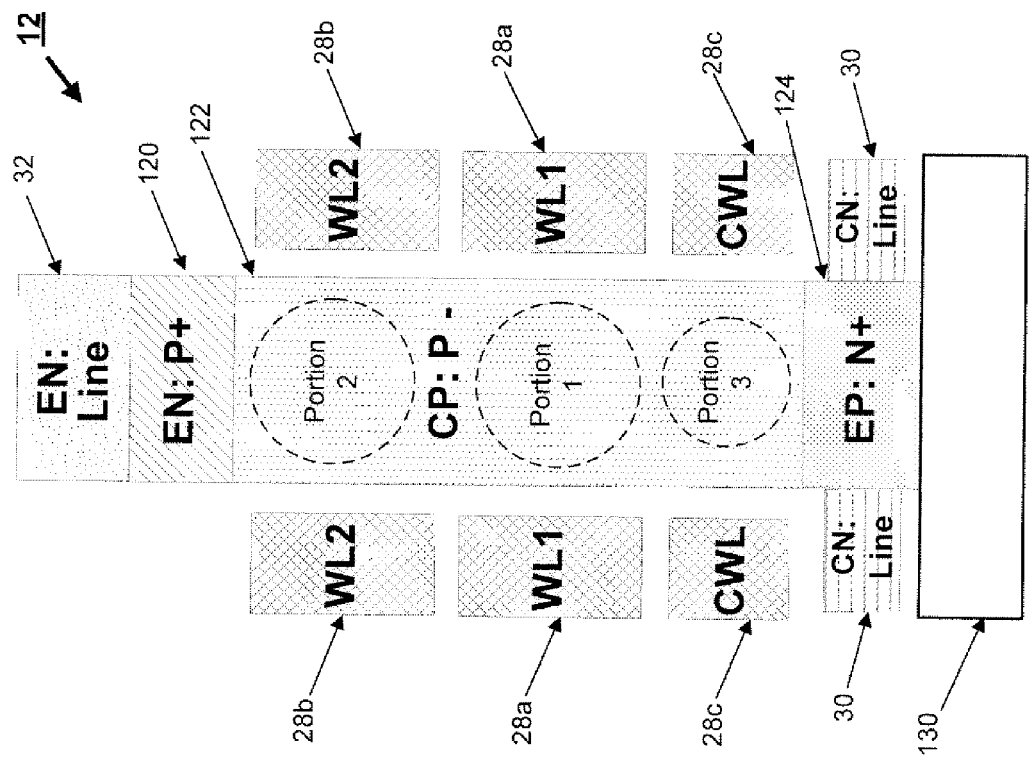
FIG. 8 shows a cross-sectional view of a vertical implementation of a memory cell of a memory cell array in accordance with another alternative embodiment of the present disclosure.

Referring to FIG. 8, there is shown a cross-sectional view of a vertical implementation of a memory cell 12 of the memory cell array 20 shown in FIG. 1 in accordance with another alternative embodiment of the present disclosure. In an exemplary embodiment, the memory cell 12 may be implemented in a vertical configuration. As discussed above, the memory cell 12 may comprise a P+ source region 120 coupled to a corresponding bit line (EN) 32, a P– body region 122 capacitively coupled to a plurality of corresponding word lines (WL) 28, and an drain region 124 coupled to a corresponding source line (CN) 30. The P+ source region 120, the P– body region 122, and/or the N+ drain region 124 may be disposed in a sequential contiguous relationship, and may extend horizontally from a plane defined by a P– substrate 130. In an exemplary embodiment, the P– body region 122 may be an electrically floating body region of the memory cell 12 configured to accumulate/store charges, and may be spaced apart from and capacitively coupled to the plurality of word lines (WL) 28.

As shown in FIG. 8, the plurality of word lines (WL) 28 may be capacitively coupled the P– body region 122 in a fin configuration. The plurality of word lines (WL) 28 may be oriented in a row direction of the memory cell array 20 and coupled to a plurality of memory cells 12. The plurality of word lines (WL) 28 may be arranged on a plurality side portions of the memory cells 12 (e.g., memory cells 12 located on a row direction of the memory cell array 20). For example, the plurality of word lines (WL) 28 may be arranged on at least two side portions of the memory cells 12. The plurality of word lines (WL) 28 may include a first word line (WL1) 28a capacitively coupled to a first portion of the P– body region 122, a second word line (WL2) 28b capacitively coupled to a second portion of the P– body region 122, and/or a control word line (CWL) 28c capacitively coupled to a third portion of the P– body region 122. The first portion, the second portion, and the third portion of the P– body region 122 may be different portions of the P– body region 122.

Figure 9:
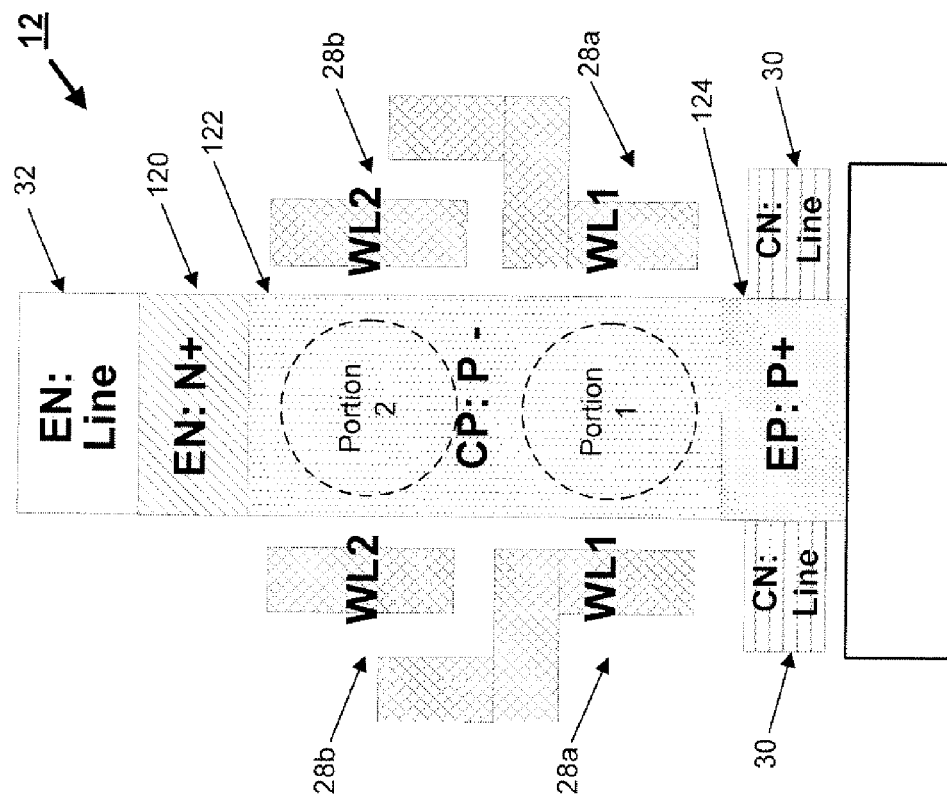
FIG. 9 shows a cross-sectional view of a vertical implementation of a memory cell of a memory cell array in accordance with another alternative embodiment of the present disclosure.

Referring to FIG. 9, there is shown a cross-sectional view of a vertical implementation of a memory cell 12 of the memory cell array 20 shown in FIG. 1 in accordance with another alternative embodiment of the present disclosure. In an exemplary embodiment, the memory cell 12 may be implemented in a vertical configuration. As discussed above, the memory cell 12 may comprise a P+ source region 120 coupled to a corresponding bit line (EN) 32, a P– body region 122 capacitively coupled to a plurality of corresponding word lines (WL) 28, and an N+ drain region 124 coupled to a corresponding source line (CN) 30. The P+ source region 120, the P– body region 122, and/or the N+ drain region 124 may be disposed in a sequential contiguous relationship, and may extend horizontally from a plane defined by a P– substrate 130. In an exemplary embodiment, the P– body region 122 may be an electrically floating body region of the memory cell 12 configured to accumulate/store charges, and may be spaced apart from and capacitively coupled to the plurality of word lines (WL) 28.

As shown in FIG. 9, the plurality of word lines (WL) 28 may be capacitively coupled the P– body region 122 in a fin configuration. The plurality of word lines (WL) 28 may be oriented in a row direction of the memory cell array 20 and coupled to a plurality of memory cells 12. The plurality of word lines (WL) 28 may be arranged on a plurality side portions of the memory cells 12 (e.g., memory cells 12 located on a row direction of the memory cell array 20). For example, the plurality of word lines (WL) 28 may be arranged on both side portions of the memory cells 12. The plurality of word lines (WL) 28 may include a first word line (WL1) 28a capacitively coupled to a first portion of the P– body region 122 and/or a second word line (WL2) 28b capacitively coupled to a second portion of the P– body region 122. The first portion and the second portion of the P– body region 122 may be different portions of the P– body region 122. At least a portion of each of the plurality of word lines (WL) 28 may overlap but separate from each other. In an exemplary embodiment, at least a portion of a first word line (WL1) 28a may extend above and overlapping at least a portion of a second word line (WL2) 28b. In another exemplary embodiment, at least a portion of a second word line (WL2) 28b may extend above, overlapping, and separated from at least a portion of a first word line (WL1) 28a.

Figure 9A:
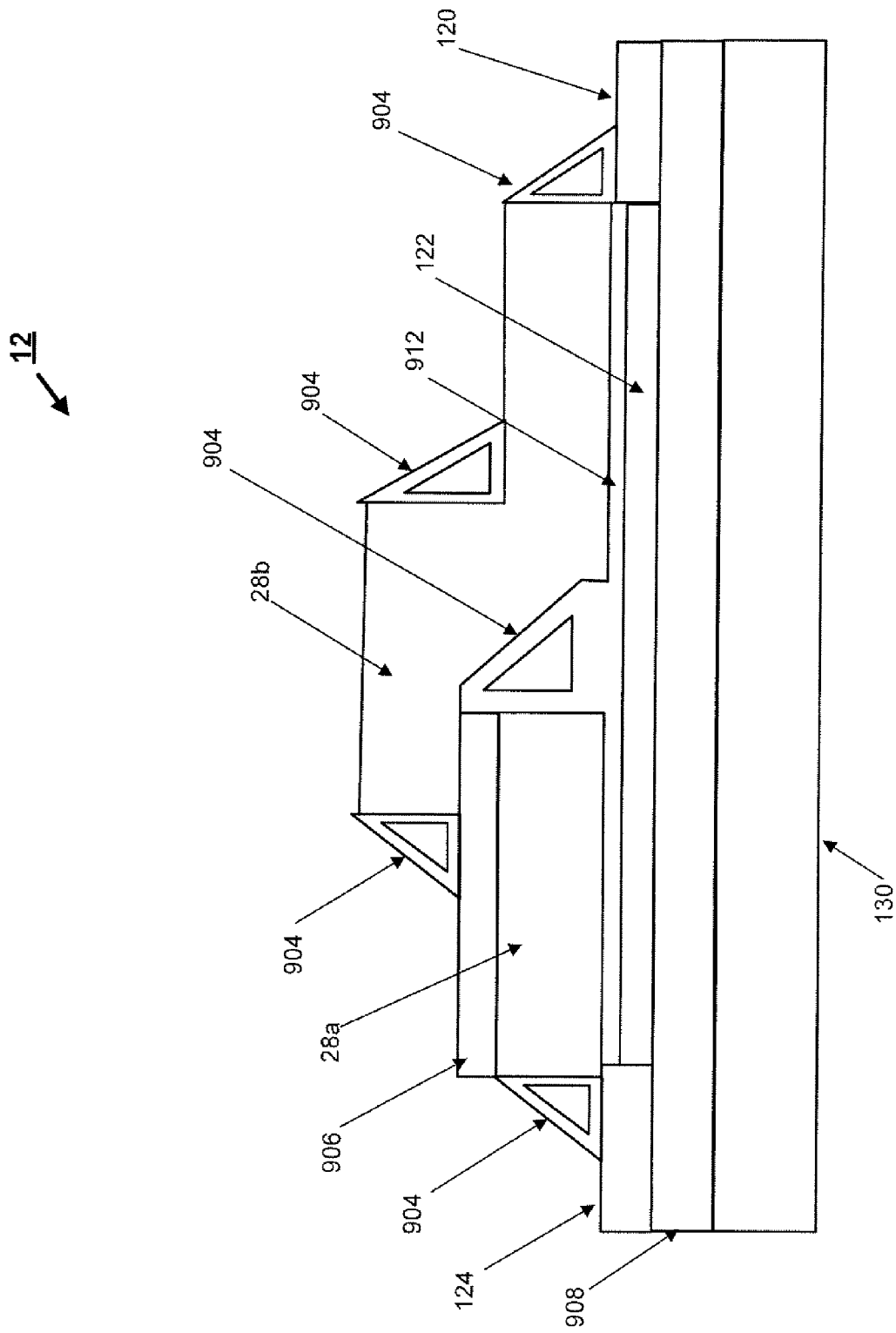
FIG. 9A shows a side cross-sectional view of a planar implementation of a memory cell of a memory cell array in accordance with another alternative embodiment of the present disclosure.

Referring to FIG. 9A, there is shown a side cross-sectional view of a planar implementation of a memory cell 12 of the memory cell array 20 shown in FIG. 1 in accordance with another alternative embodiment of the present disclosure. In an exemplary embodiment, the memory cell 12 may be implemented in a planar configuration. As discussed above, the memory cell 12 may comprise a P+ source region 120 coupled to a corresponding bit line (EN) 32, a P– body region 122 capacitively coupled to a plurality of corresponding word lines (WL) 28, and an N+ drain region 124 coupled to a corresponding source line (CN) 30. The P+ source region 120, the P– body region 122, and/or the N+ drain region 124 may be disposed in a sequential contiguous relationship, and may extend horizontally from a plane defined by a P– substrate 130. In an exemplary embodiment, the P– body region 122 may be an electrically floating body region of the memory cell 12 configured to accumulate/store charges, and may be spaced apart from and capacitively coupled to the plurality of word lines (WL) 28.

As shown in FIG. 9A, the plurality of word lines (WL) 28 may be capacitively coupled the P– body region 122 in a fin configuration. The plurality of word lines (WL) 28 may be oriented in a row direction of the memory cell array 20 and coupled to a plurality of memory cells 12. The plurality of word lines (WL) 28 may be arranged on a side portion of the memory cells 12 (e.g., memory cells 12 located on a row direction of the memory cell array 20). For example, the plurality of word lines (WL) 28 may be arranged on a top side portion of the memory cells 12. The plurality of word lines (WL) 28 may include a first word line (WL1) 28a capacitively coupled to a first portion of the P– body region 122 and/or a second word line (WL2) 28b capacitively coupled to a second portion of the P– body region 122. The first portion and the second portion of the P– body region 122 may be different portions of the P– body region 122.

At least a portion of each of the plurality of word lines (WL) 28 may overlap each other. In an exemplary embodiment, at least a portion of a first word line (WL1) 28a may extend above and overlapping at least a portion of a second word line (WL2) 28*b*. In another exemplary embodiment, at least a portion of a second word line (WL2) 28*b* may extend above, overlapping, and separated from at least a portion of a first word line (WL1) 28*a*. The first word line (WL1) 28*a* and the second word line (WL2) 28*b* may be separated from each other via a dielectric spacer 906. For example, the dielectric spacer 906 may be made of silicon oxide material, silicon nitride material, and/or other dielectric materials. For example, the dielectric spacer 606 may be disposed on top of the first word line (WL1) 28*a*. Also, an insulating spacer 904 may be arranged between the first word line (WL1) 28*a* and the second word line (WL2) 28*b*. The insulating spacer 604 may be made from a plurality of materials. In an exemplary embodiment, the insulating spacer 604 may be formed of a triangular silicon nitride material covered by a silicon oxide material. Also, a plurality of insulating spacers 904 may be configured at an end portion of the plurality of word lines (WL) 28. For example, the insulating spacer 904 may be configured at an end portion adjacent to the first word line (WL1) 28*a* and at an end portion adjacent to the second word line (WL2) 28*b*.

Also, a buried oxide 908 made of dielectric or insulating material may be disposed on top of the P− substrate 130. The buried oxide layer 908 may be made of dielectric or insulating material disposed on top of the P− substrate 130. For example, the buried oxide layer 908 may have a thickness in a range of 5 nm to 200 nm. In an exemplary embodiment, the buried oxide layer 908 may have a thickness range from 10 nm to 100 nm. A dielectric barrier layer 912 may be disposed above the P− body region 122 to capacitively couple the plurality of word lines (WL) 28 to the P− body region 122. For example, the dielectric barrier layer 912 may be formed of a silicon oxide material or a silicon nitride material. For example, the dielectric barrier layer 912 may be made by oxygen or N diffusion through atomic layer deposition (ALD).

Figure 10:
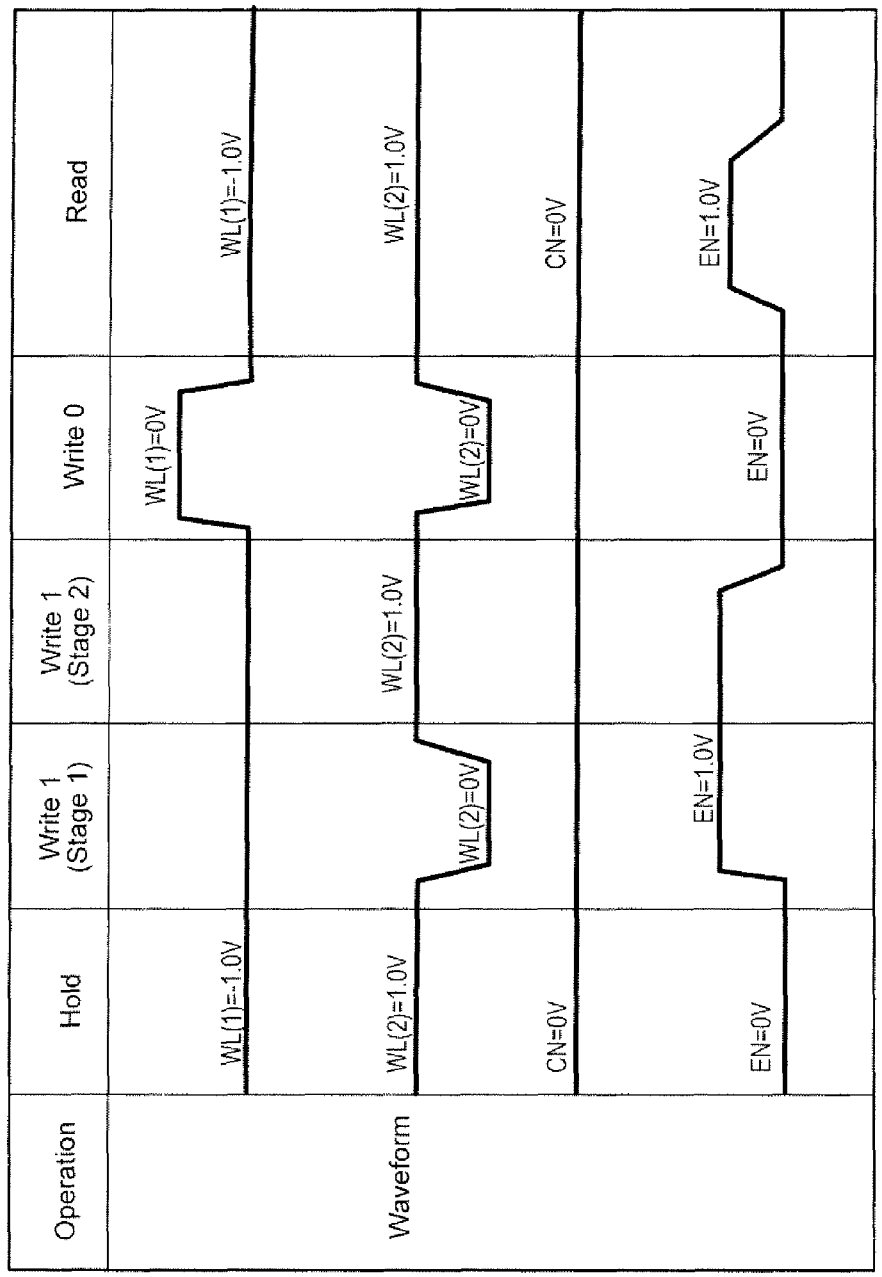
FIG. 10 shows control signal voltage waveforms for performing various operations on a memory cell in accordance with an embodiment of the present disclosure.

Referring to FIG. 10, there are shown control signal voltage waveforms for performing various operations on a memory cell 12 in accordance with an embodiment of the present disclosure. For example, control signals may be applied to the memory cell 12 via a plurality of corresponding word lines (WL) 28, a corresponding source line (CN) 30, and/or a corresponding bit line (EN) 32 to perform various operations. The control signals may be configured to perform a hold operation, a read operation, a write logic high (e.g., binary "1" data state) operation, and/or a write logic low (e.g., binary "0" data state) operation. As illustrated in FIG. 10, a constant voltage potential may be applied to the N+ drain region 124 via the source line (CN) 30. In an exemplary embodiment, the N+ drain region 124 may be coupled to a constant voltage source via the source line (CN) 30. In another exemplary embodiment, the N+ drain region 124 may be coupled to a ground or a zero voltage potential via the source line (CN) 30.

For example, during a hold operation a data state (e.g., a logic high (binary "1" data state) or a logic low (e.g., binary "0" data state)) stored in the memory cell 12 may be maintained. In particular, the control signals may be configured to perform a hold operation in order to maximize a retention time of a data state (e.g., a logic low (binary "0" data state) and/or a logic high (e.g., binary "1" data state)) stored in the memory cell 12. Also, the control signals for the hold operation may be configured to eliminate or reduce activities or fields (e.g., electrical fields between junctions which may lead to leakage of charges) within the memory cell 12.

For example, different voltage potentials may be applied to different regions of the memory cells 12 during a hold operation. In an exemplary embodiment, the voltage potential applied to the P+ source region 120 via the bit line (EN) 32 and the voltage potential applied to N+ drain region 124 via the source line (CN) 30 may be 0V. In another exemplary embodiment, during a hold operation, a negative voltage potential may be applied to the first word line (WL1) 28*a* that may be capacitively coupled to a first portion of the P− body region 122, while a positive voltage potential may be applied to the second word line (WL2) 28*b* that may be capacitively coupled to a second portion of the P− body region 122. For example, the negative voltage potential applied to the first word line (WL1) 28*a* (e.g., capacitively coupled to the first portion of the P− body region 122 of the memory cell 12) may be −1.0V. The positive voltage potential applied to the second word line (WL2) 28*b* (e.g., capacitively coupled to the second portion of the P− body region 122 of the memory cell 12) may be 1.0V. During the hold operation, the junction between the P+ source region 120 and the second portion (e.g., capacitively coupled to the second word line (WL2) 28*b*) of the P− body region 122 and the junction between the N+ drain region 124 and the first portion (e.g., capacitively coupled to the first word line (WL1) 28*a*) of the P− body region 122 may be reverse biased in order to retain a data state (e.g., a logic high (binary "1" data state) or a logic low (binary "0" data state)) stored ira the memory cell 12.

In an exemplary embodiment, control signals may be configured to write a logic high (e.g., binary "1" data state) to one or more selected memory cells 12 of one or more selected rows of the memory cell array 20. For example, the write logic high (e.g., binary "1" data state) operation may be performed on one or more selected rows of the memory cell array 20 or the entire memory cell array 20 and a subsequent write logic low (e.g., binary "0" data state) operation may be performed on one or more selected memory cells 12. In another exemplary embodiment, a write logic high (e.g., binary "1" data state) operation may be performed in two stages, wherein each stage of the write logic high (e.g., binary "1" data state) operation may comprise different control signals. For example, during a first stage of a write logic high (e.g., binary "1" data state) operation, control signals may be configured to lower a voltage potential barrier for a flow of charge carriers. During a second stage of a write logic high (e.g., binary "1" data state) operation, control signals may be configured to cause accumulation/storage of charge carriers in the P− body region 122.

In an exemplary embodiment, during the first stage of a write logic high (e.g., binary "1" data state) operation, a voltage potential applied to the N+ drain region 124 of the memory cell 12 via the source line (CN) 30 and a voltage potential applied to first word line (WL1) 28*a* that may be capacitively coupled to the first portion of the P− body region 122 of the memory cells 12 may be maintained at the same voltage potential as the voltage potential during the hold operation. For example, during the first stage of a write logic high (e.g., binary "1" data state) operation, a voltage potential applied to the N+ drain region 124 may be maintained at 0V and a voltage potential applied to the first word line (WL1) 28*a* that may be capacitively coupled to the first portion of the P− body region 122 may be maintained at −1.0V.

In another exemplary embodiment, during the first stage of a write logic high (e.g., binary "1" data state) operation, a voltage potential applied to the P+ source region 120 via the bit line (EN) 32 and a voltage potential applied to the second word line (WL2) 28*b* that may be capacitively coupled to the second portion of the P− body region 122 may be varied. For example, during the first stage of a write logic high (e.g., binary "1" data state) operation, a voltage potential applied to the P+ source region 120 via the bit line (EN) 32 may be raised to 1.0V from 0V and a voltage potential applied to the second word line (WL2) 28b that may be capacitively coupled to the second portion of the P− body region 122 may be lowered to 0V from 1.0V.

Under such biasing, the junction between the P+ source region 120 and the second portion (e.g., capacitively coupled to the second word line (WL2) 28b) of the P− body region 122 may be forward biased. A predetermined amount of charge carriers may flow from the P+ source region 120 to the first portion (e.g., capacitively coupled to the first word line (WL1) 28a) of the P− body region 122. For example, a predetermined amount of holes may flow from the P+ source region 120 to the first portion (e.g., capacitively coupled to the first word line (WL1) 28a) of the P− body region 122. As more charge carriers are accumulated/stored in the first portion (e.g., capacitively coupled to the first word line (WL1) 28a) of the P− body region 122, a voltage potential at the first portion (e.g., capacitively coupled to the first word line (WL1) 28a) of the P− body region 122 may increase. The increase of the voltage potential at the first portion (e.g., capacitively coupled to the first word line (WL1) 28a) of the P− body region 122 may lead to a decrease of voltage potential barrier of electron flow from the N+ drain region 124 to the second portion (e.g., capacitively coupled to the second word line (WL2) 28b) of the P− body region 122.

In an exemplary embodiment, during the second stage of a write logic high (e.g., binary "1" data state) operation, a voltage potential applied to the N+ drain region 124 of the memory cell 12 via the source line (CN) 30, a voltage potential applied to first word line (WL1) 28a that may be capacitively coupled to the first portion of the P− body region 122, and/or a voltage potential applied to the P+ source region 120 of the memory cell 12 via the bit line (EN) 32 may be maintained at the same voltage potential as the voltage potential during the first stage of the write logic high (e.g., binary "1" data state) operation. For example, during the second stage of a write logic high (e.g., binary "1" data state) operation, a voltage potential applied to the N+ drain region 124 may be maintained at 0V, a voltage potential applied to the first word line (WL1) 28a that may be capacitively coupled to the first portion of the P− body region 122 may be maintained at −1.0V, and a voltage potential applied to the P+ source region 120 may be maintained at 1.0V.

In another exemplary embodiment, during the second stage of a write logic high (e.g., binary "1" data state) operation, a voltage potential applied to the second word line (WL2) 28b that may be capacitively coupled to the second portion of the P− body region 122 may be varied. For example, during second stage of a write logic high (e.g., binary "1" data state) operation, a voltage potential applied to the second word line (WL2) 28b that may be capacitively coupled to the second portion of the P− body region 122 may be raised to 1.0V from 0V.

Under such biasing, the junction between the P+ source region 120 and the second portion (e.g., capacitively coupled to the second word line (WL2) 28b) of the P− body region 122 may be forward biased. The voltage potential applied to the second portion (e.g., capacitively coupled to the second word line (WL2) 28b) of the P− body region 122 may overcome a voltage potential barrier of a flow of charge carriers, In an exemplary embodiment, a positive voltage potential applied to the second portion (e.g., capacitively coupled to the second word line (WL2) 28b) of the P− body region 122 may overcome an electron voltage potential barrier at the first portion (e.g., capacitively coupled to the first word line (WL1) 28a) of the P− body region 122 to allow electrons flow from the N+ drain region 124 to the second portion (e.g., capacitively coupled to the second word line (WL2) 28b) of the P− body region 122.

The flow of electrons from the N+ drain region 124 to the second portion (e.g., capacitively coupled to the second word line (WL2) 28b) of the P− body region 122 may induce a greater flow of holes from the P+ source region 120 to the first portion (e.g., capacitively coupled to the first word line (WL1) 28a) of the P− body region 122. The greater flow of holes from the P+ source region 120 may cause an even greater flow of electrons from the N+ drain region 124 to the second portion (e.g., capacitively coupled to the second word line (WL2) 28b) of the P− body region 122 and thus may form a positive feedback. A predetermined amount of charge carriers may be accumulated/stored at the first portion (e.g., capacitively coupled to the first word line (WL1) 28a) of the P− body region 122 and the second portion (e.g., capacitively coupled to the second word line (WL2) 28b) of the P− body region 122. In an exemplary embodiment, a predetermined amount of holes may be accumulated/stored at the first portion (e.g., capacitively coupled to the first word line (WL1) 28a) of the P− body region 122 and a predetermined amount of electrons may be accumulated/stored at the second portion (e.g., capacitively coupled to the second word line (WL2) 28b) of the P− body region 122. The predetermined amount of charge carriers accumulated/stored in the first portion (e.g., capacitively coupled to first word line (WL1) 28a) of the P− body region 122 and the second portion (e.g., capacitively coupled to the second word line (WL2) 28b) of the P− body region 122 may represent that a logic high (e.g., binary "1" data state) may be written in the memory cell 12.

In an exemplary embodiment, control signals may be configured to perform one or more write logic low (e.g., binary "0" data state) operations to one or more selected memory cells 12. For example, the write logic low (e.g., binary "0" data state) operation may be performed to one or more selected memory cells 12 after a write logic high (e.g., binary "1" data state) operation in order to deplete charge carriers that may have accumulated/stored in the P− body regions 122 of the one or more selected memory cells 12. For example, the same voltage potentials may be applied to the various regions of the memory cell 12. In an exemplary embodiment, a voltage potential applied to the P+ source region 120 via a corresponding bit line (EN) 32, a voltage potential applied to a first word line (WL1) 28a that may be capacitively coupled to a first portion of the P− body region 122, a voltage potential applied to a second word line (WL2) 28b that may be capacitively coupled to a second portion of the P− body region 122, and/or a voltage potential applied to the N+ drain region 124 may be 0V.

Under such biasing, the various regions of the memory cell (e.g., the P+ source region 120, the P− body region 122, and/or the N+ drain region 124) may become a single electrical region and the charge carriers that may have accumulated/stored in the P− body region 122 during the write logic high (e.g., binary "1" data state) operation may be removed via the P+ source region 120 and/or the N+ drain region 124. By removing the charge carriers that may have accumulated/ stored in the P− body region 122, a logic low (e.g., binary "0" data state) may be written to the memory cell 12.

In an exemplary embodiment, control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (EN) 32. In an exemplary embodiment, a voltage potential applied to the N+ drain region 124 via the source line (CN) 30 may be maintained at 0V, a voltage potential applied to the first word line (WL1) 28a that may be capacitively coupled to the first portion of the P− body region 122 may be −1.0V, a voltage potential applied to the second word line (WL2) 28b that may be capacitively coupled to the second portion of the P− body region 122 may be 1.0V, and/or a voltage potential applied to the P+ source region 120 via the bit line (EN) 32 may be 1.0V.

Under such biasing, when a logic high (e.g., binary "1" data state) is stored in the memory cell 12, the predetermined amount of charge carriers accumulated/stored in the P− body region 122 may lower a voltage potential barrier of a flow of charge carriers and the junction between the P− body region 122 and the P+ source region 120 may become forward biased during an active read operation. A voltage potential or current may be generated (e.g., compared to a reference voltage potential or current) when forward biasing the junction between the P− body region 122 and the P+ source region 120. The voltage potential or current generated may be output to a data sense amplifier via the bit line (EN) 32 coupled to the P+ source region 120. An amount of voltage potential or current generated may be representative of a data state (e.g., a logic low (binary "0" data state) and/or a logic high (binary "1" data state)) stored in the memory cell 12.

In an exemplary embodiment, when a logic low (e.g., binary data state) is stored in the memory cell 12, the predetermined amount of charge carriers accumulated/stored in the P− body region 122 may not lower a voltage potential barrier of a flow of charge carriers and the junction between the P− body region 122 and the P+ source region 120 may remain reverse biased or become weakly forward biased (e.g., above a reverse bias voltage and below a forward bias threshold voltage potential). A small amount of voltage potential and current or no voltage potential and current (e.g., compared to a reference voltage potential or current) may be generated when the junction between the P− body region 122 and the P+ source region 120 is reverse biased or weakly forward biased. A data sense amplifier in the data write and sense circuitry 36 may detect the small amount of voltage potential or current (e.g., compared to a reference voltage potential or current) or no voltage potential or current via the bit line (EN) 32 coupled to the P+ source region 120.

Figure 11:
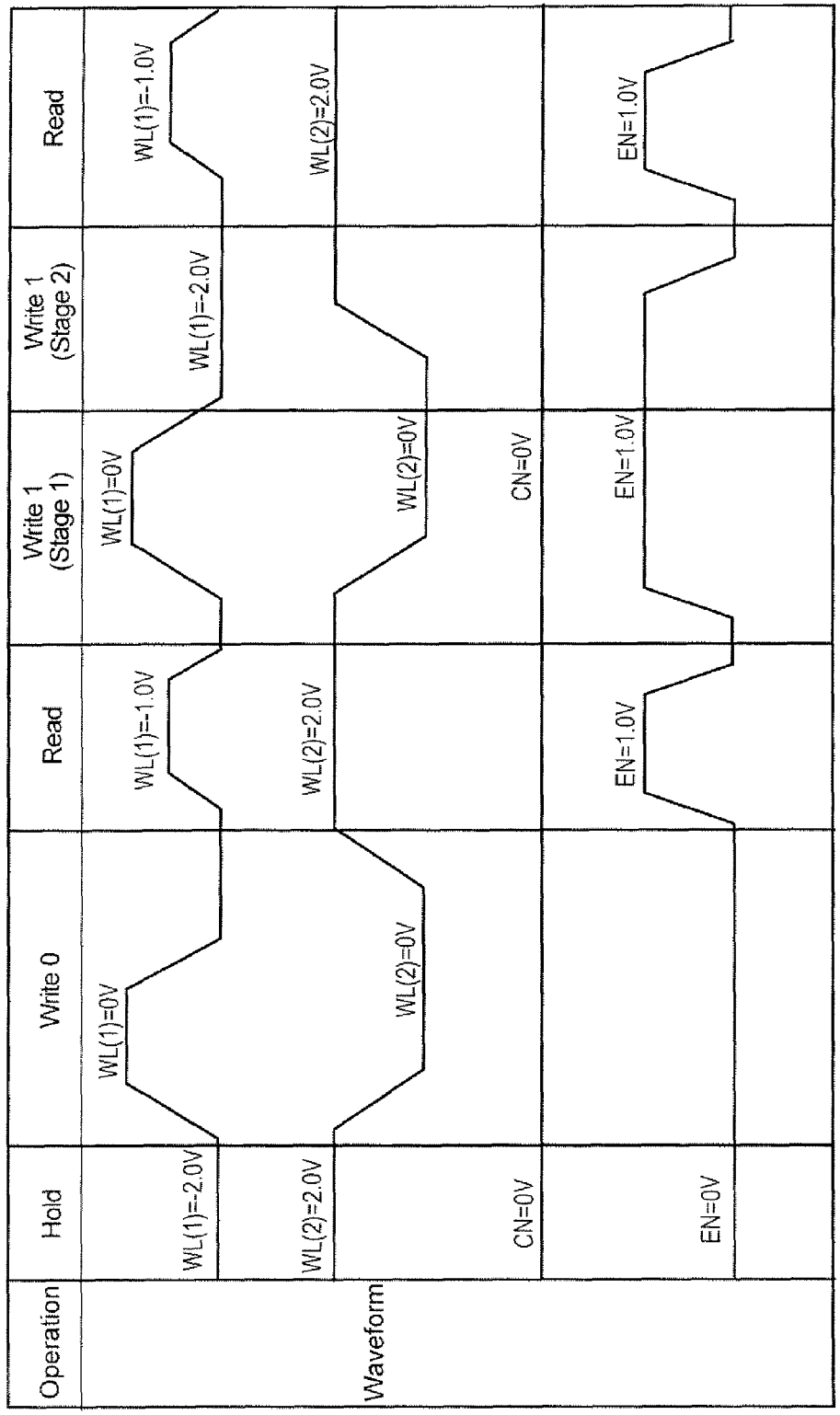
FIG. 11 shows control signal voltage waveforms for performing various operations on a memory cell in accordance with an alternative embodiment of the present disclosure.

Referring to FIG. 11, there are shown control signal voltage waveforms for performing various operations on a memory cell 12 in accordance with an embodiment of the present disclosure. For example, control signals may be applied to the memory cell 12 via a plurality of corresponding word lines (WL) 28, a corresponding source line (CN) 30, and/or a corresponding bit line (EN) 32 to perform various operations. The control signals may be configured to perform a hold operation, a read operation, a write logic high (e.g., binary "1" data state) operation, and/or a write logic low (e.g., binary "0" data state) operation. As illustrated in FIG. 11, a constant voltage potential may be applied to the N+ drain region 124 via the source line (CN) 30. In an exemplary embodiment, the N+ drain region 124 may be coupled to a ground or a zero voltage potential via the source line (CN) 30. In another exemplary embodiment, the N+ drain region 124 may be coupled to a constant voltage potential via the source line (CN) 30.

For example, during a hold operation a data state (e.g., a logic high (binary "1" data state) or a logic low (e.g., binary "0" data state)) stored in the memory cell 12 may be maintained. In particular, the control signals may be configured to perform a hold operation in order to maximize a retention time of a data state (e.g., a logic low (binary "0" data state) and/or a logic high (e.g., binary "1" data state)) stored in the memory cell 12. Also, the control signals for the hold operation may be configured to eliminate or reduce activities or fields (e.g., electrical fields between junctions which may lead to leakage of charges) within the memory cell 12.

For example, different voltage potentials may be applied to different regions of the memory cells 12 during a hold operation. In an exemplary embodiment, the voltage potential applied to the P+ source region 120 via the bit line (EN) 32 and the voltage potential applied to N+ drain region 124 via the source line (CN) 30 may be 0V. In another exemplary embodiment, during a hold operation, a negative voltage potential may be applied to the first word line (WL1) 28a that may be capacitively coupled to a first portion of the P− body region 122, while a positive voltage potential may be applied to the second word line (WL2) 28b that may be capacitively coupled to a second portion of the P− body region 122. For example, the negative voltage potential applied to the first word line (WL1) 28a (e.g., capacitively coupled to the first portion of the P− body region 122 of the memory cell 12) may be −2.0V. The positive voltage potential applied to the second word line (WL2) 28b (e.g., capacitively coupled to the second portion of the P− body region 122 of the memory cell 12) may be 2.0V. During the hold operation, the junction between the P+ source region 120 and the second portion (e.g., capacitively coupled to the second word line (WL2) 28b) of the P− body region 122 and the junction between the N+ drain region 124 and the first portion (e.g., capacitively coupled to the first word line (WL1) 28a) of the P− body region 122 may be reverse biased in order to retain a data state (e.g., a logic high (binary "1" data state) or a logic low (binary "0" data state)) stored in the memory cell 12.

In an exemplary embodiment, control signals may be configured to perform one or more write logic low (e.g., binary "0" data state) operations to one or more selected memory cells 12. For example, the write logic low (e.g., binary "0" data state) operation may be performed to deplete charge carriers that may have accumulated/stored in the P− body regions 122 of the one or more selected memory cells 12. For example, the same voltage potentials may be applied to the various regions of the memory cell 12. In an exemplary embodiment, a voltage potential applied to the P+ source region 120 via a corresponding bit line (EN) 32, a voltage potential applied to a first word line (WL1) 28a that may be capacitively coupled to a first portion of the P− body region 122, a voltage potential applied to a second word line (WL2) 28b that may be capacitively coupled to a second portion of the P− body region 122, and/or a voltage potential applied to the N+ drain region 124 may be 0V.

Under such biasing, the various regions of the memory cell (e.g., the P+ source region 120, the P− body region 122, and/or the N+ drain region 124) may become a single electrical region and the charge carriers that may have accumulated/stored in the P− body region 122 may be removed via the P+ source region 120 and/or the N+ drain region 124. By removing the charge carriers that may have accumulated/stored in the P− body region 122, a logic low (e.g., binary "0" data state) may be written to the memory cell 12.

In an exemplary embodiment, control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (EN) 32. In an exemplary embodiment, a voltage potential applied to the N+ drain region 124 via the source line (CN) 30 may be maintained at 0V, a voltage potential applied to the first word line (WL1) 28a that may be capacitively coupled to the first portion of the P− body region 122 may be −1.0V (e.g., approximately −0.5V to −1.75V), a voltage potential applied to the second word line (WL2) 28b that is capacitively coupled to the second portion of the P− body region 122 may be 2.0V, and/or a voltage potential applied to the P+ source region 120 via the bit line (EN) 32 may be 1.0V (e.g., approximately 1.0V-1.5V).

Under such biasing, when a logic low (e.g., binary "0" data state) is stored in the memory cell 12, the predetermined amount of charge carriers accumulated/stored in the P− body region 122 may not lower a voltage potential barrier of a flow of charge carriers and the junction between the P− body region 122 and the P+ source region 120 may remain reverse biased or become weakly forward biased (e.g., above a reverse bias voltage and below a forward bias threshold voltage potential). A small amount of voltage potential and current or no voltage potential and current (e.g., compared to a reference voltage potential or current) may be generated when the junction between the P− body region 122 and the P+ source region 120 is reverse biased or weakly forward biased. A data sense amplifier in the data write and sense circuitry 36 may detect the small amount of voltage potential or current (e.g., compared to a reference voltage potential or current) or no voltage potential or current via the bit line (EN) 32 coupled to the P+ source region 120.

In an exemplary embodiment, control signals may be configured to write a logic high (e.g., binary "1" data state) to one or more selected memory cells 12 of one or more selected rows of the memory cell array 20. For example, the write logic high (e.g., binary "1" data state) operation may be performed in two stages, wherein each stage of the write logic high (e.g., binary "1" data state) operation may comprise different control signals. For example, during a first stage of a write logic high (e.g., binary "1" data state) operation, control signals may be configured to lower a voltage potential barrier for a flow of charge carriers. During a second stage of a write logic high (e.g., binary "1" data state) operation, control signals may be configured to cause accumulation/storage of charge carriers in the P− body region 122.

In an exemplary embodiment, during the first stage of a write logic high (e.g., binary "1" data state) operation, a voltage potential applied to the N+ drain region 124 of the memory cell 12 via the source line (CN) 30 may be maintained at 0V. In another exemplary embodiment, the same voltage potential may be applied to the first word line (WL1) 28a that may be capacitively coupled to the first portion of the P− body region 122 and the second word line (WL2) 28b that may be capacitively coupled to the second portion of the P− body region 122. For example, a voltage potential applied to the first word line (WL1) 28a that may be capacitively coupled to the first portion of the P− body region 122 may be 0V (e.g., approximately 0V to 1.0V) and a voltage potential applied to the second word line (WL2) 28b that may be capacitively coupled to the second portion of the P− body region 122 may be 0V (e.g., approximately 0V to 1.0V). In other exemplary embodiments, during the first stage of a write logic high (e.g., binary "1" data state) operation, a voltage potential applied to the P+ source region 120 via the bit line (EN) 32 may be raised to 1.0V (e.g., approximately 1V to 1.5V).

Under such biasing, the junction between the P+ source region 120 and the second portion (e.g., capacitively coupled to the second word line (WL2) 28b) of the P− body region 122 may be forward biased. Also, the junction between the N+ drain region 124 and the first portion (e.g., capacitively coupled to the first word line (WL1) 28a) of the P− body region 122 may be forward biased. A predetermined amount of charge carriers may flow from the P+ source region 120 to the N+ drain region 124 via the first portion (e.g., capacitively coupled to the first word line (WL1) 28a) of the P− body region 122 and the second portion (e.g., capacitively coupled to the second word line (WL2) 28b) of the P− body region 122. For example, a predetermined amount of holes may flow from the P+ source region 120 to the N+ drain region 124 via the first portion (e.g., capacitively coupled to the first word line (WL1) 28a) of the P− body region 122 and the second portion (e.g., capacitively coupled to the second word line (WL2) 28b) of the P− body region 122.

For example, during the second stage of a write logic high (e.g., binary "1" data state) operation, a voltage potential applied to the N+ drain region 124 of the memory cell 12 via the source line (CN) 30 and a voltage potential applied to the P+ source region 120 of the memory cell 12 via the bit line (EN) 32 may be maintained at the same voltage potential as the voltage potential applied during the first stage of the write logic high (e.g., binary "1" data state) operation. For example, during the second stage of a write logic high (e.g., binary "1" data state) operation, a voltage potential applied to the N+ drain region 124 may be maintained at 0V and a voltage potential applied to the P+ source region 120 may be maintained at 1.0V.

In another exemplary embodiment, during the second stage of a write logic high (e.g., binary "1" data state) operation, a voltage potential applied to the first word line (WL1) 28a that may be capacitively coupled to the first portion of the P− body region 122 and a voltage potential applied to the second word line (WL2) 28b that may be capacitively coupled to the second portion of the P− body region 122 may be varied. For example, during second stage of a write logic high (e.g., binary "1" data state) operation, a voltage potential applied to the first word line (WL1) 28a that may be capacitively coupled to the first portion of the P− body region 122 may be lowered to −2.0V from 0V. Simultaneously to or subsequent of lowering of the voltage potential applied to the first word line (WL1) 28a that may be capacitively coupled to the first portion of the P− body region 122, a voltage potential applied to the second word line (WL2) 28b that may be capacitively coupled to the second portion of the P− body region 122 may be raised to 2.0V from 0V.

Under such biasing, the junction between the N+ drain region 124 and the first portion (e.g., capacitively coupled to the first word line (WL1) 28a) of the P− body region 122 may be forward biased. A predetermined amount of charge carriers may be accumulated/stored at the first portion (e.g., capacitively coupled to the first word line (WL1) 28a) of the P− body region 122. For example, a predetermined amount of holes may be accumulated/stored at the first portion (e.g., capacitively coupled to the first word line (WL1) 28a) of the P− body region 122. Simultaneously to or subsequent of charge carriers (e.g., holes) accumulated/stored at the first portion (e.g., capacitively coupled to the first word line (WL1) 28a) of the P− body region 122, the junction between the P+ source region 120 and the second portion (e.g., capacitively coupled to the second word line (WL2) 28b) of the P− body region 122 may become forward biased. A predetermined amount of charge carriers may be accumulated/stored at the second portion (e.g., capacitively coupled to the second word line (WL2) 28b) of the P− body region 122. For example, a predetermined amount of electrons may be accumulated/stored at the second portion (e.g., capacitively coupled to the second word line (WL2) 28b) of the P− body region 122. The predetermined amount of charge carriers accumulated/stored in the first portion (e.g., capacitively coupled to first word line (WL1) 28a) of the P− body region 122 and the second portion (e.g., capacitively coupled to the second word line (WL2) 28b) of the P− body region 122 may represent that a logic high (e.g., binary "1" data state) may be written in the memory cell 12.

As discussed above, control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (EN) 32. In an exemplary embodiment, a voltage potential applied to the N+ drain region 124 via the source line (CN) 30 may be maintained at 0V, a voltage potential applied to the first word line (WL1) 28a that may be capacitively coupled to the first portion of the P− body region 122 may be −1.0V (e.g., approximately −0.5V to −1.75V), a voltage potential applied to the second word line (WL2) 28b that may be capacitively coupled to the second portion of the P− body region 122 may be 2.0V, and/or a voltage potential applied to the P+ source region 120 via the bit line (EN) 32 may be 1.0V (e.g., approximately 1.0V-1.5V).

Under such biasing, when a logic high (e.g., binary "1" data state) is stored in the memory cell 12, the predetermined amount of charge carriers accumulated/stored in the P− body region 122 may lower a voltage potential barrier of a flow of charge carriers and the junction between the P− body region 122 and the P+ source region 120 may become forward biased. A voltage potential or current may be generated (e.g., compared to a reference voltage potential or current) when forward biasing the junction between the P− body region 122 and the P+ source region 120. The voltage potential or current generated may be output to a data sense amplifier via the bit line (EN) 32 coupled to the P+ source region 120. An amount of voltage potential or current generated may be representative of a data state (e.g., a logic low (binary "0" data state) and/or a logic high (binary "1" data state)) stored in the memory cell 12.

Figure 12:
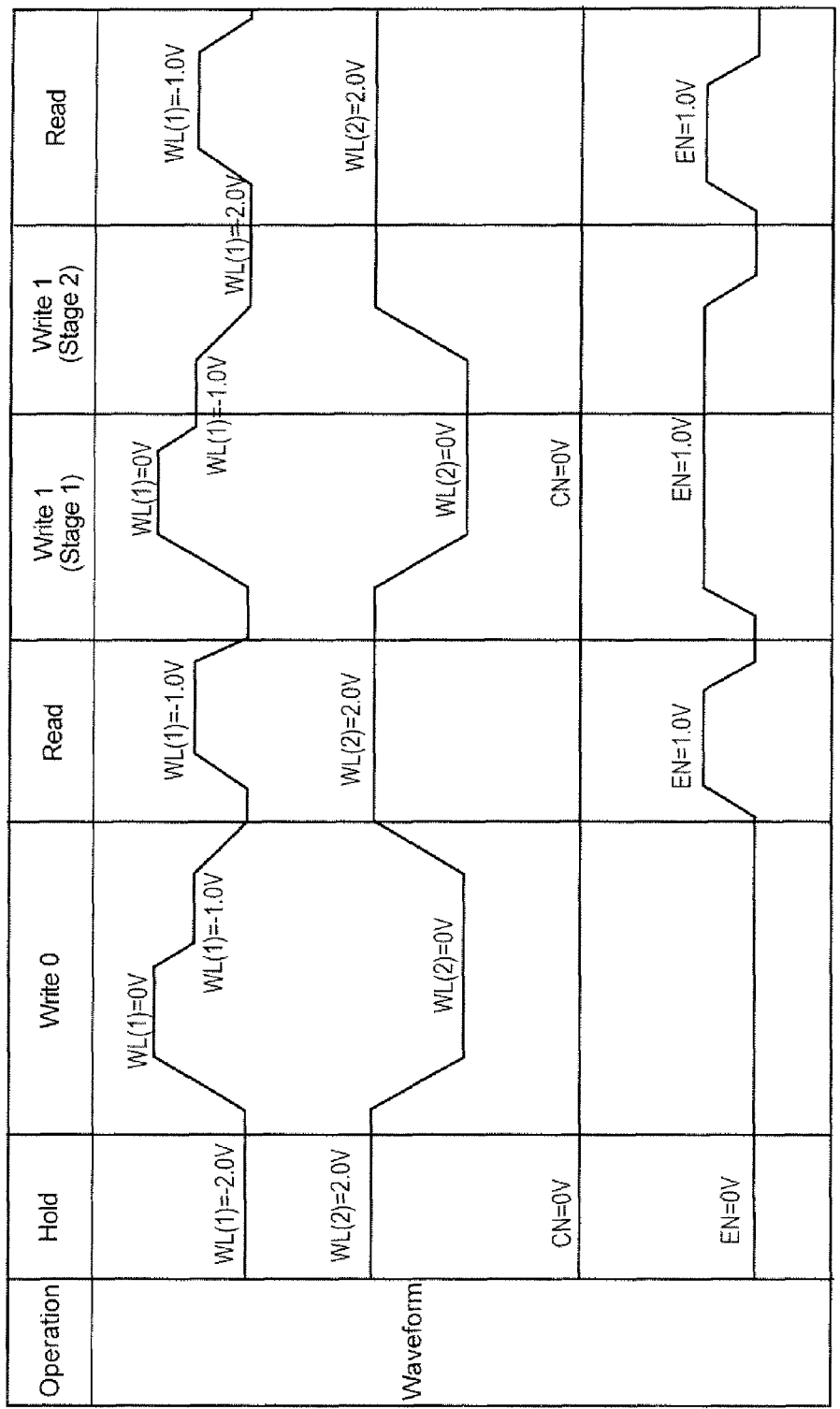
FIG. 12 shows control signal voltage waveforms for performing various operations on a memory cell in accordance with another alternative embodiment of the present disclosure.

Referring to FIG. 12, there are shown control signal voltage waveforms for performing various operations on a memory cell 12 in accordance with another alternative embodiment of the present disclosure. For example, control signals may be applied to the memory cell 12 via a plurality of corresponding word lines (WL) 28, a corresponding source line (CN) 30, and/or a corresponding bit line (EN) 32 to perform various operations. The control signals may be configured to perform a hold operation, a read operation, a write logic high (e.g., binary "1" data state) operation, and/or a write logic low (e.g., binary "0" data state) operation. As illustrated in FIG. 12, a constant voltage potential may be applied to the N+ drain region 124 via the source line (CN) 30. In an exemplary embodiment, the N+ drain region 124 may be coupled to a ground or a zero voltage potential via the source line (CN) 30. In another exemplary embodiment, the N+ drain region 124 may be coupled to a constant voltage potential via the source line (CN) 30.

For example, during a hold operation a data state (e.g., a logic high (binary "1" data state) or a logic low (e.g., binary "0" data state)) stored in the memory cell 12 may be maintained. In particular, the control signals may be configured to perform a hold operation in order to maximize a retention time of a data state (e.g., a logic low (binary "0" data state) and/or a logic high (e.g., binary "1" data state)) stored in the memory cell 12. Also, the control signals for the hold operation may be configured to eliminate or reduce activities or fields (e.g., electrical fields between junctions which may lead to leakage of charges) within the memory cell 12.

For example, different voltage potentials may be applied to different regions of the memory cells 12 during a hold operation. In an exemplary embodiment, the voltage potential applied to the P+ source region 120 via the bit line (EN) 32 and the voltage potential applied to N+ drain region 124 via the source line (CN) 30 may be 0V. In another exemplary embodiment, during a hold operation, a negative voltage potential may be applied to the first word line (WL1) 28a that may be capacitively coupled to a first portion of the P− body region 122, while a positive voltage potential may be applied to the second word line (WL2) 28b that may be capacitively coupled to a second portion of the P− body region 122. For example, the negative voltage potential applied to the first word line (WL1) 28a (e.g., capacitively coupled to the first portion of the P− body region 122 of the memory cell 12) may be −2.0V. The positive voltage potential applied to the second word line (WL2) 28b (e.g., capacitively coupled to the second portion of the P− body region 122 of the memory cell 12) may be 2.0V. During the hold operation, the junction between the P+ source region 120 and the second portion (e.g., capacitively coupled to the second word line (WL2) 28b) of the P− body region 122 and the junction between the N+ drain region 124 and the first portion (e.g., capacitively coupled to the first word line (WL1) 28a) of the P− body region 122 may be reverse biased in order to retain a data state (e.g., a logic high (binary "1" data state) or a logic low (binary "0" data state)) stored in the memory cell 12.

In an exemplary embodiment, control signals may be configured to perform one or more write logic low (e.g., binary "0" data state) operations to one or more selected memory cells 12. For example, the write logic low (e.g., binary "0" data state) operation may be performed to deplete charge carriers that may have accumulated/stored in the P− body regions 122 of the one or more selected memory cells 12. For example, the same voltage potentials may be applied to the various regions of the memory cell 12. In an exemplary embodiment, a voltage potential applied to the P+ source region 120 via a corresponding bit line (EN) 32, a voltage potential applied to a first word line (WL1) 28a that may be capacitively coupled to a first portion of the P− body region 122, a voltage potential applied to a second word line (WL2) 28b that may be capacitively coupled to a second portion of the P− body region 122, and/or a voltage potential applied to the N+ drain region 124 via a corresponding source line (CN) 30 may be 0V.

Under such biasing, the various regions of the memory cell (e.g., the P+ source region 120, the P− body region 122, and/or the drain region 124) may become a single electrical region and the charge carriers that may have accumulated/stored in the P− body region 122 may be removed via the P+ source region 120 and/or the drain region 124. By removing the charge carriers that may have accumulated/stored in the P− body region 122, a logic low (e.g., binary "0" data state) may be written to the memory cell 12.

For example, an intermediate voltage potential may be applied to the first word line (WL1) 28a that may be capacitively coupled to a first portion of the P− body region 122, before the voltage potential applied to the word line (WL1) 28a may return to a hold operation voltage potential. The intermediate voltage potential may be a voltage potential between the voltage potential applied during a write logic low (e.g., binary "0" data state) operation and a voltage potential applied during a hold operation. In an exemplary embodiment, the intermediate voltage potential applied to the first word line (WL1) 28a that may be capacitively coupled to a first portion of the P– body region 122 may be –1.0V. The intermediate voltage potential applied to the first word line (WL1) 28a that may be capacitively coupled to a first portion of the P– body region 122 may reduce a hole disturbance associated with the first portion of the P– body region 122 during a write logic low (e.g., binary "0" data state) operation.

In an exemplary embodiment, control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (EN) 32. In an exemplary embodiment, a voltage potential applied to the N+ drain region 124 via the source line (CN) 30 may be maintained at 0V, a voltage potential applied to the first word line (WL1) 28a that may be capacitively coupled to the first portion of the P– body region 122 may be –1.0V (e.g., approximately –0.5V to –1.75V), a voltage potential applied to the second word line (WL2) 28b that may be capacitively coupled to the second portion of the P– body region 122 may be 2.0V, and/or a voltage potential applied to the P+ source region 120 via the bit line (EN) 32 may be 1.0V (e.g., approximately 1.0V-1.5V).

Under such biasing, when a logic low (e.g., binary "0" data state) is stored in the memory cell 12, the predetermined amount of charge carriers accumulated/stored in the P– body region 122 may not lower a voltage potential barrier of a flow of charge carriers and the junction between the P– body region 122 and the P+ source region 120 may remain reverse biased or become weakly forward biased (e.g., above a reverse bias voltage and below a forward bias threshold voltage potential). A small amount of voltage potential and current or no voltage potential and current (e.g., compared to a reference voltage potential or current) may be generated when the junction between the P– body region 122 and the P+ source region 120 is reverse biased or weakly forward biased. A data sense amplifier in the data write and sense circuitry 36 may detect the small amount of voltage potential or current (e.g., compared to a reference voltage potential or current) or no voltage potential or current via the bit line (EN) 32 coupled to the P+ source region 120.

In an exemplary embodiment, control signals may be configured to write a logic high (e.g., binary "1" data state) to one or more selected memory cells 12 of one or more selected rows of the memory cell array 20. For example, the write logic high (e.g., binary "1" data state) operation may be performed in two stages, wherein each stage of the write logic high (e.g., binary "1" data state) operation may comprise different control signals. For example, during a first stage of a write logic high (e.g., binary "1" data state) operation, control signals may be configured to lower a voltage potential barrier for a flow of charge carriers. During a second stage of a write logic high (e.g., binary "1" data state) operation, control signals may be configured to cause accumulation/storage of charge carriers in the P– body region 122.

In an exemplary embodiment, during the first stage of a write logic high (e.g., binary "1" data state) operation, a voltage potential applied to the N+ drain region 124 of the memory cell 12 via the source line (CN) 30 may be maintained at 0V. In another exemplary embodiment, the same voltage potential may be applied to the first word line (WL1) 28a that may be capacitively coupled to the first portion of the P– body region 122 and the second word line (WL2) 28b that may be capacitively coupled to the second portion of the P– body region 122. For example, a voltage potential applied to the first word line (WL1) 28a that may be capacitively coupled to the first portion of the P– body region 122 may be 0V (e.g., approximately 0V to 1.0V) and a voltage potential applied to the second word line (WL2) 28b that may be capacitively coupled to the second portion of the P– body region 122 may be 0V (e.g., approximately 0V to 1.0V). In other exemplary embodiments, during the first stage of a write logic high (e.g., binary "1" data state) operation, a voltage potential applied to the P+ source region 120 via the bit line (EN) 32 may be raised to 1.0V (e.g., approximately 1V to 1.5V).

Under such biasing, the junction between the P+ source region 120 and the second portion (e.g., capacitively coupled to the second word line (WL2) 28b) of the P– body region 122 may be forward biased. Also, the junction between the N+ drain region 124 and the first portion (e.g., capacitively coupled to the first word line (WL1) 28a) of the P– body region 122 may be forward biased. A predetermined amount of charge carriers may flow from the P+ source region 120 to the N+ drain region 124 via the first portion (e.g., capacitively coupled to the first word line (WL1) 28a) of the P– body region 122 and the second portion (e.g., capacitively coupled to the second word line (WL2) 28b) of the P– body region 122. For example, a predetermined amount of holes may flow from the P+ source region 120 to the N+ drain region 124 via the first portion (e.g., capacitively coupled to the first word line (WL1) 28a) of the P– body region 122 and the second portion (e.g., capacitively coupled to the second word line (WL2) 28b) of the P– body region 122.

For example, an intermediate voltage potential may be applied to the first word line (WL1) 28a that may be capacitively coupled to a first portion of the P– body region 122, before the start of the second stage of a write logic high (e.g., binary "1" data state) operation. The intermediate voltage potential may be a voltage potential between the voltage potential applied during the first stage of a write logic high (e.g., binary "1" data state) operation and a voltage potential applied during the second stage of a write logic high (e.g., binary "1" data state) operation. In an exemplary embodiment, the intermediate voltage potential applied to the first word line (WL1) 28a that may be capacitively coupled to a first portion of the P– body region 122 may be –1.0V. The intermediate voltage potential applied to the first word line (WL1) 28a that may be capacitively coupled to a first portion of the P– body region 122 may reduce a disturbance on the memory cell 12 by eliminating excessive amount of charge carriers stored in the P– body region 122.

For example, during the second stage of a write logic high (e.g., binary "1" data state) operation, a voltage potential applied to the N+ drain region 124 of the memory cell 12 via the source line (CN) 30 and a voltage potential applied to the P+ source region 120 of the memory cell 12 via the bit line (EN) 32 may be maintained at the same voltage potential as the voltage potential applied during the first stage of the write logic high (e.g., binary "1" data state) operation. For example, during the second stage of a write logic high (e.g., binary "1" data state) operation, a voltage potential applied to the N+ drain region 124 may be maintained at 0V and a voltage potential applied to the P+ source region 120 may be maintained at 1.0V.

In another exemplary embodiment, during the second stage of a write logic high (e.g., binary "1" data state) operation, a voltage potential applied to the first word line (WL1) 28a that may be capacitively coupled to the first portion of the P– body region 122 and a voltage potential applied to the second word line (WL2) 28b that may be capacitively coupled to the second portion of the P– body region 122 may be varied. For example, during second stage of a write logic high (e.g., binary "1" data state) operation, a voltage potential applied to the first word line (WL1) 28a that may be capacitively coupled to the first portion of the P– body region 122 may be lowered to −2.0V from 0V. Simultaneously to or subsequent of lowering of the voltage potential applied to the first word line (WL1) 28a that may be capacitively coupled to the first portion of the P– body region 122, a voltage potential applied to the second word line (WL2) 28b that may be capacitively coupled to the second portion of the P– body region 122 may be raised to 2.0V from 0V.

Under such biasing, the junction between the N+ drain region 124 and the first portion (e.g., capacitively coupled to the first word line (WL1) 28a) of the P– body region 122 may be forward biased. A predetermined amount of charge carriers may be accumulated/stored at the first portion (e.g., capacitively coupled to the first word line (WL1) 28a) of the P– body region 122. For example, a predetermined amount of holes may be accumulated/stored at the first portion (e.g., capacitively coupled to the first word line (WL1) 28a) of the P– body region 122. Simultaneously to or subsequent of charge carriers (e.g., holes) accumulated/stored at the first portion (e.g., capacitively coupled to the first word line (WL1) 28a) of the P– body region 122, the junction between the P+ source region 120 and the second portion (e.g., capacitively coupled to the second word line (WL2) 28b) of the P– body region 122 may become forward biased. A predetermined amount of charge carriers may be accumulated/stored at the second portion (e.g., capacitively coupled to the second word line (WL2) 28b) of the P– body region 122. For example, a predetermined amount of electrons may be accumulated/stored at the second portion (e.g., capacitively coupled to the second word line (WL2) 28b) of the P– body region 122. The predetermined amount of charge carriers accumulated/stored in the first portion (e.g., capacitively coupled to first word line (WL1) 28a) of the P– body region 122 and the second portion (e.g., capacitively coupled to the second word line (WL2) 28b) of the P– body region 122 may represent that a logic high (e.g., binary "1" data state) may be written in the memory cell 12.

As discussed above, control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (EN) 32. In an exemplary embodiment, a voltage potential applied to the drain region 124 via the source line (CN) 30 may be maintained at 0V, a voltage potential applied to the first word line (WL1) 28a that may be capacitively coupled to the first portion of the P– body region 122 may be −1.0V (e.g., approximately −0.5V to −1.75V), a voltage potential applied to the second word line (WL2) 28b that may be capacitively coupled to the second portion of the P– body region 122 may be 2.0V, and/or a voltage potential applied to the P+ source region 120 via the bit line (EN) 32 may be 1.0V (e.g., approximately 1.0V-1.5V).

Under such biasing, when a logic high (e.g., binary "1" data state) is stored in the memory cell 12, the predetermined amount of charge carriers accumulated/stored in the P– body region 122 may lower a voltage potential barrier of a flow of charge carriers and the junction between the P– body region 122 and the P+ source region 120 may become forward biased during an active read operation. A voltage potential or current may be generated (e.g., compared to a reference voltage potential or current) when forward biasing the junction between the P– body region 122 and the P+ source region 120. The voltage potential or current generated may be output to a data sense amplifier via the bit line (EN) 32 coupled to the P+ source region 120. An amount of voltage potential or current generated may be representative of a data state (e.g., a logic low (binary "0" data state) and/or a logic high (binary "1" data state)) stored in the memory cell 12.

Figure 13:
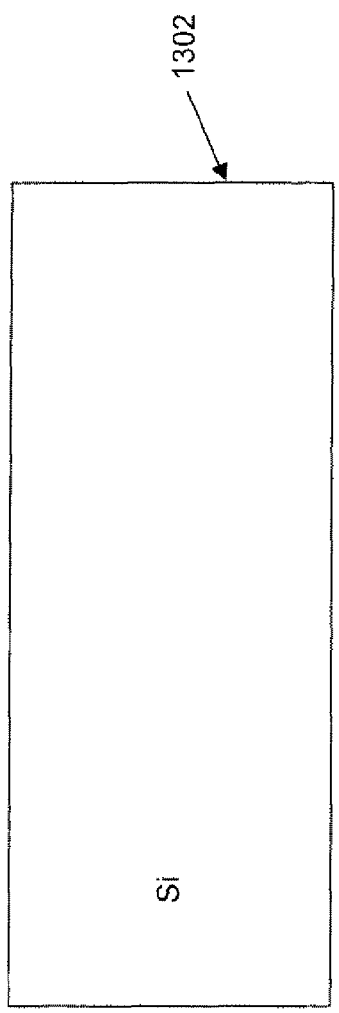
FIGS. 13-30 show process steps for fabricating a plurality of memory cells of the memory cell array in accordance with an embodiment of the present disclosure.

Referring to FIGS. 13-30, there are shown process steps for fabricating a plurality of memory cells 12 of the memory cell array 20 in accordance with an embodiment of the present disclosure. As illustrated in FIG. 13, the process steps may include any, or a combination, of steps. For example, the process steps may start with a bulk silicon wafer 1302. For example, the bulk silicon wafer 1302 may be made of an undoped intrinsic silicon substrate. In another exemplary embodiment, the bulk silicon wafer 1302 may be made of a silicon substrate comprising minor concentration of boron impurities.

Figure 14:
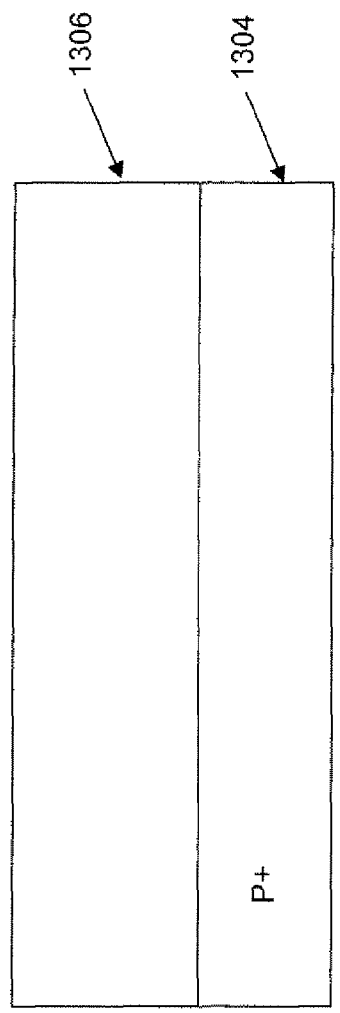

As illustrated in FIG. 14, the process steps may include doping at least a portion 1304 of the bulk silicon wafer 1306 with acceptor impurities. For example, at least a portion 1304 of the bulk silicon wafer 1306 may be doped with a heavy concentration of acceptor impurities. In an exemplary embodiment, at least a portion 1304 of the bulk silicon wafer 1306 may be doped with boron having a concentration of $10^{20}$ atoms/cm$^3$. The bulk silicon wafer 1306 may be doped with acceptor impurities by deep implementation to form the P+ source region 120. In an exemplary embodiment, the bulk silicon wafer 1306 may be also heated by flash rapid thermal anneal (fRTA) process and epitaxial growth (Epi) with no doping or a low-situ doping.

Figure 15:
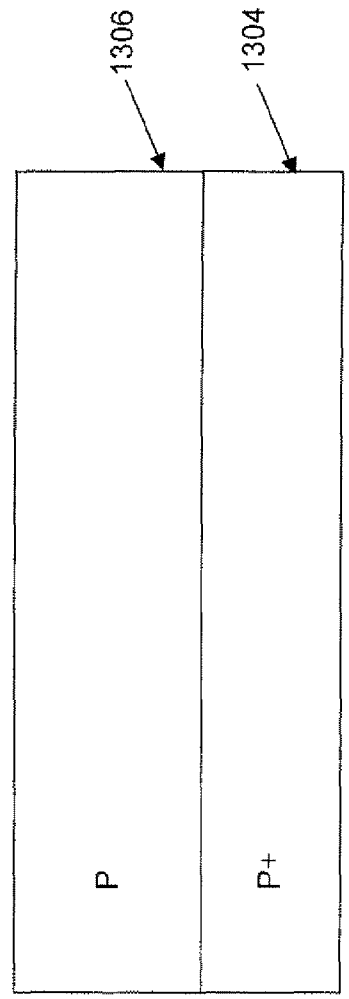

As illustrated in FIG. 15, the process steps may include doping the bulk silicon wafer 1306 with acceptor impurities by a channel or body implantation. For example, the bulk silicon wafer 1306 may be doped with acceptor impurities by a channel or body implantation in order to define low doping.

Figure 16:
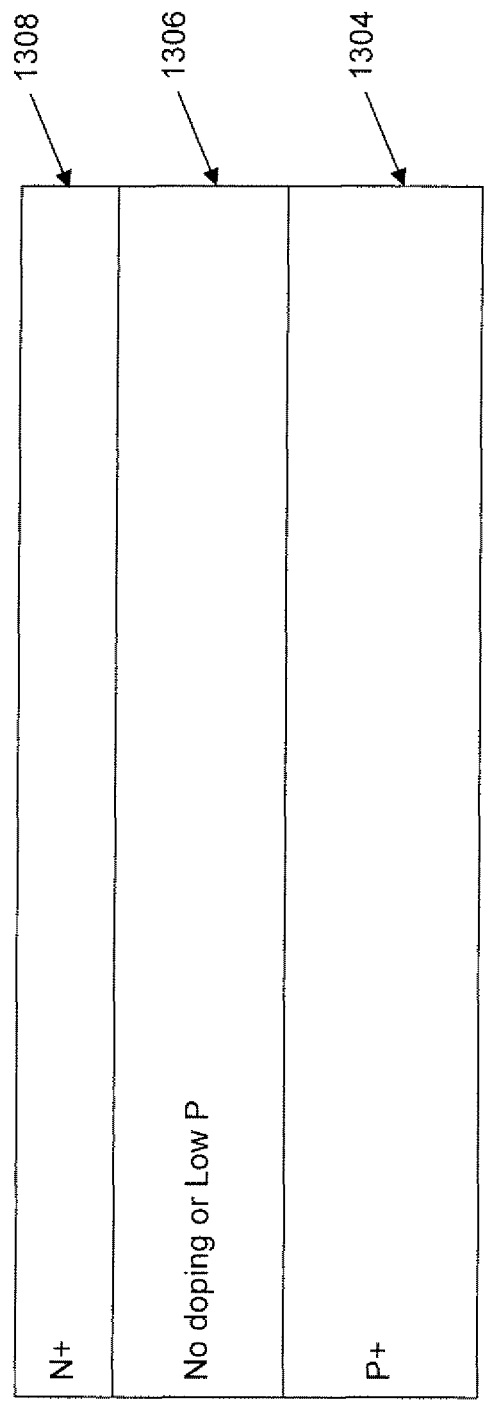

As illustrated in FIG. 16, the process steps may include doping at least a portion 1308 of the bulk silicon wafer with donor impurities having a heavy concentration to form the N+ drain region 124. For example, at least a portion 1308 the bulk silicon wafer may be doped with phosphorous or arsenic impurities having a concentration of $10^{20}$ atoms/cm$^3$. In an exemplary embodiment, the at least a portion 1308 of the bulk silicon wafer may be doped with donor impurities via a flash rapid thermal anneal (fRTA) process. In another exemplary embodiment, the at least a portion 1308 of the bulk silicon wafer may be doped with donor impurities via a self-aligned ploy-Si plug process.

Figure 17:
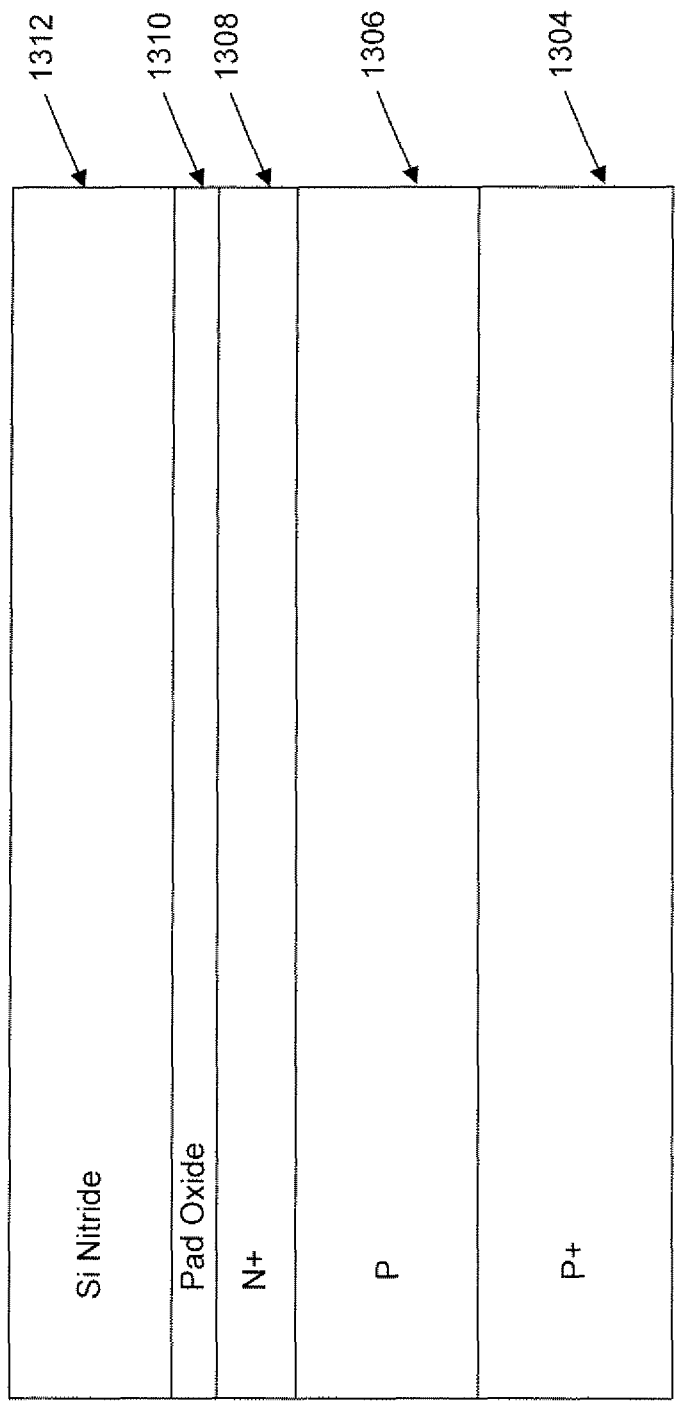

As illustrated in FIG. 17, the process steps may include growing a pad oxide layer 1310 on a side portion of the bulk silicon wafer. For example, a thin layer of silicon oxide may be grown on a side portion of the bulk silicon wafer using a thermal oxidation furnace. Subsequent to the formation of the pad oxide layer 1310, a thick layer of hard mask 1312 may be deposited on top of the pad oxide layer 1310. For example, the hard mask layer 1312 may be formed of a thick layer of silicon nitride material.

Figure 18:
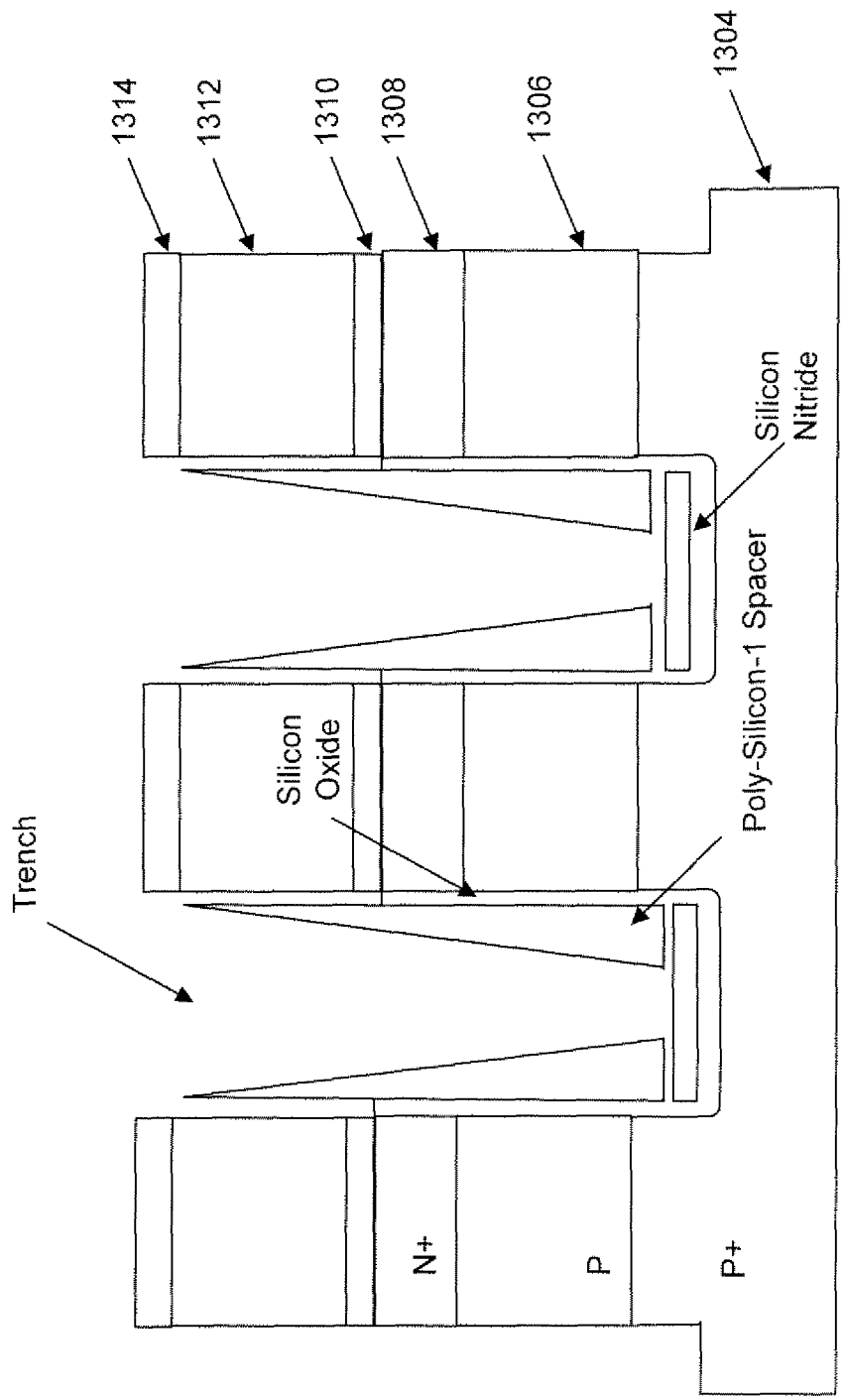

As illustrated in FIG. 18, the process steps may include depositing a deep trench gate (DTG) mask 1314 on the hard mask layer 1312 in order to perform a deep trench gate (DTG) etching. For example, the deep trench gate (DTG) mask 1314 may selectively deposited on various portions of the hard mask layer 1312, while exposing other portions of the bulk silicon wafer. Trenches may be formed at portions of the bulk silicon wafer that may be exposed during the deep trench gate (DTG) etching process. In an exemplary embodiment, the trenches formed in the bulk silicon wafer may have a depth reaching the at least a portion 1304 of the bulk silicon wafer. After the deep trench gate (DTG) etching process, the bulk silicon wafer may be cleaned.

In an exemplary embodiment, silicon oxide material may be deposited in the trench of the bulk silicon wafer. A silicon nitride layer may be formed at a bottom portion of the silicon oxide material via a directed oxidation process. For example, the directed oxidation process may include collimated $O_2$-plasma, low E oxygen II followed by rapid thermal anneal in oxygen environment or water environment, and/or heavy nitridation or atomic layer deposition (ALD). The silicon oxide material and the silicon nitride layer may be cleaned before a poly-silicon-1 spacer may be deposited in the trench formed during the deep trench gate (DTG) etching process.

Figure 19:
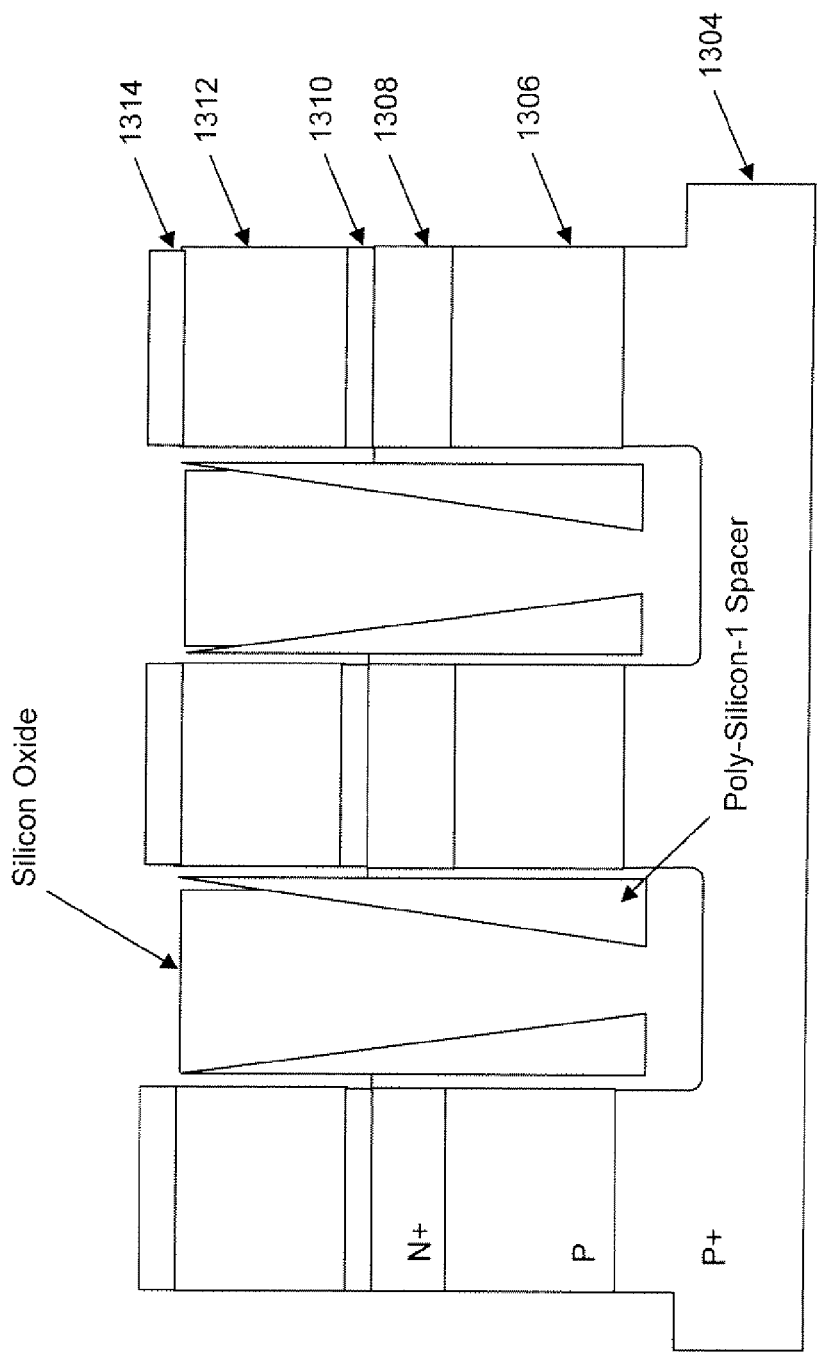

Referring to FIG. 19, there is shown an alternative process step as illustrated in FIG. 18 for fabricating a plurality of memory cells 12 of the memory cell array 20 in accordance with an embodiment of the present disclosure. As illustrated in FIG. 19, a deep trench gate (DTG) mask 1314 may be deposited on the hard mask layer 1312 in order to perform a deep trench gate (DTG) etching. For example, the deep trench gate (DTG) mask 1314 may selectively deposited on various portions of the hard mask layer 1312, while exposing other portions of the bulk silicon wafer. Trenches may be formed at portions of the bulk silicon wafer that may be exposed during the deep trench gate (DTG) etching process. In an exemplary embodiment, the trenches formed in the bulk silicon wafer may have a depth reaching the at least a portion 1304 of the bulk silicon wafer. After the deep trench gate (DTG) etching process, the bulk silicon wafer may be cleaned. In an exemplary embodiment, silicon oxide material may be deposited in the trench of the bulk silicon wafer. The silicon oxide material may be cleaned before a poly-silicon-1 spacer may be deposited in the trench formed during the deep trench gate (DTG) etching process.

Figure 20:
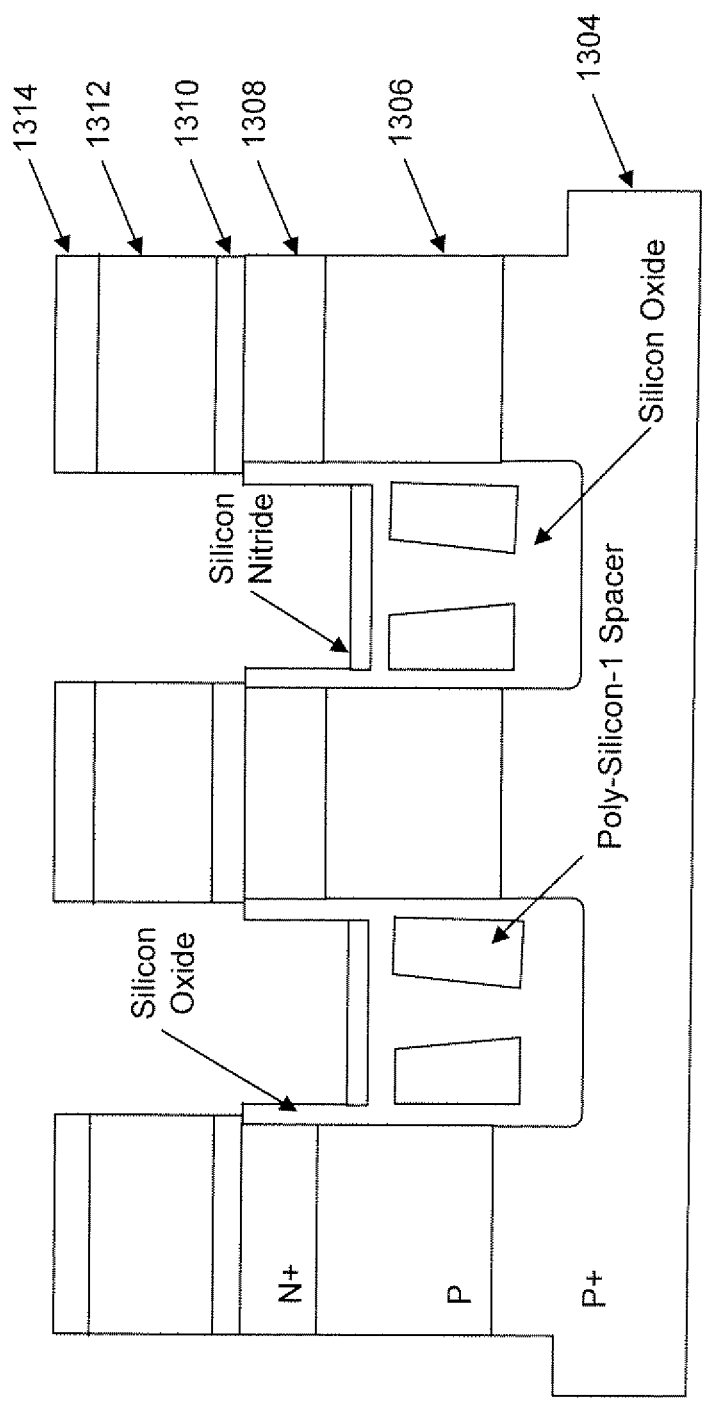

As illustrated in FIG. 20, the process steps may include etching the poly-silicon-1 spacer. For example, the poly-silicon-1 spacer may be etched via an anisotropic etching process. The silicon oxide ($SiO_2$) may be deposited in the trench and on top of the poly-silicon-1 spacer via tetraethyl orthosilicate (TEOS) deposition. Also, the silicon oxide ($SiO_2$) may be annealed via a rapid thermal anneal (RTA) process to achieve a predetermined density. Further, the silicon oxide ($SiO_2$) may be polished. In an exemplary embodiment, the silicon oxide ($SiO_2$) may be polished via tetraethyl orthosilicate (TEOS) chemical mechanical polishing (CMP) process.

In another exemplary embodiment, the process steps may include selectively etching the silicon oxide ($SiO_2$) and/or the poly-silicon-1 spacer. In an exemplary embodiment, the silicon oxide ($SiO_2$) and/or the poly-silicon-1 spacer may be selectively etched via an anisotropic etching and/or argon plasma sputtering. Subsequently, a silicon nitride may be formed by direct oxidation. For example, the direct oxidation may include collimated $O_2$-Plasma, low E oxygen II followed by rapid thermal anneal (RTA) in oxygen and/or water environment, and/or directional plasma heavy nitridation (DPN) or slot plain antenna (SPA) type of processes.

Figure 21:
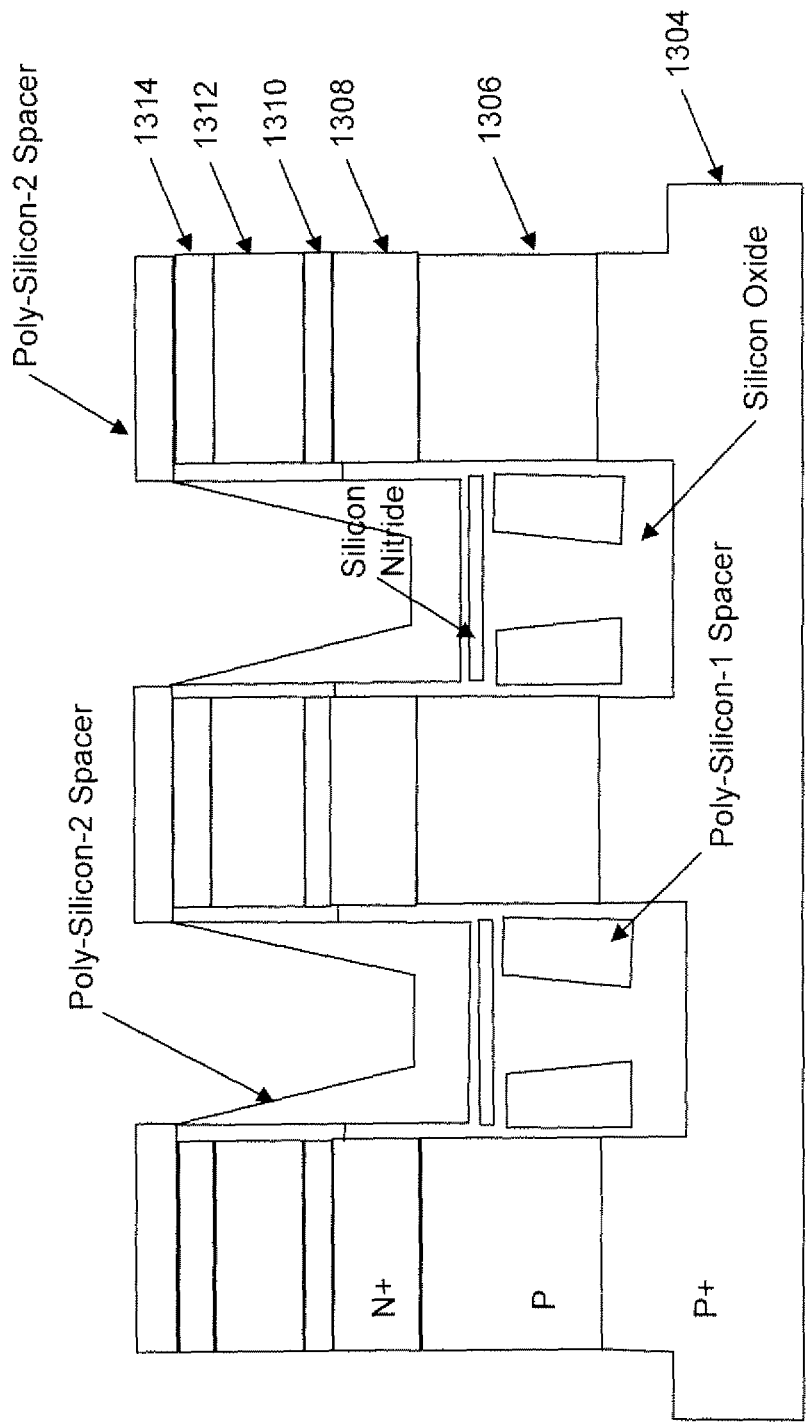

As illustrated in FIG. 21, the process steps may include cleaning the bulk silicon wafer and oxidizing the gate. Also, a poly-silicon-2 spacer may be deposited. In an exemplary embodiment, the poly-silicon-2 spacer may be deposited via a similar process as deposition of the poly-silicon-1 spacer. For example, the poly-silicon-2 spacer may be deposited in a trench region and on top of silicon nitride hard mask 1314.

Figure 22:
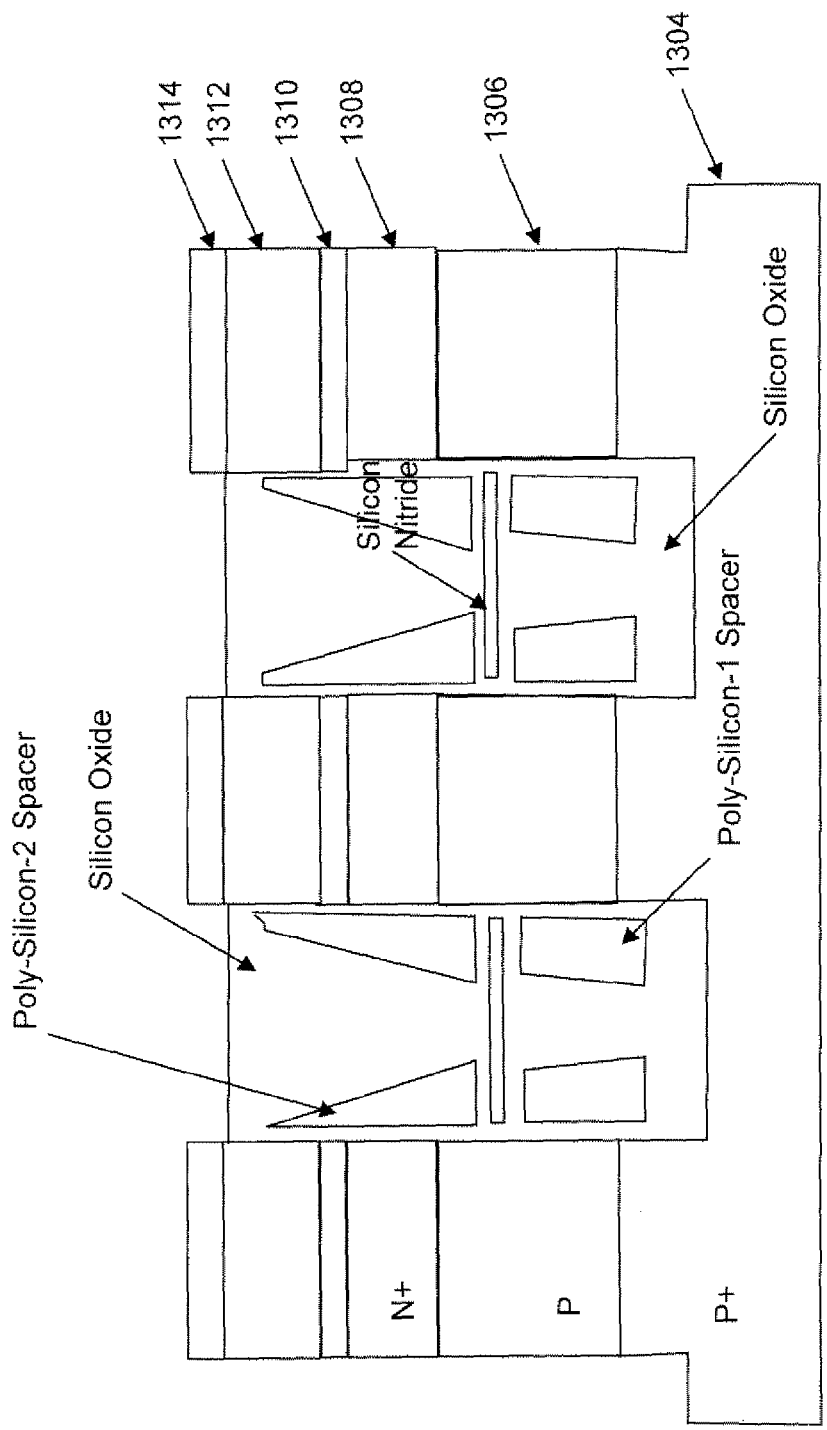

As illustrated in FIG. 22, the process steps may include etching the poly-silicon-2 spacer. For example, the poly-silicon-2 spacer may be etched via an anisotropic etching process. For example, excessive poly-silicon-2 spacer (e.g., poly-silicon-2 spacer located outside of the trench region) may be etched via an anisotropic etching process. The poly-silicon-2 spacer may be oxidized under an oxygenated environment. Also silicon oxide ($SiO_2$) material may be deposited in the trench and on top of the poly-silicon-2 spacer via tetraethyl orthosilicate (TEOS) deposition. The silicon oxide ($SiO_2$) material may be annealed via a rapid thermal anneal (RTA) process to achieve a predetermined density. Further, the silicon oxide ($SiO_2$) material may be polished. In an exemplary embodiment, the silicon oxide ($SiO_2$) material may be polished via tetraethyl orthosilicate (TEOS) chemical mechanical polishing (CMP) process.

Figure 23:
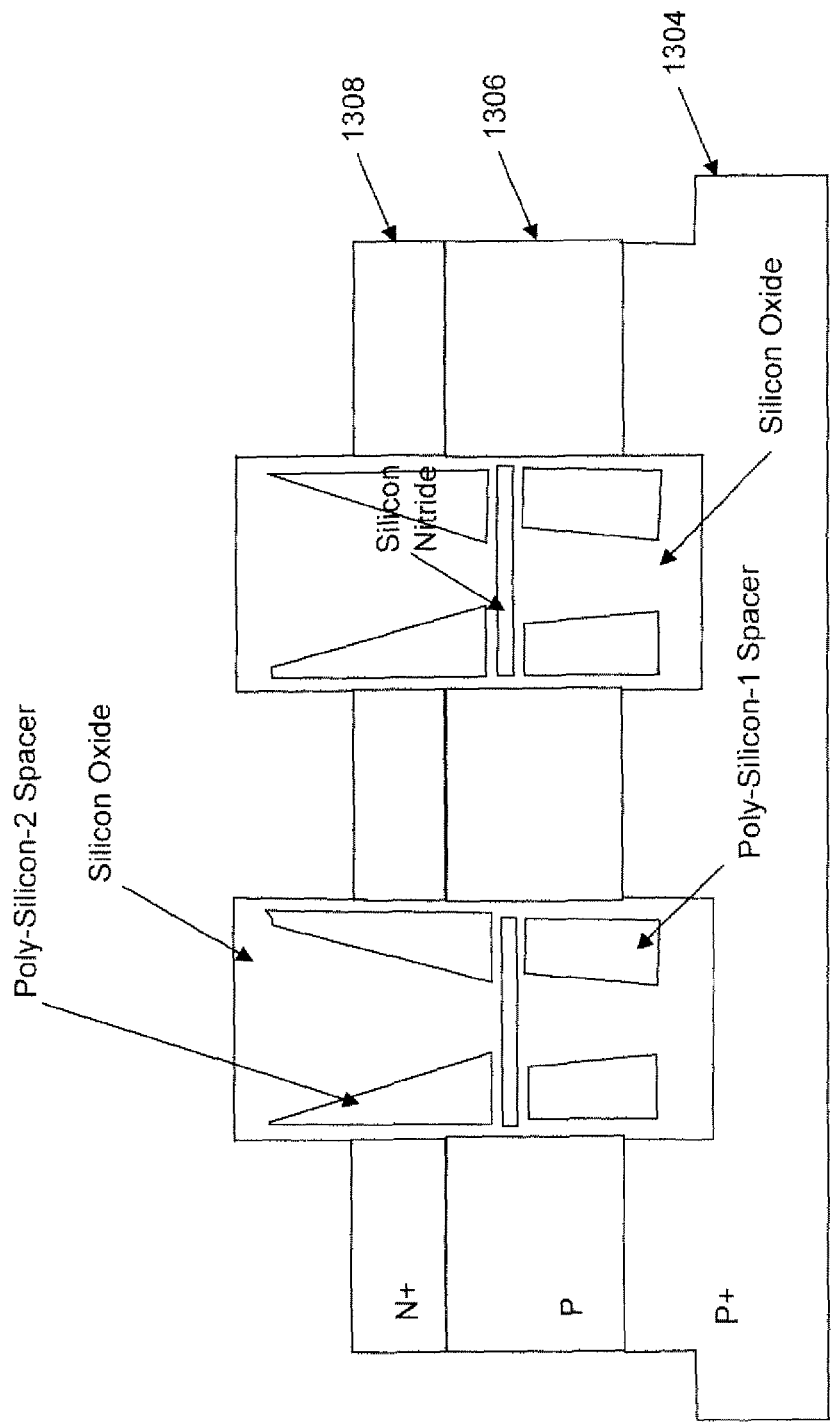

As illustrated in FIG. 23, the process steps may include removing the silicon nitride hard mask 1314. Also, the pad oxide 1312 may be removed.

Figure 24:
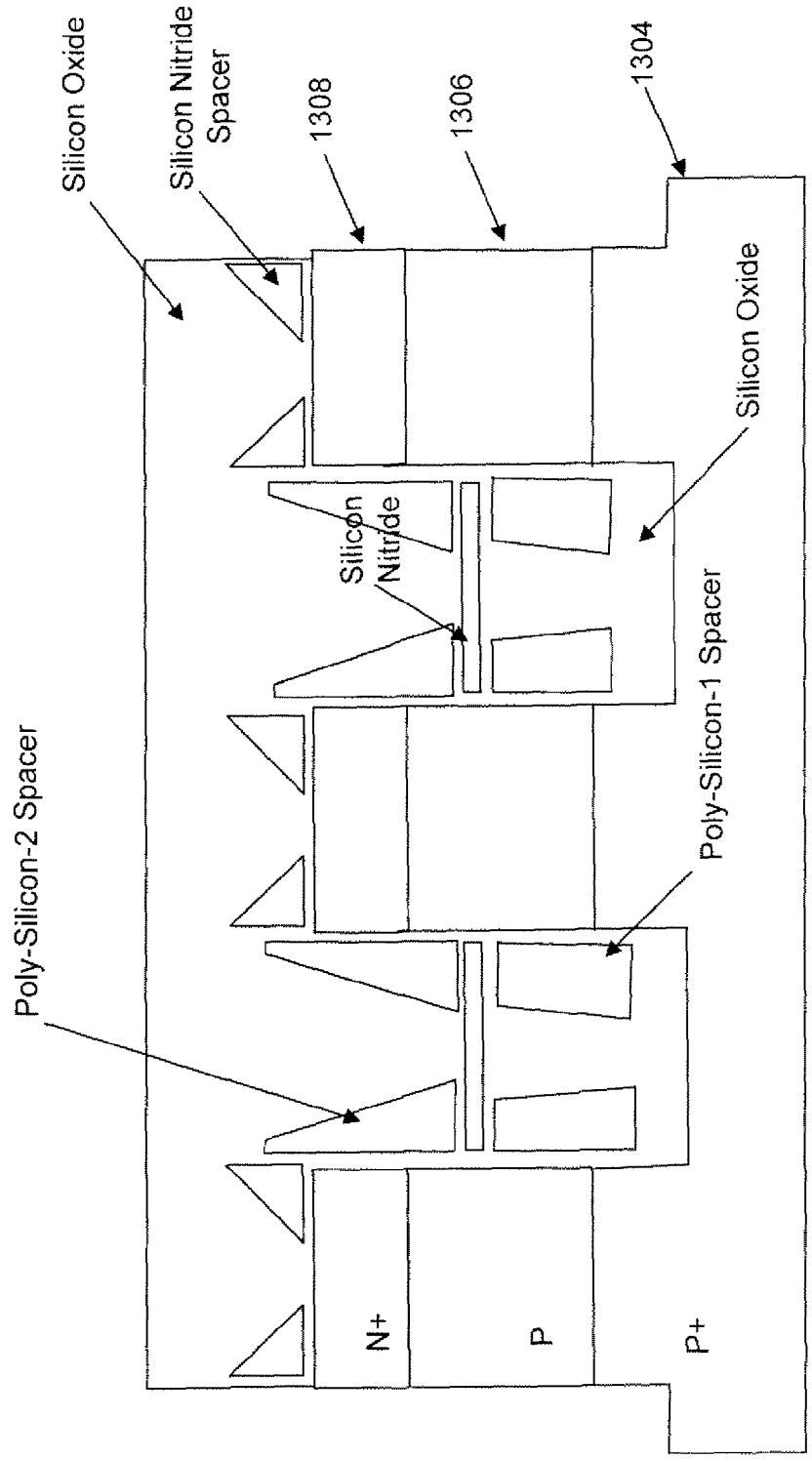

As illustrated in FIG. 24, the process steps may include depositing a silicon nitride spacer on top of the at least a portion 1308 of the bulk silicon wafer. In an exemplary embodiment, the silicon nitride spacer may be deposited on top of the at least a portion 1308 of the bulk silicon wafer via the contact lithography printing process. Also, a layer of silicon oxide ($SiO_2$) may be deposited. For example, the layer of silicon dioxide ($SiO_2$) may be deposited via tetraethyl orthosilicate (TEOS) inter-layer deposition (ILD) process.

Figure 25:
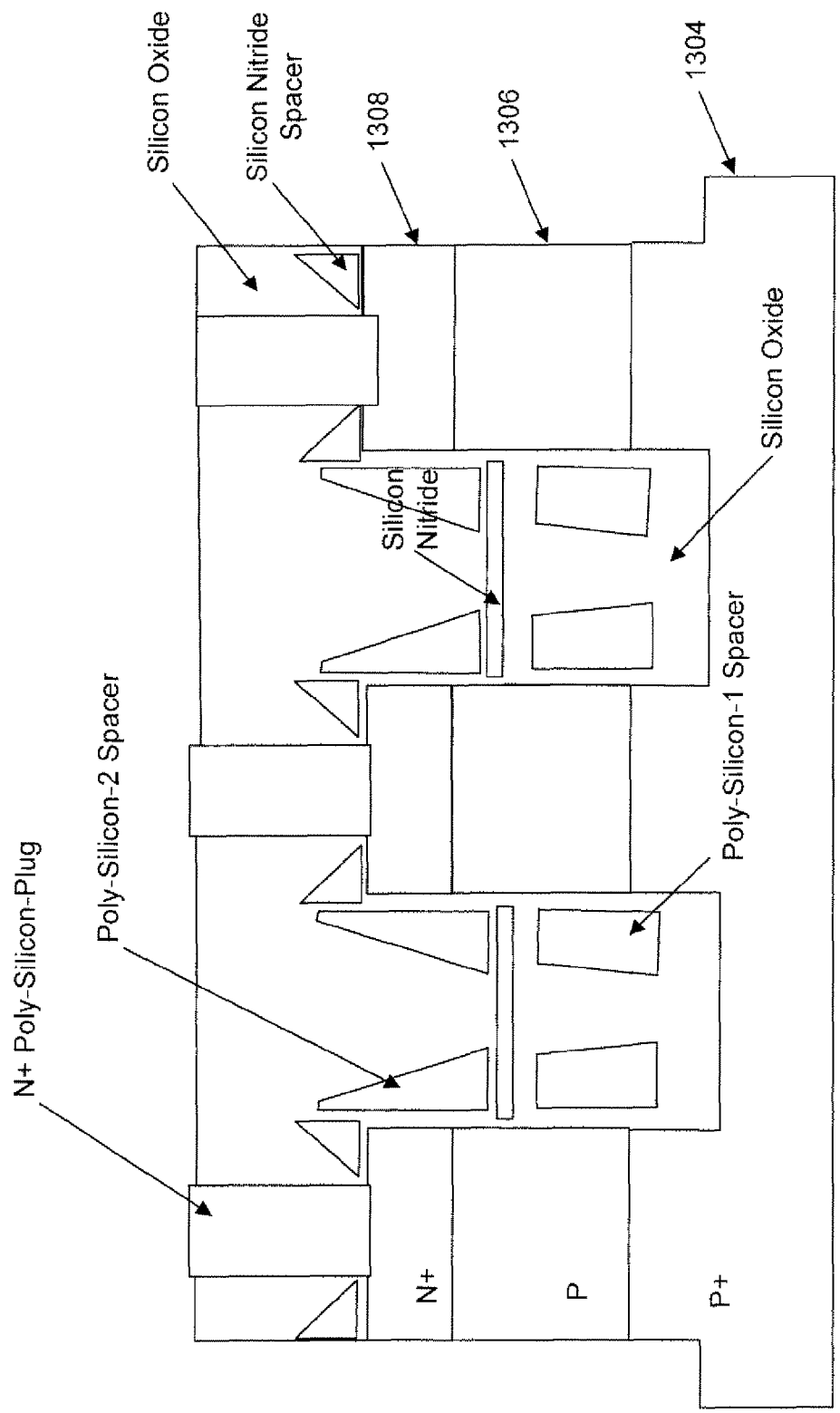

As illustrated in FIG. 25, the process steps may include a self-aligned SiN spacer contact etch process. For example, mask may be placed over the bulk silicon wafer while exposing portions where the poly-silicon-plug may be deposited. The contact etch process may etch the silicon oxide material to the top of the portion 1308. A trench region may be formed in the silicon oxide material have a depth reaching the N+ drain region 124. Thereafter, an N+ doped poly-silicon-plug may be deposited in the trench region have a depth reaching to the at least one portion 1308 of the bulk silicon wafer. In an exemplary embodiment, the poly-silicon-plug may be heavily doped with N+ impurities via in-situ doping. The poly-silicon-plug may be polished via a chemical mechanical polishing (CMP) process.

Figure 26:
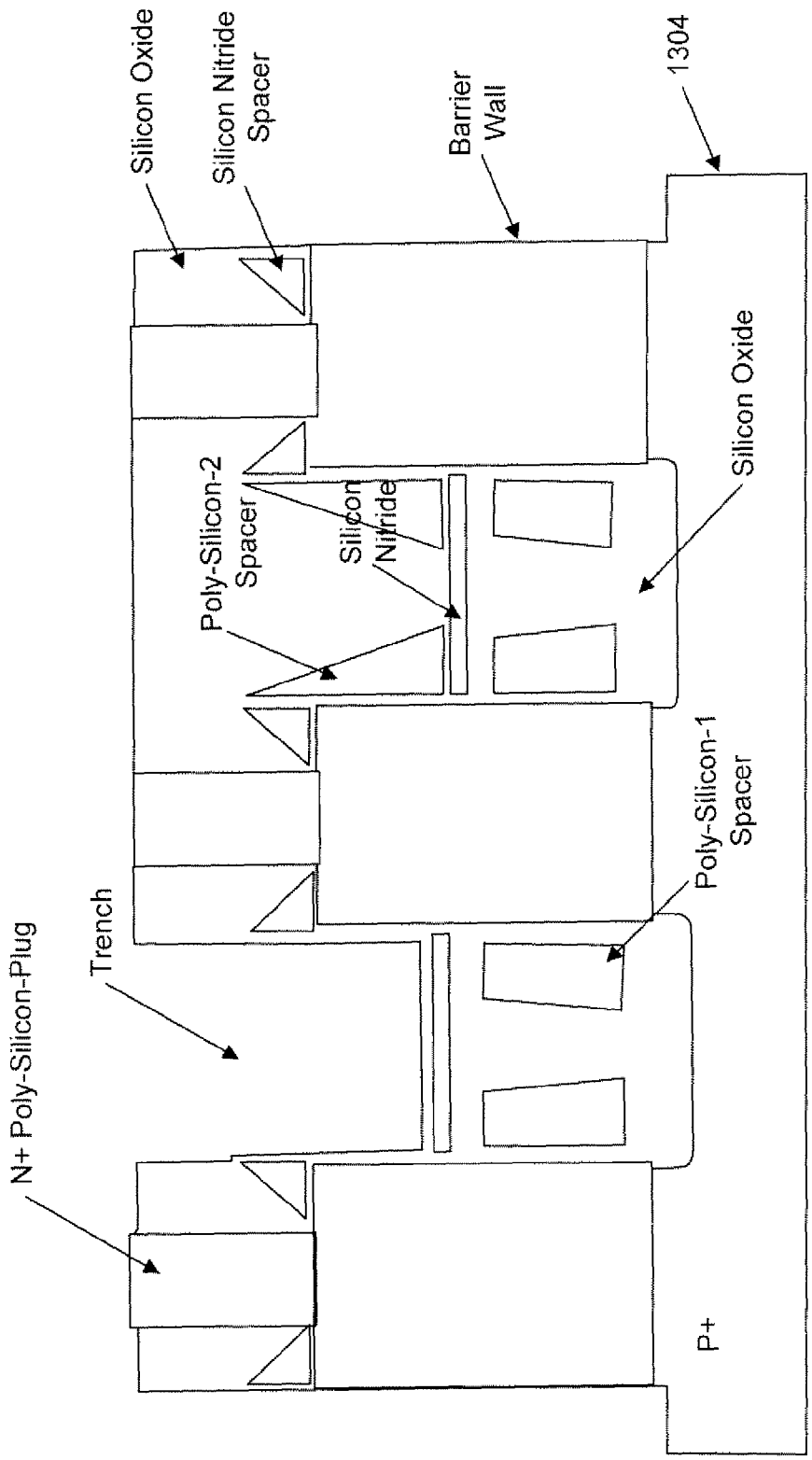

Referring to FIGS. 26-30, there are shown cross-sectional views of the process steps at a barrier wall elevation for fabricating a plurality of memory cells 12 of the memory cell array 20 in accordance with an embodiment of the present disclosure. As illustrated in FIG. 26, the process steps may include placing a mask to cover portions of the bulk silicon wafer, while exposing other portions of the bulk silicon wafer. Subsequently, an etching process may be performed to etch away the silicon oxide material exposed by the mask to form trench regions. For example, the trench regions may have a depth reaching the silicon nitride layer.

Figure 27:
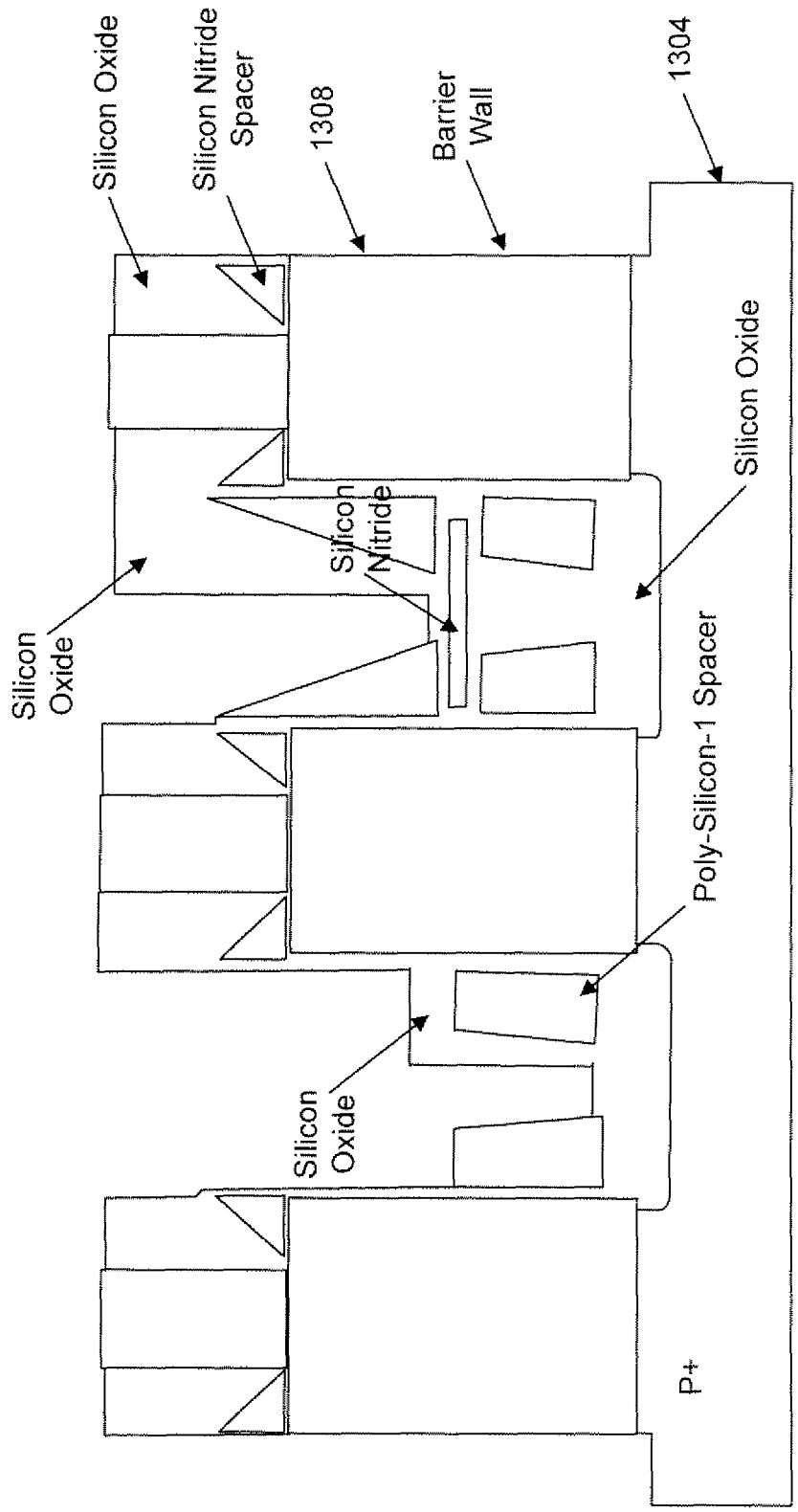

As illustrated in FIG. 27, the process steps may include placing a mask to cover portions of the bulk silicon wafer while exposing a first portion of the poly-silicon-1 spacer and a first portion of the poly-silicon-2 spacer. Subsequently, an etching process may be performed to etch away the silicon oxide material covering the first portion of the poly-silicon-1 spacer and the first portion of the poly-silicon-2 spacer.

Figure 28:
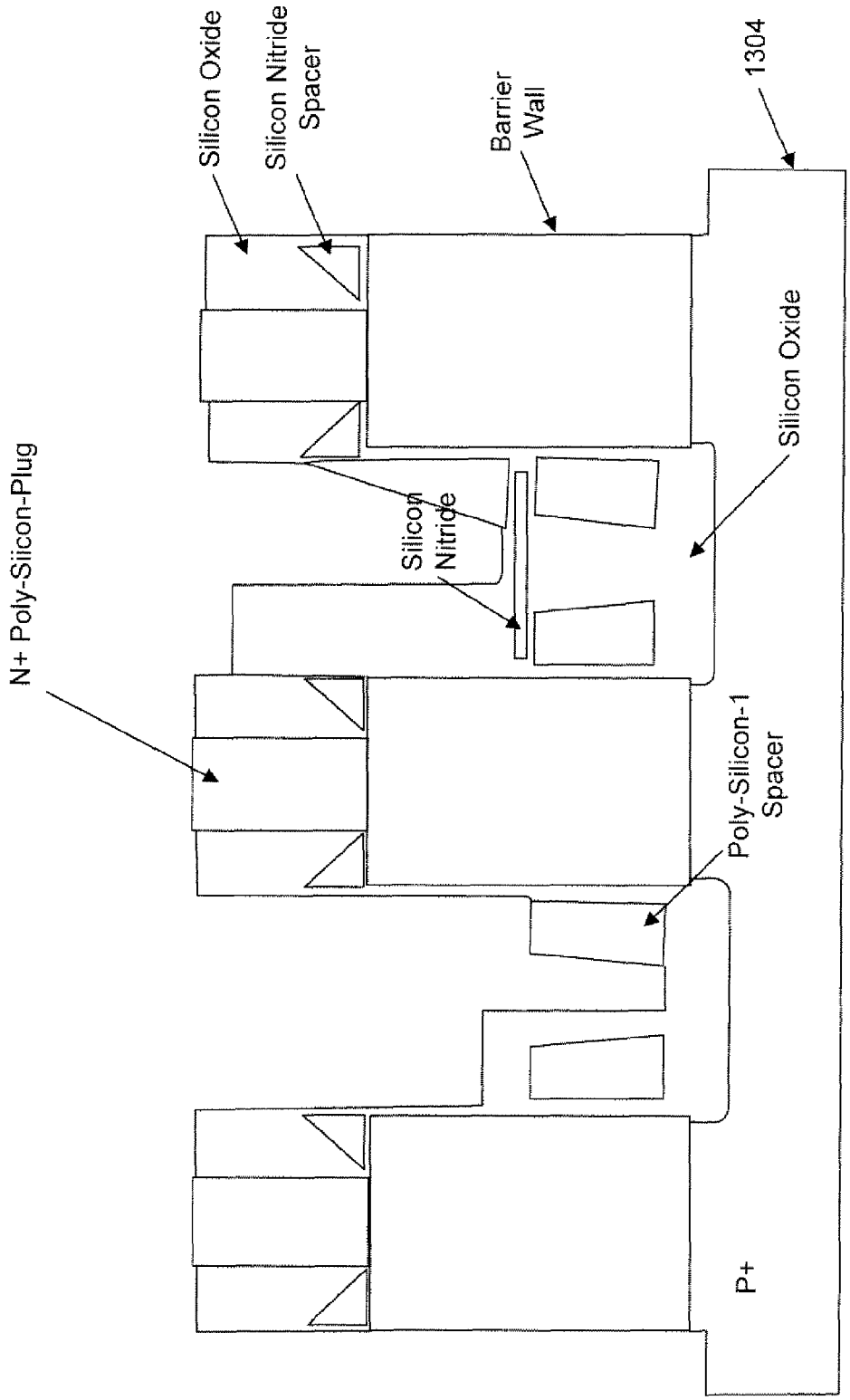

As illustrated in FIG. 28, the process steps may include placing a mask to cover portions of the bulk silicon wafer while exposing a second portion of the poly-silicon-1 spacer and a second portion of the poly-silicon-2 spacer. Subsequently, an etching process may be performed to etch away the silicon oxide material covering the second portion of the poly-silicon-1 spacer and the second portion of the poly-silicon-2 spacer.

Figure 29:
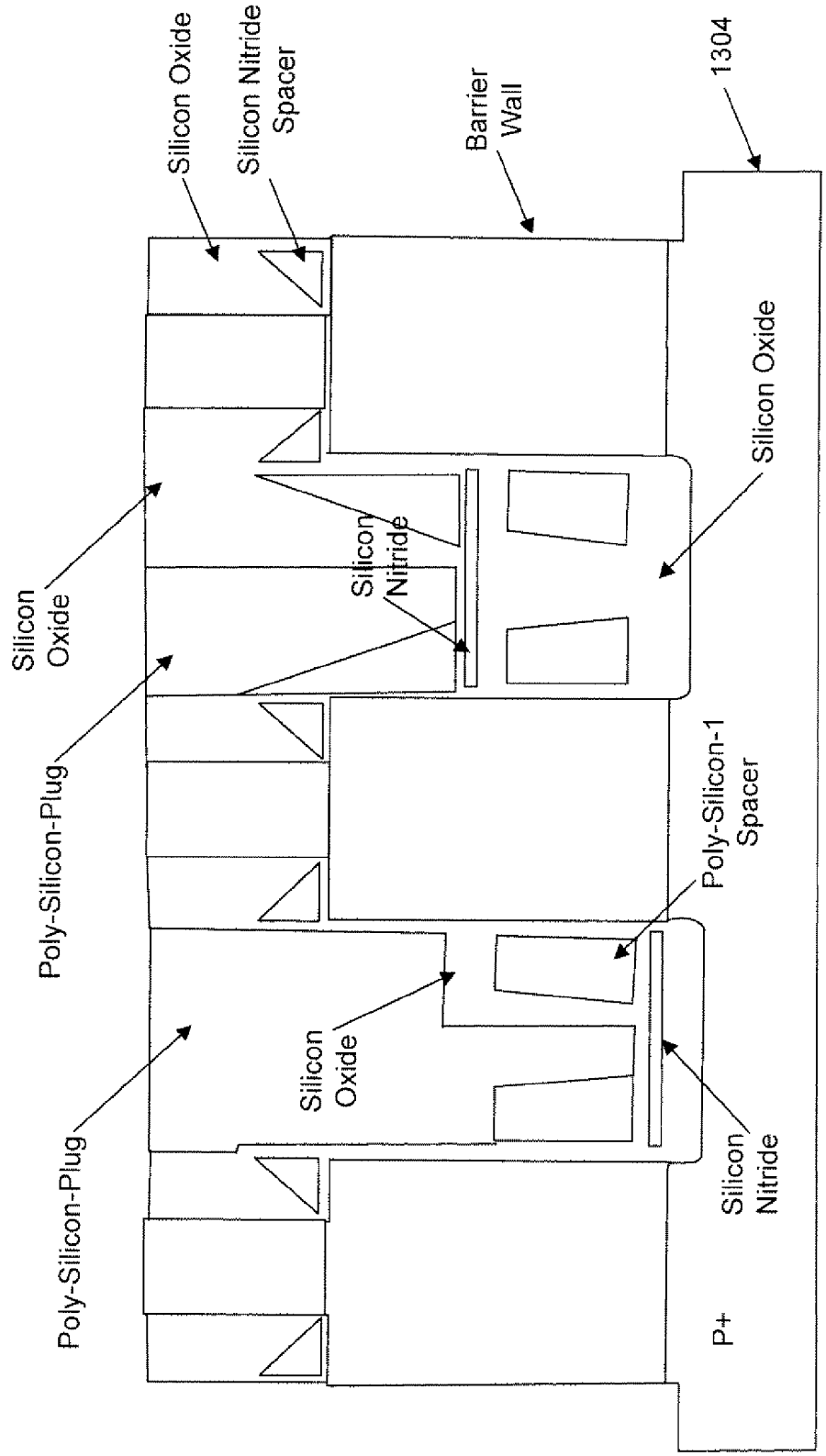
Figure 30:
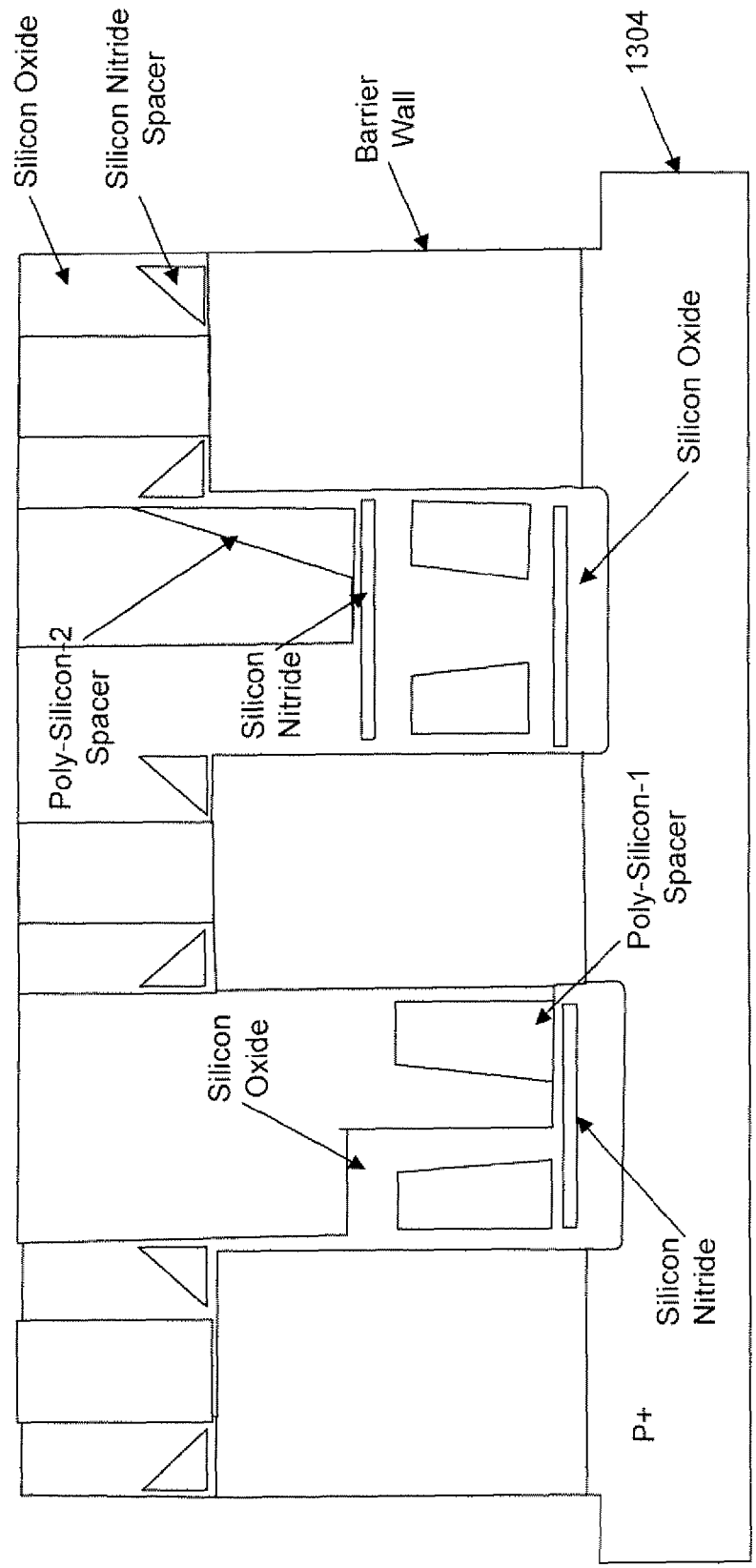

As illustrated in FIG. 29, the process steps may include depositing poly-silicon-plug over the first portion of the polysilicon-1 spacer and the first portion of the poly-silicon-2 spacer, as illustrated in FIG. 27. Also, illustrated in FIG. 30, the process steps may include depositing poly-silicon-plug over the second portion of the poly-silicon-1 spacer and the second portion of the poly-silicon-2 spacer, as illustrated in FIG. 28.

At this point it should be noted that providing a semiconductor memory device in accordance with the present disclosure as described above may involve the processing of input data and the generation of output data to some extent. This input data processing and output data generation may be implemented in hardware or software. For example, specific electronic components may be employed in a semiconductor memory device or similar or related circuitry for implementing the functions associated with providing a semiconductor memory device in accordance with the present disclosure as described above. Alternatively, one or more processors operating in accordance with instructions may implement the functions associated with providing a semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A semiconductor memory device comprising:
   a first region;
   a second region; and
   a body region disposed between the first region and the second region and capacitively coupled to a plurality of word lines, wherein each of the plurality of word lines is capacitively coupled to different portions of the body region, and wherein at least one of the plurality of word lines is formed on at least two opposing sides of the body region.

2. The semiconductor memory device according to claim 1, wherein the body region is electrically floating.

3. The semiconductor memory device according to claim 1, wherein the first region is a P-doped region.

4. The semiconductor memory device according to claim 1, wherein the second region is an N-doped region.

5. The semiconductor memory device according to claim 1, wherein the body region is an undoped region.

6. The semiconductor memory device according to claim 1, wherein the first region, the second region, and the body region are formed on a substrate.

7. The semiconductor memory device according to claim 1, wherein the first region, the second region, and the body region are arranged in a vertical implementation.

8. The semiconductor memory device according to claim 1, wherein the first region, the second region, and the body region are arranged in a planar implementation.

9. The semiconductor memory device according to claim 1, wherein the plurality of word lines are capacitively coupled to a plurality of side portions of the body region.

10. The semiconductor memory device according to claim 1, wherein each of the plurality of word lines are capacitively coupled to different side portions on a common side of the body region.

11. The semiconductor memory device according to claim 1, wherein the each of the plurality of word lines are capacitively coupled to opposite side portions of the body region.

12. The semiconductor memory device according to claim 1, wherein the plurality of word lines comprise a first word line and a second word line.

13. The semiconductor memory device according to claim 12, wherein the plurality of word lines further comprise a control word line.

14. The semiconductor memory device according to claim 12, wherein the first word line is capacitively coupled to a first portion of the body region and the second word line is capacitively coupled to a second portion of the body region.

15. The semiconductor memory device according to claim 14, wherein the first portion of the body region and the second portion of the body region are the different portions of the body region.

16. The semiconductor memory device according to claim 12, wherein at least a portion of the first word line overlaps at least a portion of the second word line.

17. The semiconductor memory device according to claim 1, wherein the first region is coupled to a bit line extending in a first orientation.

18. The semiconductor memory device according to claim 1, wherein the first region is coupled to a voltage source.

19. The semiconductor memory device according to claim 17, wherein the second region is coupled to a source line extending in the first orientation.

20. The semiconductor memory device according to claim 1, wherein the second region is coupled to a bit line extending in a first orientation.

21. The semiconductor memory device according to claim 20, wherein the plurality of word lines are extending in a second orientation.

22. A method for biasing a semiconductor memory device comprising the steps of:
   applying a first voltage potential to a first region via a bit line;
   applying a second voltage potential to a second region via a source line; and
   applying a plurality of voltage potentials to a plurality of word lines, wherein the plurality of word lines are spaced apart from and capacitively coupled to different portions of a body region that is electrically floating and disposed between the first region and the second region, and wherein the plurality of voltage potentials applied to the plurality of word lines allows a hold operation to be performed on the semiconductor memory device.

23. The method according to claim 22, wherein the second voltage potential applied to the second region is a constant voltage potential.

24. The method according to claim 23, wherein the source line is coupled to a ground.

25. The method according to claim 22, wherein the second voltage potential applied to the second region is a zero voltage potential.

26. The method according to claim 22, further comprising maintaining the plurality of voltage potentials applied to the plurality of word lines to perform a read operation on the semiconductor memory device.

27. The method according to claim 22, wherein the first voltage potential applied to the bit line allows a hold operation to be performed on the semiconductor memory device, and further comprising increasing the first voltage potential applied to the bit line to perform a read operation on the semiconductor memory device.

28. The method according to claim 22, wherein the first voltage potential applied to the bit line allows a hold operation to be performed on the semiconductor memory device, and further comprising increasing the first voltage potential applied to the bit line to perform a first stage of a write logic high operation on the semiconductor memory device.

29. The method according to claim 28, wherein the first voltage potential applied to the bit line allows a hold operation to be performed on the semiconductor memory device, and further comprising maintaining the first voltage potential applied to the bit line to perform a second stage of the write logic high operation on the semiconductor memory device.

30. The method according to claim 22, wherein the plurality of voltage potentials applied to the plurality of word lines comprise a third voltage potential applied to a first word line of the plurality of word lines to perform a hold operation on the semiconductor memory device, and further comprising maintaining the third voltage potential applied to the first word line of the plurality of word lines to perform at least one of a first stage of a write logic high operation and a second stage of the write logic high operation on the semiconductor memory device.

31. The method according to claim 30, wherein the plurality of voltage potentials applied to the plurality of word lines comprise a fourth voltage potential applied to a second word line of the plurality of word lines to perform a hold operation on the semiconductor memory device, and further comprising decreasing the fourth voltage potential applied to the second word line of the plurality of word lines to perform a first stage of a write logic high operation on the semiconductor memory device.

32. The method according to claim 31, further comprising increasing the fourth voltage potential applied to the second word line of the plurality of word lines from the fourth voltage potential applied to the second word line of the plurality of word lines during the first stage of the write logic high operation to perform a second stage of the write logic high operation on the semiconductor memory device.

33. The method according to claim 22, wherein the plurality of voltage potentials applied to the plurality of word lines comprise a third voltage potential applied to a first word line of the plurality of word lines to perform a hold operation on the semiconductor memory device, and further comprising increasing the third voltage potential applied to the first word line of the plurality of word lines to perform a write logic low operation on the semiconductor memory device.

34. The method according to claim 33, wherein the plurality of voltage potentials applied to the plurality of word lines comprise a fourth voltage potential applied to a second word line of the plurality of word lines to perform a hold operation on the semiconductor memory device, and further comprising decreasing the fourth voltage potential applied to the second word line of the plurality of word lines to perform a write logic low operation on the semiconductor memory device.

35. The method according to claim 22, wherein the first voltage potential applied to the bit line allows a hold operation to be performed on the semiconductor memory device, and further comprising maintaining the first voltage potential applied to the bit line to perform a write logic low operation on the semiconductor memory device.

* * * * *